(12) United States Patent
Tsukamoto et al.

(10) Patent No.: US 7,995,382 B2
(45) Date of Patent: Aug. 9, 2011

(54) INFORMATION RECORDING AND REPRODUCING APPARATUS

(75) Inventors: Takayuki Tsukamoto, Kanagawa-ken (JP); Kohichi Kubo, Kanagawa-ken (JP); Chikayoshi Kamata, Kanagawa-ken (JP); Takahiro Hirai, Kanagawa-ken (JP); Shinya Aoki, Kanagawa-ken (JP); Toshiro Hiraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 12/636,646

(22) Filed: Dec. 11, 2009

(65) Prior Publication Data
US 2010/0142262 A1 Jun. 10, 2010

Related U.S. Application Data

(63) Continuation of application No. PCT/JP2008/060776, filed on Jun. 12, 2008.

(30) Foreign Application Priority Data

Jun. 12, 2007 (JP) ................................. 2007-155710

(51) Int. Cl.
*G11C 11/00* (2006.01)
(52) U.S. Cl. ........................................ 365/163; 365/148
(58) Field of Classification Search ........................ None
See application file for complete search history.

(56) References Cited

U.S. PATENT DOCUMENTS

| | | | | |
|---|---|---|---|---|
| 7,729,158 B2 * | 6/2010 | Toda et al. | | 365/148 |
| 7,733,684 B2 * | 6/2010 | Kubo et al. | | 365/148 |
| 2007/0063180 A1 | 3/2007 | Asano | | |
| 2007/0133358 A1 * | 6/2007 | Kubo et al. | | 369/13.38 |

FOREIGN PATENT DOCUMENTS

| | | |
|---|---|---|
| JP | 2004-234707 | 8/2004 |
| JP | 2005-252068 | 9/2005 |
| JP | 2005-317787 | 11/2005 |
| JP | 2006-196566 | 7/2006 |
| JP | 2007-073779 | 3/2007 |
| WO | WO 2005/101420 A1 | 10/2005 |
| WO | 2005-106955 | 11/2005 |

OTHER PUBLICATIONS

Office Action issued Feb. 15, 2011 in Japan Application No. 2007-155710 (With English Translation).
P. Vettiger et al.; The "Millipede"-Nanotechnology Entering Data Storage, IEEE Trans, Nanotechnology 1, 39 (2002).
P. Vettiger et al.; Thousands of Microcantilevers for Highly Parallel and Ultra-dense Data Storage, Technical Digest, IEDM03 pp. 763-766.
Onoe et al.; Nano-sized domain inversion characteristics in LiNbO3 group single crystals using SNDM, Mat. Sci. Eng. B120, 130 (2005).

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

An information recording and reproducing apparatus, includes: a recording layer including a first layer including a first compound, the first compound being a conjugated compound including at least two types of cation elements, at least one selected from the cation elements being a transition element having a d orbit incompletely filled by electrons, a shortest distance between adjacent cation elements being not more than 0.32 nm; a voltage application unit that applies a voltage to the recording layer, produces a phase change in the recording layer, and records information; an electrode layer that applies a voltage to the recording layer; and an orientation control layer provided between the recording layer and the electrode layer to control an orientation of the recording layer.

22 Claims, 28 Drawing Sheets

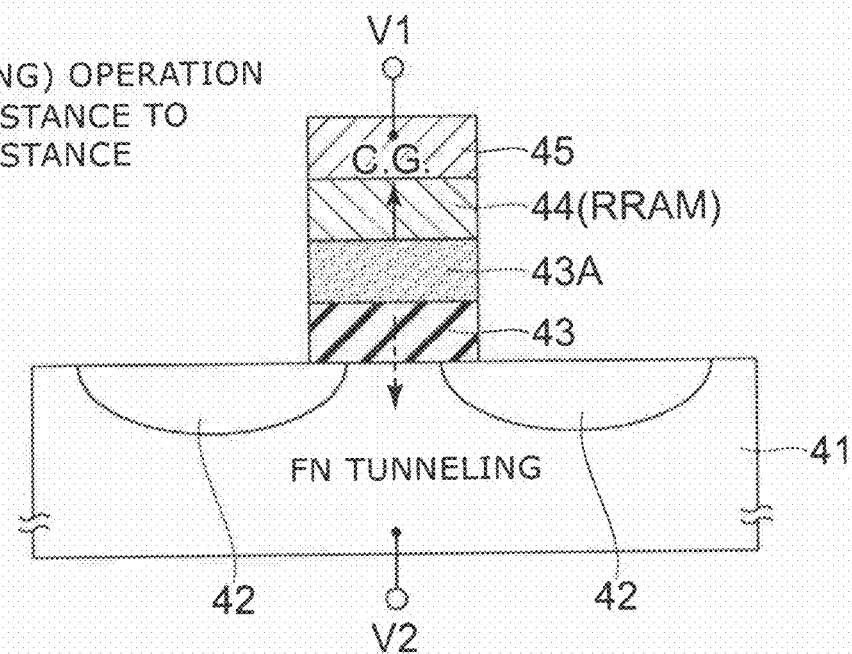
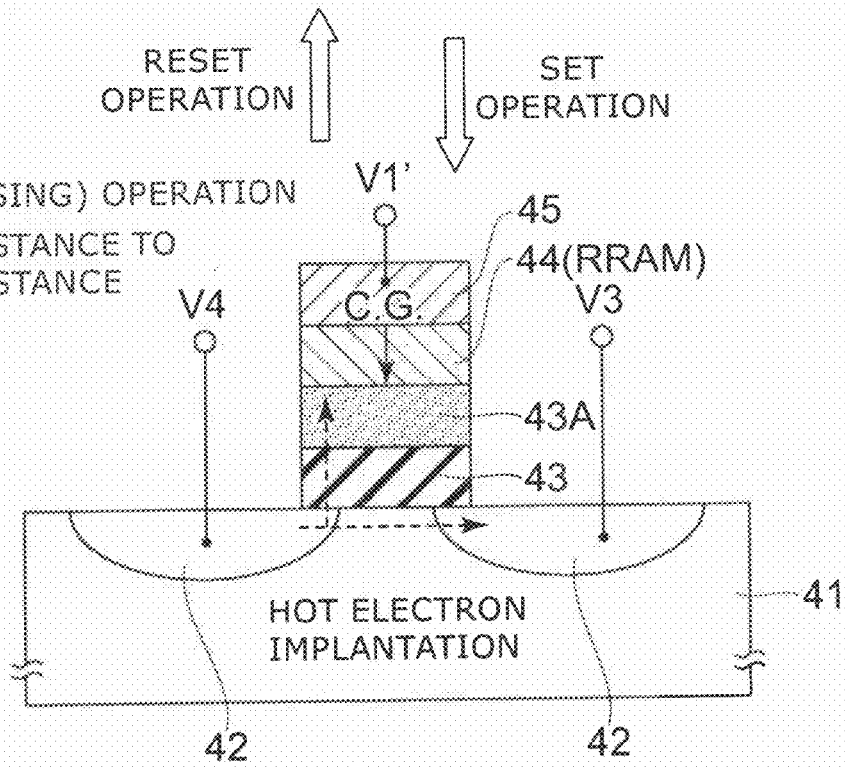
FIG. 16

FIG. 29

|  |  |  | ZnCr$_2$O$_4$ | | ZnV$_2$O$_4$ | | ZnMn$_2$O$_4$ | | |
|---|---|---|---|---|---|---|---|---|---|
|  |  |  | a | [1-10] | a | [1-10] | a | c | [1-10] |
|  |  |  | 8.327 | 11.77438 | 8.41 | 11.89174 | 8.087 | 9.254 | 11.43502 |
| IrO$_2$ | a | 4.498 | 0.08 | -0.15 | -0.07 | -0.13 | -0.11 | 0.03 | -0.18 |
| RuO$_2$ | a | 4.499 | 0 | -0.15 | -0.07 | -0.13 | -0.11 | 0.03 | -0.18 |
| IrO$_2$ | c | 3.154 | -0.14 | -0.07 | -0.13 |  | -0.17 | -0.02 | -0.10 |
| RuO$_2$ | c | 3.107 | -0.12 | -0.06 | -0.11 |  | -0.16 | -0.01 | -0.08 |
| IrO$_2$ | [1-10] | 3.181 | -0.15 | -0.08 | -0.13 |  | -0.18 | -0.03 | -0.11 |
| RuO$_2$ | [1-10] | 3.182 | -0.15 | -0.08 | -0.13 |  | -0.18 | -0.03 | -0.11 |
| TiN | a | 4.242 | -0.02 | -0.06 | 0.01 |  |  | 0.03 | -0.11 |
| VN | a | 4.139 | 0.01 | -0.05 | 0.02 |  |  | 0.11 | -0.08 |
| W$_2$N | a | 4.126 | 0.01 | -0.05 | 0.02 |  |  | 0.11 | -0.08 |
| ZrN | a | 4.578 | -0.10 | -0.17 | -0.09 | -0.15 | -0.13 |  | -0.20 |
| HfN | a | 4.525 | -0.09 | -0.16 | -0.08 | -0.14 | -0.12 |  | -0.19 |
| TiN | [1-10] | 3 | -0.08 | -0.02 | -0.07 |  | -0.11 |  | -0.05 |
| VN | [1-10] | 2.927 | -0.05 | 0.01 | -0.04 |  |  |  | -0.02 |
| W$_2$N | [1-10] | 2.918 | -0.05 | 0.01 | -0.04 |  |  |  |  |
| ZrN | [1-10] | 3.238 | -0.17 |  | -0.15 |  | 0.20 |  | -0.13 |
| HfN | [1-10] | 3.2 | -0.15 |  | -0.14 |  | -0.19 |  | -0.12 |
| SiN | a | 7.61 | 0.09 | -0.29 | 0.10 | -0.28 |  | 0.18 | -0.33 |
| SiN | c | 2.91 | 0.05 |  | 0.04 |  |  |  |  |
| SiN | [1-10] | 5.382 | -0.29 |  | -0.28 |  | -0.33 | -0.16 |  |

FIG. 29

| | | | delaffosite | | | | | |
|---|---|---|---|---|---|---|---|---|
| | | | CuAlO$_3$ | | | CuFeO$_3$ | | |
| | | | a | c | [1-10] | a | c | [1-10] |
| | | | 2.857 | 16.94 | 4.948324 | 3.035 | 17.166 | 5.25662 |
| IrO$_2$ | a | 4.498 | 0.21 | -0.06 | 0.09 | 0.26 | -0.05 | 0.14 |
| RuO$_2$ | a | 4.499 | 0.21 | -0.06 | 0.09 | 0.26 | -0.05 | 0.14 |
| IrO$_2$ | c | 3.154 | -0.10 | 0.07 | -0.27 | -0.04 | 0.08 | -0.20 |
| RuO$_2$ | c | 3.107 | 0.09 | 0.08 | -0.26 | 0.02 | 0.09 | -0.18 |
| IrO$_2$ | [1-10] | 3.181 | -0.11 | 0.06 | -0.29 | -0.05 | 0.07 | -0.21 |
| RuO$_2$ | [1-10] | 3.182 | -0.11 | 0.06 | -0.29 | -0.05 | 0.07 | -0.21 |
| TiN | a | 4.242 | 0.26 | 0.00 | 0.14 | 0.30 | 0.01 | 0.19 |
| VN | a | 4.139 | 0.28 | 0.02 | 0.16 | 0.32 | 0.04 | 0.21 |
| W$_2$N | a | 4.126 | 0.28 | 0.03 | 0.17 | 0.32 | 0.04 | 0.22 |
| ZrN | a | 4.578 | 0.20 | -0.08 | 0.07 | 0.25 | -0.07 | 0.13 |
| HfN | a | 4.525 | 0.21 | -0.07 | 0.09 | 0.25 | -0.05 | 0.14 |
| TiN | [1-10] | 3 | -0.05 | -0.06 | -0.21 | 0.01 | -0.05 | -0.14 |
| VN | [1-10] | 2.927 | -0.02 | -0.04 | -0.18 | 0.04 | -0.02 | -0.11 |
| W$_2$N | [1-10] | 2.918 | -0.02 | -0.03 | -0.18 | 0.03 | -0.02 | -0.11 |
| ZrN | [1-10] | 3.238 | -0.13 | 0.04 | -0.31 | -0.07 | 0.06 | -0.23 |
| HfN | [1-10] | 3.2 | -0.12 | 0.06 | -0.29 | -0.05 | 0.07 | -0.22 |
| SiN | a | 7.61 | 0.33 | 0.10 | 0.23 | 0.37 | 0.11 | 0.28 |
| SiN | c | 2.91 | -0.02 | -0.01 | -0.18 | 0.04 | -0.02 | -0.11 |
| SiN | [1-10] | 5.382 | 0.06 | 0.05 | -0.09 | 0.11 | 0.06 | -0.02 |

| | | | wolframite | | | | | | | |
|---|---|---|---|---|---|---|---|---|---|---|
| | | | FeWO$_4$ | | | | NiWO$_4$ | | | |
| | | | a | b | c | [011] | a | b | c | [011] |
| | | | 4.753 | 5.72 | 4.968 | 7.576241 | 4.6 | 5.665 | 4.912 | 7.497998 |
| IrO$_2$ | a | 4.498 | 0.05 | 0.21 | 0.09 | −0.19 | 4.6 | 0.21 | 0.08 | −0.20 |
| RuO$_2$ | a | 4.499 | 0.05 | 0.21 | 0.09 | −0.19 | 4.6 | 0.21 | 0.08 | −0.20 |
| IrO$_2$ | c | 3.154 | −0.33 | −0.10 | −0.27 | 0.17 | 0.31 | −0.11 | −0.28 | 0.16 |
| RuO$_2$ | c | 3.107 | −0.31 | −0.09 | −0.25 | 0.18 | 0.32 | −0.10 | −0.27 | 0.17 |
| IrO$_2$ | [1−10] | 3.181 | 0.33 | −0.11 | −0.28 | 0.16 | 0.31 | −0.12 | −0.30 | 0.15 |
| RuO$_2$ | [1−10] | 3.182 | 0.33 | −0.11 | −0.28 | 0.16 | 0.31 | −0.12 | −0.30 | 0.15 |
| TiN | a | 4.242 | 0.11 | 0.26 | 0.15 | −0.12 | 0.08 | 0.25 | 0.14 | −0.13 |
| VN | a | 4.139 | 0.13 | 0.28 | 0.17 | −0.09 | 0.10 | 0.27 | 0.16 | −0.10 |
| W$_2$N | a | 4.126 | 0.13 | 0.28 | 0.17 | −0.09 | 0.10 | 0.27 | 0.16 | −0.10 |
| ZrN | a | 4.578 | 0.04 | 0.20 | 0.08 | −0.21 | 0.00 | 0.19 | 0.07 | −0.22 |
| HfN | a | 4.525 | 0.05 | 0.21 | 0.09 | −0.19 | 0.02 | 0.20 | 0.08 | −0.21 |
| TiN | [1−10] | 3 | −0.26 | −0.02 | −0.21 | −0.19 | −0.30 | −0.03 | −0.22 | 0.20 |
| VN | [1−10] | 2.927 | −0.23 | −0.02 | −0.18 | −0.16 | −0.27 | −0.03 | −0.19 | −0.17 |
| W$_2$N | [1−10] | 2.918 | −0.23 | −0.02 | −0.17 | −0.16 | −0.27 | −0.03 | −0.19 | −0.17 |
| ZrN | [1−10] | 3.238 | 0.32 | −0.13 | −0.30 | 0.15 | 0.30 | −0.14 | −0.32 | 0.14 |
| HfN | [1−10] | 3.2 | 0.33 | −0.12 | −0.29 | 0.16 | 0.30 | −0.13 | −0.30 | 0.15 |
| SiN | a | 7.61 | 0.17 | −0.34 | 0.23 | −0.16 | 0.20 | −0.33 | 0.23 | 0.00 |
| SiN | c | 2.91 | −0.27 | −0.03 | −0.18 | 0.28 | −0.22 | −0.02 | −0.17 | −0.15 |
| SiN | [1−10] | 5.382 | −0.17 | 0.05 | −0.10 | −0.08 | −0.13 | 0.16 | 0.08 | 0.29 |

| | | | ilmenite | | | | | |
|---|---|---|---|---|---|---|---|---|
| | | | FeTiO$_3$ | | | NiTiO$_3$ | | |
| | | | a | c | [1-10] | a | c | [1-10] |
| | | | 5.0844 | 14.0855 | 8.806181 | 5.027 | 13.78 | 8.706764 |
| IrO$_2$ | a | 4.498 | 0.12 | 0.04 | -0.02 | 0.11 | 0.02 | 0.03 |
| RuO$_2$ | a | 4.499 | 0.12 | 0.04 | -0.02 | 0.11 | 0.02 | -0.03 |
| IrO$_2$ | c | 3.154 | -0.24 | 0.10 | -0.07 | -0.25 | 0.08 | -0.09 |
| RuO$_2$ | c | 3.107 | -0.22 | 0.10 | 0.06 | -0.24 | 0.10 | -0.07 |
| IrO$_2$ | [1-10] | 3.181 | -0.25 | 0.10 | -0.08 | -0.27 | 0.08 | -0.10 |
| RuO$_2$ | [1-10] | 3.182 | -0.25 | 0.10 | -0.08 | -0.27 | 0.08 | -0.10 |
| TiN | a | 4.242 | 0.17 | 0.10 | 0.04 | 0.16 | 0.08 | 0.03 |
| VN | a | 4.139 | 0.19 | 0.12 | 0.06 | 0.18 | 0.10 | 0.05 |
| W$_2$N | a | 4.126 | 0.19 | 0.12 | 0.06 | 0.18 | 0.10 | 0.05 |
| ZrN | a | 4.578 | 0.10 | 0.02 | -0.04 | 0.09 | 0.00 | -0.05 |
| HfN | a | 4.525 | 0.11 | 0.04 | -0.03 | 0.10 | 0.01 | -0.04 |
| TiN | [1-10] | 3 | -0.18 | 0.06 | -0.02 | -0.19 | 0.09 | -0.03 |
| VN | [1-10] | 2.927 | -0.15 | -0.04 | 0.00 | -0.16 | -0.06 | -0.01 |
| W$_2$N | [1-10] | 2.918 | -0.15 | -0.04 | 0.01 | -0.16 | -0.06 | -0.01 |
| ZrN | [1-10] | 3.238 | -0.27 | 0.08 | -0.10 | -0.29 | 0.06 | -0.12 |
| HfN | [1-10] | 3.2 | -0.26 | 0.09 | -0.09 | -0.27 | 0.07 | -0.10 |
| SiN | a | 7.61 | 0.25 | -0.08 | 0.14 | 0.24 | -0.10 | 0.13 |
| SiN | c | 2.91 | -0.14 | -0.03 | 0.01 | -0.16 | -0.06 | 0.00 |
| SiN | [1-10] | 5.382 | -0.06 | -0.15 | -0.22 | -0.07 | -0.17 | -0.24 |

FIG. 32

| | | | Ramsdellite TiO$_2$ | | Hollandite K0.66TiO$_2$ | spinel ZnCr$_2$O$_4$ | |
|---|---|---|---|---|---|---|---|
| | | | a | b | a | a | [1-10] |
| | | | 4.902 | 9.459 | 10.182 | 8.327 | 11.77 |
| ZnCr$_2$O$_4$ | a | 8.327 | 0.15 | 0.12 | 0.18 | 0.00 | 0.29 |
| | [1-10] | 11.77 | -0.20 | -0.24 | -0.16 | -0.41 | 0.00 |
| ZnV$_2$O$_4$ | a | 8.41 | 0.14 | 0.11 | 0.17 | 0.01 | 0.29 |
| | [1-10] | 11.89 | -0.21 | -0.26 | -0.17 | -0.43 | 0.01 |
| ZnMn$_2$O$_4$ | a | 8.087 | 0.18 | 0.15 | 0.21 | 0.04 | 0.31 |
| | c | 9.254 | 0.06 | 0.02 | 0.09 | -0.11 | 0.21 |
| | [1-10] | 11.44 | -0.17 | -0.21 | -0.12 | -0.37 | 0.03 |
| CuAlO$_3$ | a | 2.857 | -0.17 | 0.09 | -0.12 | -0.03 | 0.13 |
| | c | 16.94 | 0.14 | 0.10 | 0.17 | -0.02 | -0.44 |
| | [1-10] | 4.948 | -0.01 | -0.05 | 0.03 | -0.19 | 0.16 |
| CuFeO$_3$ | a | 3.035 | -0.24 | 0.04 | 0.11 | -0.09 | -0.03 |
| | c | 17.17 | 0.12 | 0.09 | 0.16 | -0.03 | -0.46 |
| | [1-10] | 5.257 | -0.07 | -0.11 | -0.03 | -0.26 | 0.11 |
| FeWO$_4$ | a | 4.753 | 0.03 | 0.00 | 0.07 | -0.14 | 0.19 |
| | b | 5.72 | -0.17 | -0.21 | -0.12 | 0.31 | 0.01 |
| | c | 4.968 | -0.01 | -0.05 | 0.02 | -0.19 | 0.16 |
| | [011] | 7.576 | 0.23 | 0.20 | 0.26 | 0.09 | -0.29 |
| NiWO$_4$ | a | 4.6 | 0.00 | -0.03 | 0.04 | -0.10 | -0.17 |
| | b | 5.665 | -0.16 | -0.20 | -0.11 | 0.32 | 0.04 |
| | c | 4.912 | 0.00 | -0.04 | 0.03 | -0.18 | 0.17 |
| | [011] | 7.498 | 0.24 | 0.21 | 0.26 | 0.10 | -0.27 |
| FeTiO$_3$ | a | 5.084 | -0.04 | -0.08 | 0.00 | -0.22 | 0.14 |
| | c | 14.09 | 0.28 | 0.26 | 0.31 | 0.15 | -0.20 |
| | [1-10] | 8.806 | 0.10 | 0.07 | 0.14 | -0.06 | 0.25 |
| NiTiO$_3$ | a | 5.027 | -0.03 | -0.06 | 0.01 | -0.21 | 0.15 |
| | c | 13.78 | 0.30 | -0.46 | -0.35 | 0.17 | -0.17 |
| | [1-10] | 8.707 | 0.11 | 0.08 | 0.14 | -0.05 | 0.26 |

FIG. 33

INFORMATION RECORDING AND REPRODUCING APPARATUS

CROSS-REFERENCE TO RELATED APPLICATIONS

This is a continuation application of International Application PCT/JP08/060,776, filed Jun. 12, 2008. This application also claims priority to Japanese Application No. 2007-155710, filed on Jun. 12, 2007. The entire contents of each are incorporated herein by reference.

TECHNICAL FIELD

The invention relates to an information recording and reproducing apparatus having high recording density.

BACKGROUND ART

In recent years, downsized mobile devices have spread worldwide, and simultaneously, the demand for downsized large-capacity nonvolatile memory has rapidly enlarged with the drastic progress of high-speed telecommunications networks. Therein, NAND flash memory and downsized HDDs (hard disk drives) in particular have achieved rapid advancements of recording density to form a large market.

Under such circumstances, several ideas for new memory aiming to drastically exceed the limits of recording density have been proposed. For example, PRAM (phase-change random access memory) employs the principle of using a recording material capable of having the two states of an amorphous state (ON) and a crystalline state (OFF) and recording data by having these two states correspond to the binary data of "0" and "1."

To write/erase, for example, the amorphous state is made by applying a high-power pulse to the recording material; and the crystalline state is made by applying a low-power pulse to the recording material.

The reading is performed by providing a reading current small enough not to cause writing/erasing of the recording material and by measuring the electrical resistance of the recording material. The resistance value of the recording material of the amorphous state is greater than the resistance value of the recording material of the crystalline state, and the ratio thereof is about $10^3$.

The greatest merit of PRAM is in the point that the operation is possible even when the device size is reduced to about 10 nm; and in such a case, because a recording density of about 10 Tbpsi (terra bit per square inch) can be realized, it is considered to be one candidate to achieve high recording density (for example, refer to Patent Citation 1).

Also, although different from PRAM, a new memory having an extremely similar operation principle has been reported (for example, refer to Patent Citation 2).

According to this report, nickel oxide is a typical example of the recording material on which data is recorded, and a high-power pulse and a low-power pulse are used for the writing/erasing similarly to PRAM. In such a case, an advantage is reported that the power consumption during the writing/erasing is reduced in comparison to PRAM.

Although the operation mechanism of this new memory has not been elucidated to date, the reproducibility has been confirmed, and it is considered to be one candidate to achieve high recording density. Several groups are attempting to elucidate the operation mechanism.

In addition thereto, MEMS memory using MEMS (micro electro mechanical systems) technology has been proposed (for example, refer to Non Patent Citation 1).

In particular, a MEMS memory referred to as Millipede has a structure in which multiple cantilevers in an array configuration oppose a recording medium coated with an organic substance, and probes of the tips of the cantilevers contact the recording medium with moderate pressure.

The writing is performed by selectively controlling the temperature of heaters added to the probes. In other words, when the heater temperature increases, the recording medium softens, the probe sinks into the recording medium, and a depression is made in the recording medium.

The reading is performed by scanning with the probes over the surface of the recording medium while providing a current to the probes such as not to cause the recording medium to soften. Because the probe temperature decreases and the resistance value of the heater increases when the probe drops into a depression of the recording medium, data can be sensed by reading the change of the resistance value.

The greatest merit of MEMS memory such as the Millipede is in the point that the recording density can be drastically improved because it is not necessary to provide an interconnect to each recording unit that records the bit data. Currently, a recording density of about 1 Tbpsi has already been achieved (for example, refer to Non Patent Citation 2).

Also, since the publication of the Millipede, recently, it is being attempted to achieve large improvements of power consumption, recording density, operation speed, and the like by combining MEMS technology with new recording principles.

For example, a method has been proposed to perform the recording of data by providing a ferroelectric layer in the recording medium and causing a dielectric polarization in the ferroelectric layer by applying a voltage to the recording medium. According to this method, there are theoretical predictions that the spacing between recording units recording the bit data (the minimum unit of recording) may approach the unit cell level of the crystal.

If the minimum unit of recording is one unit cell of the crystal of the ferroelectric layer, the recording density becomes the huge value of about 4 Pbpsi (peta bit per square inch).

However, MEMS memory recording by such a ferroelectric, while being a conventionally known principle, still has yet to be realized.

The greatest reason therefor is that the electric field emitted by the recording medium to the outside is undesirably obstructed by ions in the air. That is, because the electric field from the recording medium cannot be sensed, the reading cannot be performed.

Another reason is that in the case where lattice defects exist in the crystal, charge due to lattice defects moves into the recording unit and undesirably obstructs the charge.

The problem of the electric field obstruction by ions in the air of the former has recently been solved by a proposal of a reading method using an SNDM (scanning nonlinear dielectric microscope); and this new memory has progressed substantially toward practical use (for example, refer to Non Patent Citation 3)

Patent Citation 1: JP-A 2005-252068 (Kokai)
Patent Citation 2: JP-A 2004-234707 (Kokai)
Non Patent Citation 1: P. Vettiger, G. Cross, M. Despont, U. Drechsler, U. Durig, B. Gotsmann, W. Haberle, M. A. Lants, H. E. Rothuizen, R. Stutz and G. K. Binnig, IEEE Trans, Nanotechnology 1, 39 (2002)

Non Patent Citation 2: P. Vettiger, T. Albrecht, M. Despont, U. Drechsler, U. Durig, B. Gotsmann, D. Jubin, W. Haberle, M. A. Lants, H. E. Rothuizen, R. Stutz, D. Wiesmann and G. K. Binnig, P. Bachtold, G. Cherubini, C. Hagleitner, T. Loeliger, A. Pantazi, H. Pozidis and E. Eleftheriou, in Technical Digest, IEDM03 pp. 763-766

Non Patent Citation 3: A. Onoue, S. Hashimoto, Y. Chu, Mat. Sci. Eng. B120, 130(2005)

DISCLOSURE OF INVENTION

Problems to be Solved by the Invention

The invention provides a non-volatile information recording and reproducing apparatus having high recording density and low power consumption.

Technical Solution

According to an aspect of the invention, there is provided an information recording and reproducing apparatus, includes: a recording layer including a first layer including a first compound, the first compound being a conjugated compound including at least two types of cation elements, at least one selected from the cation elements being a transition element having a d orbit incompletely filled by electrons, a shortest distance between adjacent cation elements being not more than 0.32 nm; a voltage application unit that applies a voltage to the recording layer, produces a phase change in the recording layer, and records information; an electrode layer that applies a voltage to the recording layer; and an orientation control layer provided between the recording layer and the electrode layer to control an orientation of the recording layer.

BRIEF DESCRIPTION OF DRAWINGS

FIG. 16 is a schematic cross-sectional view illustrating a memory cell of flash memory.

FIG. 29 is a table summarizing calculation results of the difference between the lattice constant of the recording layer and the lattice constant of the orientation control layer in the case where the recording layer and the orientation control layer use a material having a spinel structure as a first compound.

FIG. 30 is a table summarizing calculation results of the difference between the lattice constant of the recording layer and the lattice constant of the orientation control layer in the case where the recording layer and the orientation control layer use a material having a delafossite structure as a first compound.

FIG. 31 is a table summarizing calculation results of the difference between the lattice constant of the recording layer and the lattice constant of the orientation control layer in the case where the recording layer and the orientation control layer use a material having a wolframite structure as a first compound.

FIG. 32 is a table summarizing calculation results of the difference between the lattice constant of the recording layer and the lattice constant of the orientation control layer in the case where the recording layer and the orientation control layer use a material having an ilmenite structure as a first compound.

FIG. 33 is a table summarizing calculation results of the difference between the lattice constant of the recording layer including a first compound and the lattice constant of the recording layer including a second compound.

Figure 1:
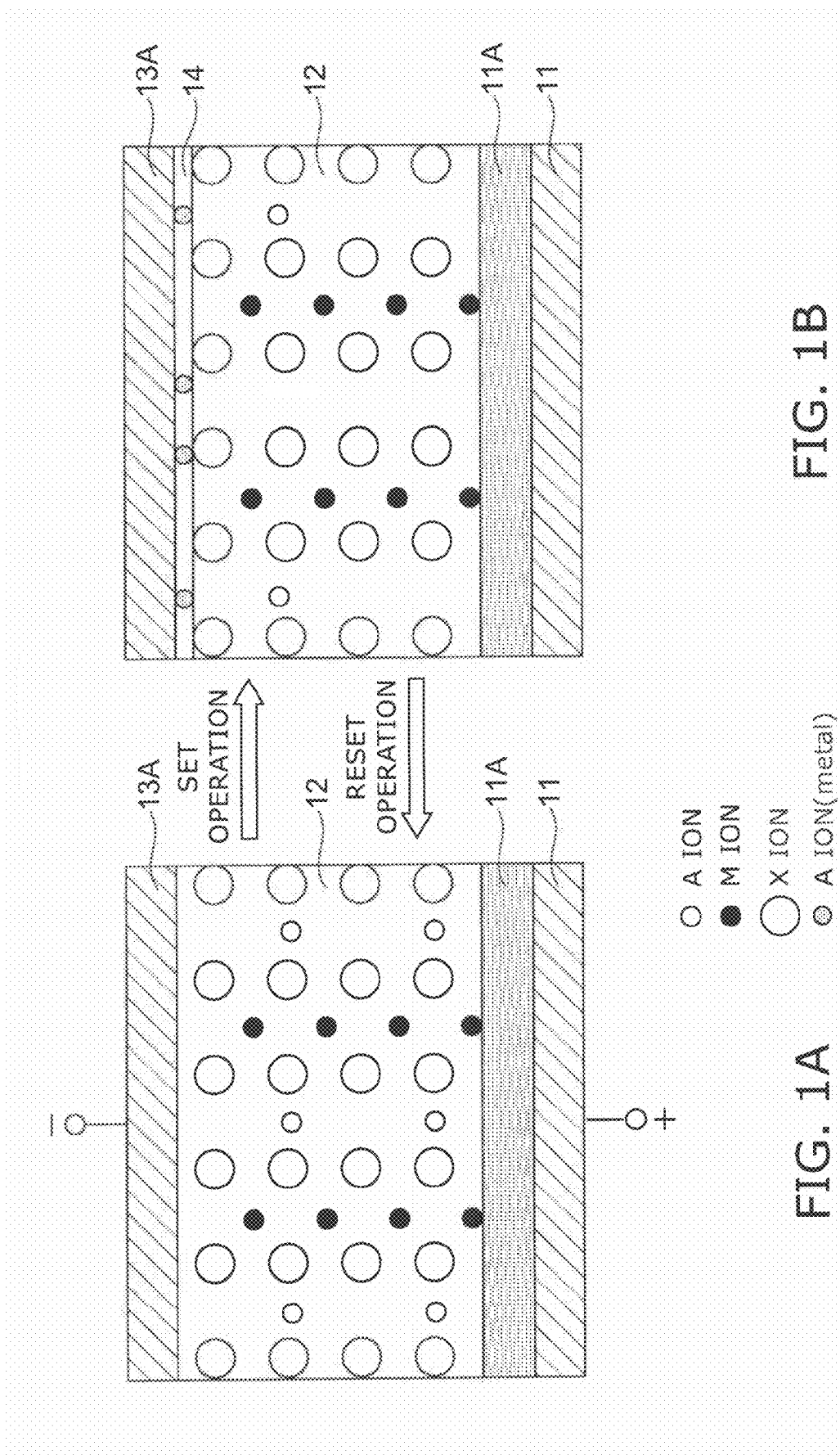
FIGS. 1A and 1B are conceptual views illustrating the basic principle of recording/reproducing information in an information recording and reproducing apparatus according to a first embodiment of the invention.

EXPLANATION OF REFERENCE 11 electrode layer
11A orientation control layer
12 recording layer
12A first layer
12B second layer
13A electrode layer (protective layer)
13B protective layer 14 metal layer
15 driver
16 scanner
20 substrate
21 electrode layer
21A orientation control layer
22 recording layer
23 substrate
24 probe
25, 26 multiplex driver
27 recorded bit
30 semiconductor chip
31 decoder
32 reading circuit
33 memory cell
34 diode
34A orientation control layer
35 heater layer
41 semiconductor substrate
41a type semiconductor substrate
41b type well region
41c type well region
42 diffusion layer
43 gate insulation layer
43A orientation control layer
44 recording layer
45 control gate electrode
47 semiconductor layer
47A orientation control layer

BEST MODE FOR CARRYING OUT THE INVENTION

Embodiments of the invention will now be described with reference to the drawings. Similar components in the drawings are marked with like reference numerals, and a detailed description is omitted as appropriate.

First Embodiment

FIG. 1 is a conceptual view illustrating the basic principle of recording/reproducing information in an information recording and reproducing apparatus according to a first embodiment of the invention.

FIG. 1A is a cross-sectional view of a recording unit. The recording unit has a structure in which electrode layers 11 and 13A are disposed on either side of a recording layer 12. Further, an orientation control layer 11A is provided between the recording layer 12 and the electrode layer 11.

The recording layer 12 includes a first compound, where the first compound is a conjugated compound including at least two types of cation elements, at least one selected from the cation elements is a transition element having a d orbit incompletely filled by electrons, and the shortest distance between adjacent cation elements is not more than 0.32 nm. Such a recording layer may include, for example, the following materials.

One example is a spinel structure represented by $A_xM_yX_4$ ($0.1 \leq x \leq 2.2$ and $1.5 \leq y \leq 2$). A and M are mutually different elements; and at least one selected therefrom is a transition element having a d orbit incompletely filled by electrons. X is an element including at least one selected from the group consisting of O (oxygen) and N (nitrogen).

A is at least one type of element selected from the group consisting of Na, K, Rb, Be, Mg, Ca, Sr, Ba, Al, Ga, Mn, Fe, Co, Ni, Cu, Zn, S, P, S, Se, Ge, Ag, Au, Cd, Sn, Sb, Pt, Pd, Hg, Tl, Pb, and Bi.

It is favorable that A is at least one type of element selected from the group consisting of Mg, Mn, Fe, Co, Ni, Zn, Cd, and Hg. This is because using these elements enables an optimal ion radius for maintaining the crystalline structure, and the ion mobility also can be sufficiently ensured. Also, it is easy to control the valence of the ion to be bivalent.

It is more favorable that A is at least one type of element selected from Zn, Cd, and Hg. This is because using these elements enables the movement of cations to occur easily.

M is at least one type of element selected from the group consisting of Al, Ga, Ti, Ge, Sn, V, Cr, Mn, Fe, Co, Ni, Nb, Ta, Mo, W, Re, Ru, and Rh.

It is favorable that M is at least one type of element selected from the group consisting of Ti, Zr, Hf, V, Nb, Ta, Cr, Mo, W, Mn, Re, Fe, Co, Ni, Al, and Ga. This is because using these elements enables easier control of the electron state in the crystal.

It is more favorable that M is at least one type of transition element selected from the group consisting of Cr, Mo, W, Mn, and Re (referred to as "group 1" for convenience). This is because using these elements enables stable repeated switching because the main structure is stably maintained.

It is more favorable that M includes at least one type of element selected from the group consisting of Fe, Co, Ni, Al, and Ga in addition to the transition elements of the group 1. This is because using these elements instead of a portion of the elements of group 1 enables more stable repeated switching because the main structure is more stably maintained.

Additionally, one example is a delafossite structure represented by $A_xM_yX_2$ ($0.1 \leq x \leq 1.1$ and $0.9 \leq y \leq 1.1$). A and M are mutually different elements, and at least one selected therefrom is a transition element having a d orbit incompletely filled by electrons. X is an element including at least one selected from the group consisting of O (oxygen) and N (nitrogen).

A is at least one type of element selected from the group consisting of Li, Na, Be, Mg, Ca, Cu, Ag, Au, Pt, Pd, Rh, Hg, and Tl.

It is more favorable that A is at least one type of element selected from the group consisting of Mg, Mn, Fe, Co, Ni, Cu, Ag, and Zn. This is because using these elements enables an optimal ion radius for maintaining the crystalline structure, and the ion mobility also can be sufficiently ensured. Also, it is easy to control the coordination number to be two.

It is favorable that A is at least one type of element selected from the group consisting of Cu and Ag. This is because using these elements makes it easy to have a delafossite structure.

M is at least one type of element selected from the group consisting of Al, Ga, Sc, In, Y, La, Pr, Nd, Sm, Eu, Gd, Tb, Dy, Ho, Er, Tm, Tb, Lu, Ti, Ge, Sn, V, Cr, Mn, Fe, Co, Ni, Nb, Ta, Mo, W, Ru, Rh, and Pd.

It is more favorable that M is at least one type of element selected from the group consisting of Y, Sc, V, Cr, Mn, Fe, Co, Ni, Al, and Ga. This is because using these elements enables easier control of the electron state in the crystal.

It is more favorable that M is at least one type of element selected from the group consisting of Fe, Co, and Al. This is because using these elements makes it easy to have a delafossite structure.

Additionally, one example is a wolframite structure represented by $A_xM_yX_4$ ($0.5 \leq x \leq 1.1$ and $0.7 \leq y \leq 1.1$). A and M are mutually different elements; and at least one selected therefrom is a transition element having a d orbit incompletely filled by electrons. X is an element including at least one selected from the group consisting of O (oxygen) and N (nitrogen).

A is at least one type of element selected from the group consisting of Na, K, Rb, Be, Mg, Ca, Sr, Ba, Al, Ga, Ti, V, Cr, Mn, Fe, Co, Ni, Cu, Zn, Si, P, S, Se, Ge, Ag, Au, Cd, Sn, Sb, Pt, Pd, Hg, Tl, Pb, and Bi.

It is favorable that A is at least one type of element selected from the group consisting of Ti, V, Mn, Fe, Co, and Ni. This is because using these elements enables an optimal ion radius for maintaining the crystalline structure, and the ion mobility also can be sufficiently ensured. Also, it is easy to control the valence of the ion to be bivalent.

It is more favorable that A is at least one type of element selected from the group consisting of Mn, Fe, Co, and Ni. This is because using these elements makes it easy to cause a resistance change.

M is at least one type of element selected from the group consisting of V, Nb, Ta, Cr, Mn, Mo, and W.

It is more favorable that M is at least one type of element selected from the group consisting of Cr, Mo, and W. This is because using these elements makes it easy to have a wolframite structure.

Additionally, one example is an ilmenite structure represented by $A_xM_yX_3$ ($0.5 \leq x \leq 1.1$ and $0.9 \leq y \leq 1.1$). A and M are mutually different elements, and at least one selected therefrom is a transition element having a d orbit incompletely filled by electrons. X is an element including at least one selected from the group consisting of O (oxygen) and N (nitrogen).

A is at least one type of element selected from the group consisting of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

It is favorable that A is at least one type of element selected from the group consisting of Mg, Mn, Fe, Co, Ni, and Zn. This is because using these elements enables an optimal ion radius for maintaining the crystalline structure, and the ion mobility also can be sufficiently ensured. Also, it is easy to control the valence of the ion to be bivalent.

It is more favorable that A is at least one type of element selected from the group consisting of Fe and Ni. This is because using these elements makes it easy to have an ilmenite structure.

M is at least one type of element selected from the group consisting of Al, Ga, Ti, Ge, Sn, V, Cr, Mn, Fe, Co, Ni, Nb, Ta, Mo, W, Re, Ru, and Rh.

It is more favorable that M is at least one type of element selected from the group consisting of Ti, Zr, Hf, V, Nb, Ta, Cr, Mn, Fe, Co, and Ni. This is because using these elements enables easier control of the electron state in the crystal.

It is favorable that M is at least one type of element selected from the group consisting of Ti, Zr, Hf, and V. This is because using these elements makes it easy to have an ilmenite structure.

Regarding the molar ratios x and y of the spinel structure represented by $A_xM_yX_4$ ($0.1 \leq x \leq 2.2$ and $1.5 \leq y \leq 2$), the delafossite structure represented by $A_xM_yX_2$ ($0.1 \leq x \leq 1.1$ and $0.9 \leq y \leq 1.1$), the wolframite structure represented by $A_xM_yX_4$ ($0.5 \leq x \leq 1.1$ and $0.7 \leq y \leq 1.1$), and the ilmenite structure represented by $A_xM_yX_3$ ($0.5 \leq x \leq 1.1$ and $0.9 \leq y \leq 1$), the lower limits of the numerical ranges are set to maintain the crystalline structure, and the upper limits thereof are set to control the electron state in the crystal.

By using a recording layer such as that recited above oriented in a desired direction, in principle, a recording density on the Pbpsi (peta bit per square inch) order can be realized; and further, power consumption reduction also can be achieved.

In the recording unit illustrated in FIG. 1, the small white circles in the recording layer 12 represent the A ions (e.g., the diffusion ions), and the large white circles represent the X ions (e.g., the anions). The small black circles represent the M ions (e.g., main body ions).

In the case where a voltage is applied to the recording layer 12 to produce a potential gradient in the recording layer 12, some of the A ions move in the crystal. Therefore, in this embodiment, recording of information is performed by taking the initial state of the recording layer 12 to be an insulator (high resistance phase), causing a phase change of the recording layer 12 by the potential gradient, and making the recording layer 12 conductive (low resistance phase).

First, for example, a state is made in which the potential of the electrode layer 13A is relatively lower than the potential of the electrode layer 11. In the case where a fixed potential (e.g., grounding potential) is applied to the electrode layer 11, it is sufficient to apply a negative potential to the electrode layer 13A.

At this time, some of the A ions in the recording layer 12 move to the electrode layer (cathode) 13A side, and the number of the A ions in the recording layer (the crystal) 12 relatively decreases with respect to the X ions. The A ions moving to the electrode layer 13A side receive electrons from the electrode layer 13A, precipitate as A atoms, i.e., a metal, and form a metal layer 14. Accordingly, because the A ions in a region proximal to the electrode layer 13A are reduced and behave metallically, the electrical resistance thereof greatly decreases.

Alternatively, in the case where vacant sites which the A ions may occupy exist in the crystalline structure of the recording layer 12 such as in, for example, a spinel structure, the A ions moving to the electrode layer 13A side may be filled into the vacant sites on the electrode layer 13A side. In such a case as well, the A ions receive electrons from the electrode layer 13A to satisfy the local neutrality conditions of charge and behave metallically.

The X ions in the interior of the recording layer 12 are excessive, and as a result, the valence of the A ions or the M ions remaining in the recording layer 12 increases. In the case where the A ion or the M ion is selected such that the electrical resistance decreases when the valence increases at this time, the movement of the A ions causes the electrical resistance to decrease in both the metal layer 14 and the recording layer 12, and therefore a phase change to a low resistance phase occurs for the entire recording layer. That is, an information recording (set operation) is completed.

Information reproduction can be easily performed by, for example, applying a voltage pulse to the recording layer 12 and detecting the resistance value of the recording layer 12. However, it is necessary that the amplitude of the voltage pulse is a value small enough that movement of the A ions does not occur.

It may be considered that the step described above is one type of electrolysis, an oxidizing agent is created at the electrode layer (anode) 11 side due to electrochemical oxidation, and a reducing agent is created at the electrode layer (cathode) 13A side due to electrochemical reduction.

Therefore, to return the low resistance phase to the high resistance phase, it is sufficient, for example, to perform Joule heating of the recording layer 12 by a large current pulse and facilitate an oxidation-reduction reaction of the recording layer 12. In other words, due to the Joule heat caused by the large current pulse, the A ions go back into the more thermally stable crystalline structure 12, and the initial high resistance phase (the reset operation) takes form.

Alternatively, the reset operation can be performed also by applying a voltage pulse having an orientation reversed from that during the set operation. That is, in the case where a fixed potential is applied to the electrode layer 11 similarly to during the setting, it is sufficient to apply a positive potential to the electrode layer 13A. Then, after the A atoms proximal to the electrode layer 13A provide electrons to the electrode layer 13A and become A ions, the A ions go back into the crystalline structure 12 due to the potential gradient in the recording layer 12. Thereby, because the valence of the A ions decreases to the initial value for some of the A ions for which the valence had increased, the phase changes to the initial high resistance phase.

However, to practically use this operation principle, it is necessary to confirm that the reset operation does not occur at room temperature (ensuring a sufficiently long retention time) and that the power consumption of the reset operation is sufficiently low.

The former can be accommodated by making the coordination number of the A ions small (ideally not more than two) or making the valence thereof bivalent or higher.

Supposing that the A ions are monovalent such as Li ions, a sufficient movement resistance of the ions cannot be obtained in the set state, and the A ion element immediately undesirably goes back into the recording layer 12 from the metal layer 14. In other words, a sufficiently long retention time cannot be obtained. Also, in the case where the A ions are trivalent or more, the voltage necessary for the set operation increases; and therefore, there is a possibility of causing collapse of the crystal. Accordingly, it is favorable that the valence of the A ions is bivalent for the information recording and reproducing apparatus.

Also, the latter may be accommodated by optimizing the ion radius of the A ions and using a structure in which movement paths exist such that the A ions move in the recording layer (the crystal) 12 without causing crystal destruction. It is sufficient to use the elements and the crystalline structures described above as such a recording layer 12.

Next, optimal values of the mixing ratio of each atom will be described.

There is slight arbitrariness of the mixing ratio of the A ions in the case where vacant sites that the A ions may occupy exist and/or in the case where it is possible that the A ions occupy sites originally occupied by the M ions. Also, in the case where an excess/deficiency of the X ions exists, the mixing ratio of the A ions or the M ions shifts from those of the definite-proportion composition. Accordingly, a width is given to the mixing ratios of the A ions and the M ions. Actually, it is possible to optimize the mixing ratio of the A ions to bring the resistance of each state or the diffusion coefficient of the A ions to its optimal value.

The lower limits of the mixing ratios of the A ions and the M ions were set such that a first compound having the desired crystalline structure can be easily constructed. In the case where the total amount of the ions occupying the sites of the M ions is too little, it is difficult to stably maintain the structure after the A ions are removed.

Figures 26A, 26B:
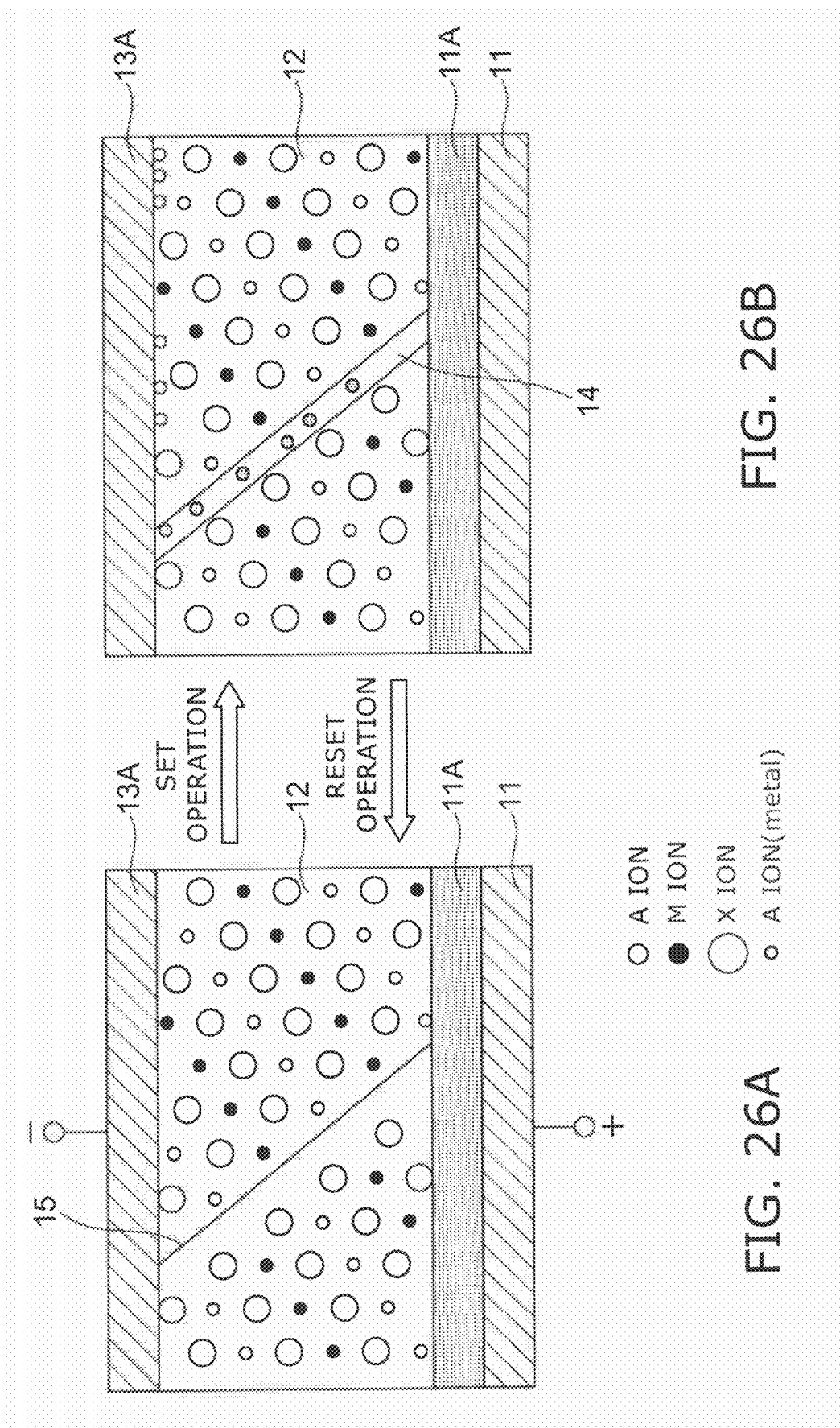
FIGS. 26A and 26B are conceptual views showing the structure of the recording unit of the first embodiment in which the crystal is divided in the film thickness direction.

Although the case is described where a sufficiently large crystal is obtained for the recording unit illustrated in FIG. 1, even in the case where the crystal is disposed to be divided in the film thickness direction as in the recording unit illustrated in FIG. 26, it is possible to produce the movement of the A ions and the accompanying resistance change by the basic principle described in this embodiment.

That is, in the case where a negative voltage is applied to the electrode layer 13 in the state where the electrode layer 11 is grounded, the potential gradient occurs in the recording layer 12 and the A ions are transported. When the A ions move to the crystal interface, the A ions receive electrons gradually from the regions proximal to the electrode layer 13A and behave metallically. As a result, the metal layer 14 is formed proximally to the crystal interface.

Because the valence of the M ions increases in the interior of the recording layer 12, the conductivity thereof increases. In such a case, conduction paths of the metal layer 14 are formed along the crystal interface; and therefore, the resistance between the electrode layer 11 and the electrode layer 13A decreases, and the device changes to the low resistance phase.

In such a case as well, it is possible to return to the high resistance phase by pulling the A ions of the crystal interface back into the spinel structure by Joule heating due to a large current pulse and/or applying a voltage pulse in a reversed orientation.

However, to efficiently cause the movement of the A ions by the applied voltage, it is favorable that the direction in which the A ions diffuse matches the direction in which the electric field is applied as in the recording unit illustrated in FIG. 1.

A material having a spinel structure may be used as the first compound having a crystalline structure such as that described above. In a spinel structure, the A ions diffuse easily because about half of the sites that the A ions may occupy are in a vacant state.

In the case of a first compound having a spinel structure, it is favorable when the c axis of the recording layer 12 is oriented in a parallel direction with respect to the film surface because movement paths are disposed in the direction linking between the electrodes as in the recording unit illustrated in FIG. 1. Further, the movement paths are disposed substantially in a direction parallel to the electric field direction in the case where the recording layer 12 has a (110) orientation; and therefore, it is more favorable that the recording layer 12 has a (110) orientation. In the specification of the application, "having a (110) orientation" refers to the (110) plane being substantially parallel to the film surface. It is similar for the orientation of other crystal planes.

To provide the recording layer 12 with a (110) orientation, as described below, it is good to use a material in which the unit lattice is orthogonal and the ratio of the unit lattice length is, for example, about $1:2^{1/2}$ ($1:\sqrt{2}$) as the orientation control layer 11A. In other words, to orient the recording layer 12 in the desired direction, it is good to form an orientation control layer 11A between the recording layer 12 and the electrode layer 11 where the orientation control layer 11A is a layer having a lattice constant that is the lattice constant of the recording layer 12 multiplied by a whole number. It is favorable to use an orientation control layer 11A that is a layer having a simple crystalline structure and easier orientation control than that of the recording layer 12. In the case where the conductivity of the orientation control layer 11A is too low, it is difficult to apply the voltage to the recording layer 12; and therefore, it is favorable that the resistivity of the orientation control layer 11A is, for example, about the same or more than the resistivity of the recording layer 12 in the insulator state.

To this end, it is favorable that the orientation control layer 11A includes a nitride of any of Si, Ti, Zr, Hf, V, Nb, Ta, and W. Alternatively, the orientation control layer 11A may be a material including an oxide of any of Ru, Ir, Ta, Mg, Ce, and W. Among the nitrides, Ti, Zr, Hf, V, and W are particularly favorable because they can be stably formed in a film. Among the oxides, an oxide of Ru or Ir is particularly favorable because it has high conductivity.

By disposing these nitrides or oxides proximally to the first compound, it is possible to simultaneously provide the first compound with the effect of preventing the elements included in the first compound from diffusing. Further, in the case where a material having a favorable thermal conductivity is used as the orientation control layer 11A, even when the temperature of the recording layer 12 increases due to Joule heat, the first compound can be simultaneously provided with the function of preventing film peeling between the first compound and the orientation control layer 11A in the cooling stage thereof.

Next, the favorable orientation direction of each of the recording layer materials and the relationship of the lattice constants between the recording layer materials oriented in such a direction and the orientation control layer will be described.

Figure 27:
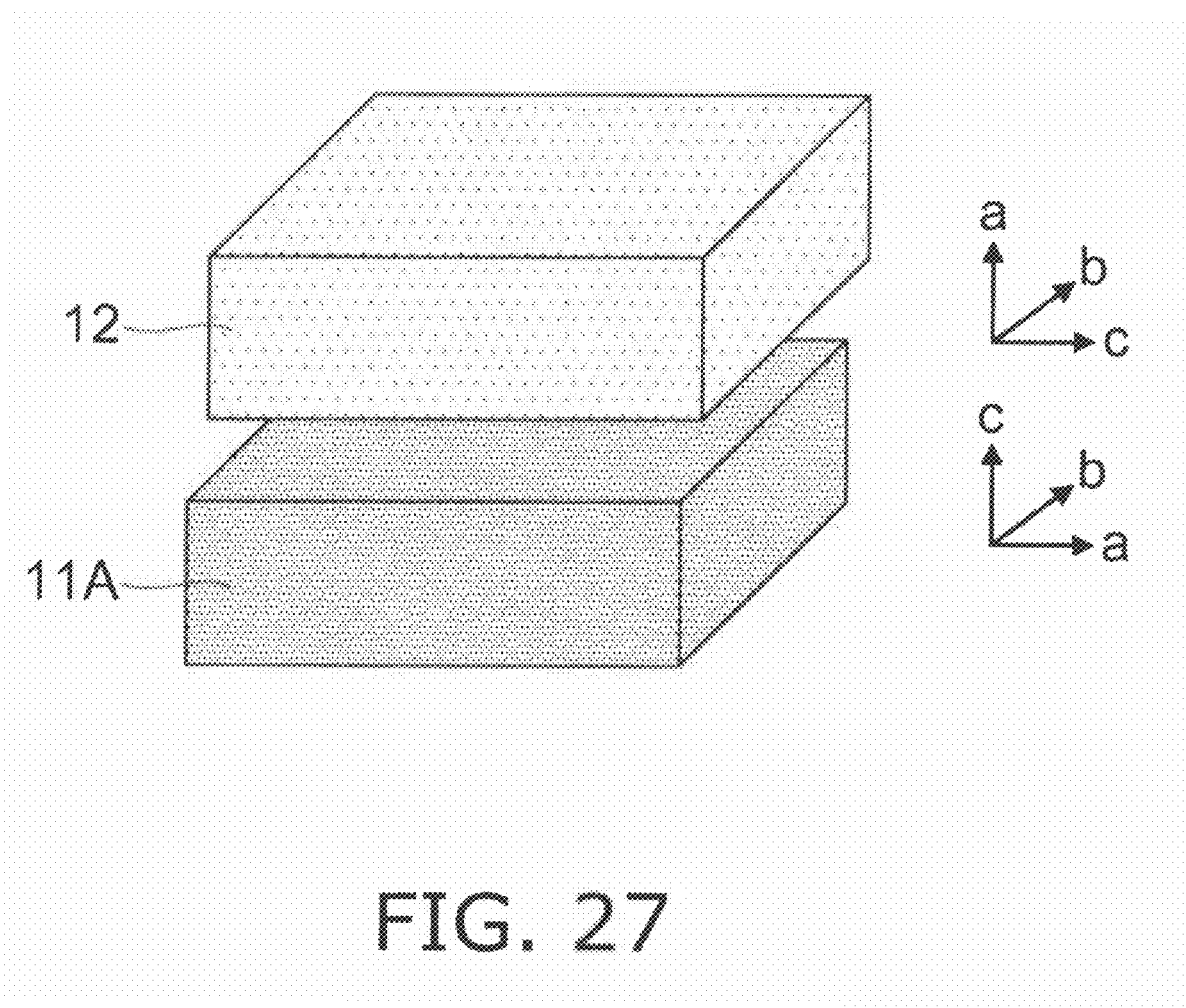
FIG. 27 is a schematic view illustrating the directions of the a axes, the b axes, and the c axes, which are the crystal axes of the recording layer and the orientation control layer.

FIG. 27 is a schematic view illustrating the directions of the a axes, the b axes, and the c axes, which are the crystal axes of the recording layer 12 and the orientation control layer 11A.

Matching of the lattice constants between the recording layer 12 and the orientation control layer 11A will now be ascertained. Except for $ZnMn_2O_4$, which has a tetragonal crystal structure, the spinel structure generally has a cubic crystal structure. In a spinel structure, the simplest way to make the c axis thereof in the direction parallel to the film surface of the recording layer 12 is to provide the first compound with a (100) orientation. To this end, it is sufficient to use an orientation control layer 11A having a lattice constant with a high correspondence to the b axis and the c axis of the recording layer 12. The a-axis length, the b-axis length, and the c-axis length are the same for $ZnCr_2O_4$ and $ZnV_2O_4$, which have cubic crystals; and therefore, the lattice constants to be compared are as illustrated in FIG. 29.

FIG. 29 is a table summarizing calculation results of the difference $(a_r - na_c)/a_r$ between the lattice constant of the recording layer 12 (here, $a_r = b_r$) and the lattice constant of the orientation control layer 11A (here, $a_c = b_c$). However, n may be any integer.

From the calculation results illustrated in FIG. 29, for example, the difference between the a-axis length of $ZnCr_2O_4$ and the a-axis length of VN is 1%; and therefore, forming a $ZnCr_2O_4$ film on a (100) oriented VN film makes it easy to obtain a (100) orientation. It is favorable that the shift amount (the difference $(a_r - na_c)/a_r$ between the lattice constant of the recording layer 12 and the lattice constant of the orientation control layer 11A) is about 20% or less, and 5% or less is more favorable.

Here, the existence/absence of the orientation of the VN film or the degree of the orientation can be determined as follows.

The results of the evaluation of the VN film by XRD (X-ray diffraction) show that a (100) component was not observed due to symmetry, and only a (200) component around a refraction angle of 43.6 degrees was detected. In such a case, it can be said that the VN film has a (100) orientation. Here, in the case where the VN film is not oriented and the crystal grains have random orientations, the proportion of the diffraction intensity of the (200) component to the diffraction intensity of the (111) component is 100/72. That is, in the case where the diffraction intensity of the (200) component is taken as 100, the orientation is random when the diffraction intensity of the (111) component is 72. Accordingly, it can be said to have a (100) orientation when the refraction intensity of the (200) component to the refraction intensity of the (111) component is greater than 100/72. Further, in the case where the ratio of the refraction intensities is at least five times that of the random case, i.e., in the case where the proportion of the diffraction intensity of the (200) component to the diffraction intensity of the (111) component is 500/72 or greater, a strong (100) orientation is obtained, and the effect of the recording layer being oriented in the desired orientation can be markedly obtained. Also, in the case where only the (200) component is detected and the (111) component substantially is not detected, an even stronger (100) orientation is obtained, and the effect of the recording layer being oriented in the desired orientation can be even more markedly obtained.

Here, the definition of the orientation planes will be described.

FIG. 28 is a schematic view illustrating the definition of the orientation planes.

Figures 28A, 28B:
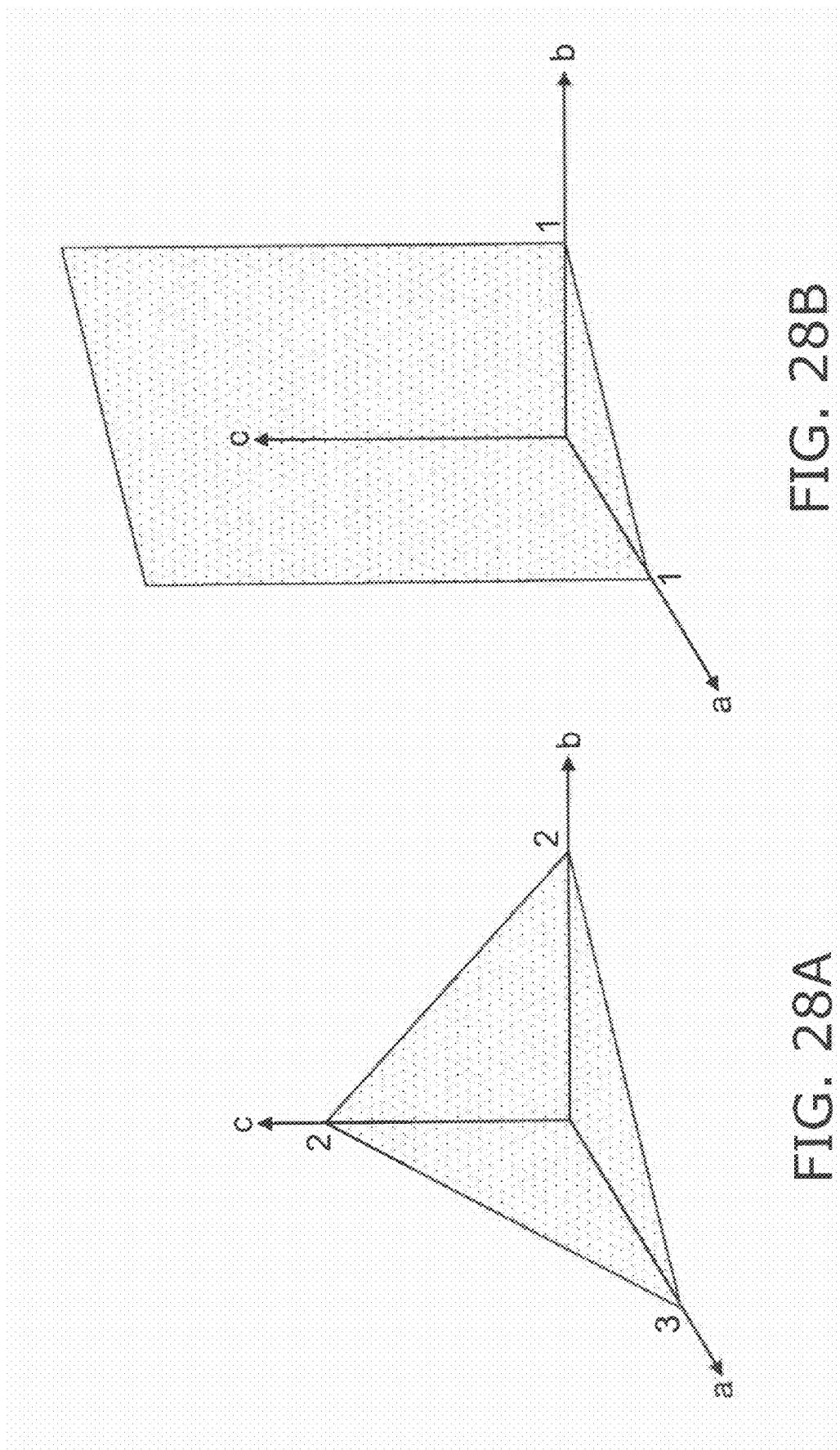
FIGS. 28A and 28B are schematic views illustrating the definition of the orientation planes.

As illustrated in FIG. 28A, the plane intersecting the crystal axes of the a axis, the b axis, and the c axis at 3, 2, and 2, respectively, defines the (322) plane using the reciprocals ⅓, ½, and ½ of these numbers. Also, the orientation direction at which the (322) plane appears at the surface is defined as the (322) orientation.

As in the orientation plane illustrated in FIG. 28B, in the case where the plane intersects with the crystal axes of the a axis and the b axis at 1 and 1, respectively, and does not intersect with the c axis, the plane is taken as the (110) plane from 1/1, 1/1, and 1/∞. The orientation at which the (110) plane appears at the surface is the (110) orientation. This definition does not depend on the angles among the a axis, the b axis, and the c axis. That is, even in the case where the a axis and the b axis are 120 degrees apart, a plane having the section illustrated in FIG. 28B is defined as the (110) plane.

As in the calculation results illustrated in FIG. 29, the change of the lattice constant is not great even when the elemental components of the spinel structure changes; and therefore, from the data of the typical compositions of $ZnCr_2O_4$, $ZnV_2O_4$, and $ZnMn_2O_4$ illustrated in FIG. 29, the composition and the orientation of the orientation control layer 11A favorable for orienting the spinel structure in the desired direction can be determined.

To provide the spinel structure with a (100) orientation, it is favorable to use a material as the orientation control layer 11A having two sides with lattice constants matching those of two a-axis sides of the spinel structure such as, for example, the following materials.

(001) oriented $IrO_2$ or $RuO_2$
(100), (110), or (111) oriented TiN, VN, or $W_2N$
(100) oriented ZrN or HfN
(100) or (001) oriented $Si_3N_4$ Thereamong, (100) oriented TiN, VN, or $W_2N$ is favorable from the point that the correspondence of the lattice constant is highest.

Here, for example, although TiN has a high compatibility for any of the (100), the (110), or the (111) orientations, it is not favorable for these to be in a randomly mixed state of about the same proportions. This is because, in the case where these are randomly mixed, it is predicted that the orientation control layer would have different orientations between cells; and that there would be a high possibility of the orientation, and likewise, the resistance change characteristic, of the first compound formed on the orientation control layer being different for every cell.

In the spinel structure, because the movement paths point substantially in the [110] axis direction, it is more favorable that the film surface of the recording layer 12 has a (110) orientation. To provide the film surface of the recording layer 12 with the (110) orientation, it is sufficient that the [1-10] direction unit vector matches the c axis direction unit lattice. The following compositions and orientations are examples of favorable orientation control layers 11A providing the film surface of the recording layer 12 with the (110) orientation.
- (100) or (110) oriented $IrO_2$ or $RuO_2$
- (100), (110), or (111) oriented TiN, VN, or $W_2N$
- (110) oriented ZrN or HfN
- (100) or (110) oriented $Si_3N_4$ Thereamong, the (110) oriented TiN, VN, or $W_2N$ is favorable from the point that the correspondence of the lattice constant is highest. On the other hand, the (100) or the (111) oriented TiN, VN, or $W_2N$ is favorable from the point that a film is easily formed.

From the results recited above, it is favorable to use TiN, VN, or $W_2N$ as the orientation control layer 11A in the case where a first compound having a spinel structure is used because of the correspondence of the crystal lattices and because the A ions can be disposed in a layer configuration perpendicular to the film surface of the recording layer 12 even in the case where the orientation cannot be controlled completely in a (110) orientation. It is favorable that these nitrides have a (100), a (110), or a (111) orientation. It is more favorable to use TiN as the orientation control layer 11A considering the ease of film formation.

As in the calculation results illustrated in FIG. 29, spinel structures using Mn often are tetragonal crystals. In such a case, the A ions exist in a layer configuration with respect to the cross section of the recording layer 12 and therefore diffusion of the A ions in the electrode direction easily occurs as in the recording unit illustrated in FIG. 1 even in the case where the a axis is disposed in the direction parallel to the film surface of the recording layer 12. In the case where the orientation control layer 11A described above is used, the correspondence of the lattice constants is high even in the case where the a axis of $ZnMn_2O_4$ is disposed in the direction parallel to the film surface of the recording layer 12; and therefore, the (001) oriented $ZnMn_2O_4$ also can be easily obtained.

On the other hand, in spinel using Mn, the c-axis length is longer than the a-axis length; and therefore, the diameter of the diffusion paths in the direction linking between the electrodes increases when the c axis is substantially parallel to the film surface of the recording layer 12. To orient the spinel using Mn, it is sufficient to select a substance such that the correspondence between the c-axis length and the a-axis length or between the c-axis length and the [1-10] direction unit vector is higher than that of the unit vector of the orientation control layer. Accordingly, it is favorable to use (100) oriented $IrO_2$ or $RuO_2$ or (110) or (111) oriented TiN, VN, or $W_2N$ as the orientation control layer.

On the other hand, in the case where a portion of the Mn of the $ZnMn_2O_4$ is replaced by Cr, Fe, Co, Ni, Al, or Ga, the spinel structure approaches a cubic crystal; and therefore, the cubic crystal $ZnMn_{2-x}Ms_xO_4$ obtained by such a replacement (where Ms is the replacing element) may be used as the first compound. It is more favorable to use Cr or Al as an element used for such a purpose.

A material having a delafossite structure also may be used as the first compound having a crystalline structure such as that described above. The A ions easily diffuse in the delafossite structure because the diameters of the movement paths are large and the movement paths extend in three directions.

In the case of a delafossite structure, it is favorable when the c axis is oriented in the direction parallel to the film surface because the movement paths are disposed in the direction linking between the electrodes as in the recording unit illustrated in FIG. 1. Here, it is taken that the a axis and the b axis of the crystal lattice of the delafossite structure are 120 degrees apart, the a axis is orthogonal to the c axis, and the b axis is orthogonal to the c axis. Because it is a hexagonal crystal system in which the a-axis length and the b-axis length are equal, the distances between adjacent A atoms toward the [100] axis, the [010] axis, and the [110] direction are the same. Accordingly, it is more favorable that the film surface of the recording layer 12 is oriented parallel to a plane including the a axis and the c axis (referred to in the specification of the application as "ac-plane orientation") or has a (110) orientation because the movement paths are disposed substantially in the direction parallel to the electric field direction.

First, it is sufficient that the a-axis length and the c-axis length of the film surface of the recording layer 12 match the unit lattice of the orientation control layer 11A to easily provide an ac-plane orientation. From the calculation results illustrated in FIG. 30, the following compositions and orientations are examples of favorable orientation control layers 11A therefor.
- (100) or (110) oriented $IrO_2$ or $RuO_2$
- (110) or (111) oriented TiN, VN, $W_2N$, ZrN, or HfN
- (100), (001), or (110) oriented $Si_3N_4$ Thereamong, (110) oriented TiN, VN, and $W_2N$ are favorable from the point that the correspondences of the lattice constants are highest. On the other hand, (111) oriented TiN, VN, and $W_2N$ are favorable from the point that the films are easy to form.

To obtain a (110) oriented film surface of the recording layer 12, it is sufficient to focus on the unit vector of the [1-10] direction and the c-axis length. The following compositions and orientations are examples of favorable orientation control layers 11A therefor.
- (100) or (001) oriented $IrO_2$ or $RuO_2$
- (100) oriented ZrN or HfN
- (110) oriented $Si_3N_4$ From the results recited above, TiN, VN, and $W_2N$ are examples of orientation control layers 11A favorably used with the delafossite structure. It is more favorable that these nitrides have a (110) orientation. Considering the ease of film formation, it is more favorable to use TiN as the orientation control layer 11A.

A material having a wolframite structure also may be used as the first compound having a crystalline structure such as that described above. In the wolframite structure, the M ions and the X ions are strongly bonded, and it is possible to stably maintain the structure in which the A ions have moved.

In the case of the wolframite structure, it is favorable when the a axis is oriented in the direction parallel to the film surface because the movement paths are disposed in the direction linking between the electrodes as in the recording unit illustrated in FIG. 1. Here, although the crystal lattice of the wolframite structure has a structure in which the three axes are slightly shifted from the orthogonal directions, the shift angle is not more than about 1 degree; and therefore, the shift can be ignored. The case where the film surface of the recording layer 12 is (01-1) oriented is more favorable because the movement paths are disposed substantially in the electric field direction.

To this end, as described below, it is good to use a material in which the unit lattice is orthogonal and the ratio of the unit lattice lengths is about, for example, 1:1 or, for example, about $1:2^{1/2}$ ($1:\sqrt{2}$) as the orientation control layer.

First, to orient the a axis in the direction parallel to the film surface of the recording layer 12, it is sufficient that the a-axis length and the b-axis length or the a-axis length and the c-axis length match the unit lattice of the orientation control layer 11A. From the calculation results illustrated in FIG. 31, the following compositions and orientations are examples of favorable orientation control layers 11A therefor.

(100) or (001) oriented $IrO_2$ or $RuO_2$
(100) or (110) oriented TiN, VN, $W_2N$, ZrN, or HfN Thereamong, (100) oriented ZrN or HfN is favorable from the point that the correspondence of the lattice constants is highest. The lattice constant of (001) oriented $IrO_2$ or $RuO_2$ also has high correspondence and is favorable.

Next, to provide the film surface of the recording layer 12 with a (01-1) orientation, it is sufficient to focus on the a-axis length and the [011] direction unit vector length. From the calculation results illustrated in FIG. 31, the following compositions and orientations are examples of favorable orientation control layers 11A therefor.

(100) oriented TiN, VN, and $W_2N$

Thus, ZrN or HfN is an example of an orientation control layer 11A favorably usable with the wolframite structure. It is more favorable that these nitrides have a (100) orientation. Alternatively, $IrO_2$ or $RuO_2$ is an example of an orientation control layer 11A favorably usable with the wolframite structure. It is favorable that these oxides have a (100) or a (001) orientation; and it is more favorable to have a (001) orientation.

A material having an ilmenite structure also can be used as the first compound having a crystalline structure such as that described above. In the ilmenite structure, the A ions easily diffuse because the movement paths extend in three directions.

In the case of the ilmenite structure, it is favorable when the c axis is oriented in the direction parallel to the film surface because the movement paths are disposed in the direction linking between the electrodes as in the recording unit illustrated in FIG. 1. Because the ilmenite structure is a hexagonal crystal system, the distances between adjacent A atoms toward the [100] axis, the [010] axis, and the [110] direction are the same. Accordingly, it is more favorable that the recording film has an ac-plane orientation or a (110) orientation because the movement paths are disposed substantially in the direction parallel to the electric field direction.

First, to easily provide the ac-plane orientation, it is sufficient that the a-axis length and the c-axis length of the recording film match the unit lattice of the orientation control layer 11A. From the calculation results illustrated in FIG. 32, the following compositions and orientations are examples of favorable orientation control layers 11A therefor.

(100) or (110) oriented ZrN or HfN
(110) oriented $Si_3N_4$

Thereamong, (110) oriented ZrN or HfN is favorable from the point that the correspondence of the lattice constants is high.

To obtain a (110) oriented film surface of the recording layer 12, it is sufficient to focus on the unit vector of the [1-10] direction and the c-axis length. The following compositions and orientations are examples of favorable orientation control layers 11A therefor.

(001), (100), (110), or (111) oriented $IrO_2$ or $RuO_2$
(100), (110), or (111) oriented TiN, VN, $W_2N$, ZrN, or HfN
(100) oriented $Si_3N_4$ Thereamong, (100) oriented ZrN or HfN is favorable from the point that the correspondence of the lattice constants is highest. (001) oriented $IrO_2$ or $RuO_2$ also is favorable from the point that the correspondence of the lattice constants is high.

From the results recited above, it is favorable to use $IrO_2$ or $RuO_2$ as the orientation control layer 11A of the ilmenite structure. It is more favorable that these oxides have a (100) orientation. Alternatively, it is favorable to use ZrN or HfN as the orientation control layer 11A of the ilmenite structure from the point of having degrees of freedom of the orientation control of the orientation control layer 11A. It is favorable that these nitrides have a (100) or a (110) orientation. It is more favorable to have a (100) orientation from the point of easy film formation.

In the calculation results illustrated in FIG. 29 to FIG. 32, the lattice constants are illustrated for when each of the materials are constructed at the definite-proportion compositions. Generally, although there are some cases where values are slightly different from the lattice constants of the case of the definite-proportion composition in the case where a deficiency/excess of oxygen and/or nitrogen exists, the change of the lattice constants is not very prominent in the case where the deficiency/excess is not more than about 20%. Accordingly, it is not always necessary that the composition of the orientation control layer is the definite-proportion composition. Nevertheless, considering the reaction between the orientation control layer and the first compound, effects of the environment during the film formation of the first compound, and the like, it is favorable that the amount of deficiency/excess of the orientation control layer is not more than about 20%; and it is more favorable to be not more than 10%.

To obtain an orientation control layer oriented in the desired direction, a material in which an amorphous structure can easily be provided may be provided at any position between the electrode and the orientation control layer, and the crystallinity may be reset. A silicide of any metal such as Co and Ta, a metal such as Cu or Ta, an alloy including such or metals, or $Co_xFe_yB_z$ (it is favorable that $0.1 \leq z \leq 0.4$), and the like are examples of materials favorably used therefor. These amorphous layers may be crystallized during the high-temperature processes during the film formation of the recording layer and the like; and in particular, it is known that $Co_xFe_yB_z$ easily crystallizes while having good amorphous characteristics during film formation at room temperature. Although the film thickness of such amorphous layers may be provided at any film thickness, it is favorable to be not less than 0.3 nm and not more than 5 nm. By providing such an amorphous layer, the effects of the crystallinity and/or the orientation of the foundation and the like can be erased, and the orientation control layer formed thereupon can be formed in the desired orientation state.

Even in the case where the orientation control layer is a nitride or an oxide, during the film formation of the first compound, there is a possibility that a portion thereof may oxidize/reduce, and a portion of the composition may change across a layer of one atom to several atoms. Such an effect may function as a buffer for the slight shift of the lattice constants between the orientation control layer and the first compound and increase the adhesion of both. The adhesion effect is more prominent for nitrides.

Because the ease of the movement of ions is different in the circumferential edge portion of the crystal grain and the crystalline structure interior, it is favorable that the recording layer is made of a polycrystalline state or a monocrystalline state to uniformly provide recording and erasing characteristics at different positions utilizing the movement of diffusion ions in the crystalline structure. In the case where the recording layer is in a polycrystalline state, considering the ease of film formation, it is favorable that the size of the crystal grain in the recording film cross-sectional direction has an average of not less than 3 nm according to a distribution having a single peak. It is more favorable that the average crystal grain size is not less than 5 nm because film formation is easier; and it is more favorable to be not less than 10 nm because the recording and erasing characteristics at different positions can be made more uniform.

Although the film thickness of the recording layer can be appropriately set such that the resistances of the high resistance phase and the low resistance phase are the desired values, it is typically, for example, not less than about 1 nm and not more than about 500 nm. In the case where the recording region is reduced, it is more favorable that the recording region is less than a factor of ten to suppress the spread in the inner-plane direction of the recording layer.

In the case where the film thickness of the recording layer is, for example, not more than about 20 nm, it is easy for the orientation control to be provided to the entire film thickness of the recording layer using the orientation control layer. On the other hand, in the case where the film thickness of the recording layer exceeds, for example, about 20 nm, the effect of the orientation control decreases as the distance from the orientation control layer increases due to shifting of the lattice constants and the like. In such a case, it is possible to limit the movement of the A ions to a portion of the recording layer. The A ions do not move to the recording layer portion where the orientation control is insufficient; and it is possible to prevent the A ions from precipitating at the recording layer surface and reacting with ambient air. That is, it is possible to use the recording layer portion where the orientation control is insufficient as a protective layer.

However, because an oxidizing agent is created on the electrode layer (the anode) 11 side after the set operation, it is favorable to form the electrode layer 11 from a material that does not easily oxidize (e.g., an electrically conductive nitride, an electrically conductive oxide, etc.).

Also, it is good to form the electrode layer 11 from a material that does not conduct ions.

Such materials include the following materials; and thereamong, it can be said that $LaNiO_3$ is the most desirable material from the point of the overall performance considering the goodness of the electrical conductivity and the like.

MN

M is at least one type of element selected from the group consisting of Ti, Zr, Hf, V, Nb, and Ta. N is nitrogen.

$MO_x$

M is at least one type of element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. The molar ratio x satisfies $1 \leq x \leq 4$.

$AMO_3$

A is at least one type of element selected from the group consisting of La, K, Ca, Sr, Ba, and Ln (lanthanoid).

M is at least one type of element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one type of element selected from the group consisting of K, Ca, Sr, Ba, and Ln (lanthanoid).

M is at least one type of element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Because a reducing agent is created on the protective layer (the cathode) 13 side after the set operation, it is desirable that the protective layer 13 has a function of preventing the recording layer 12 from reacting with ambient air.

Such materials include, for example, amorphous carbon, diamond-like carbon, and semiconductors such as $SnO_2$.

The electrode layer 13A may function as a protective layer to protect the recording layer 12, and a protective layer may be provided instead of the electrode layer 13A. In such a case, the protective layer may be an insulator or a conductor.

To efficiently perform heating of the recording layer 12 during the reset operation, a heater layer (a material having a resistivity of about $10^{-5}$ Ωcm or more) may be provided on the cathode side, which is here, the electrode layer 13A side.

Second Embodiment

Next, the basic principle of recording/erasing/reproducing information in an information recording and reproducing apparatus according to a second embodiment of this embodiment will be described.

Figure 2:
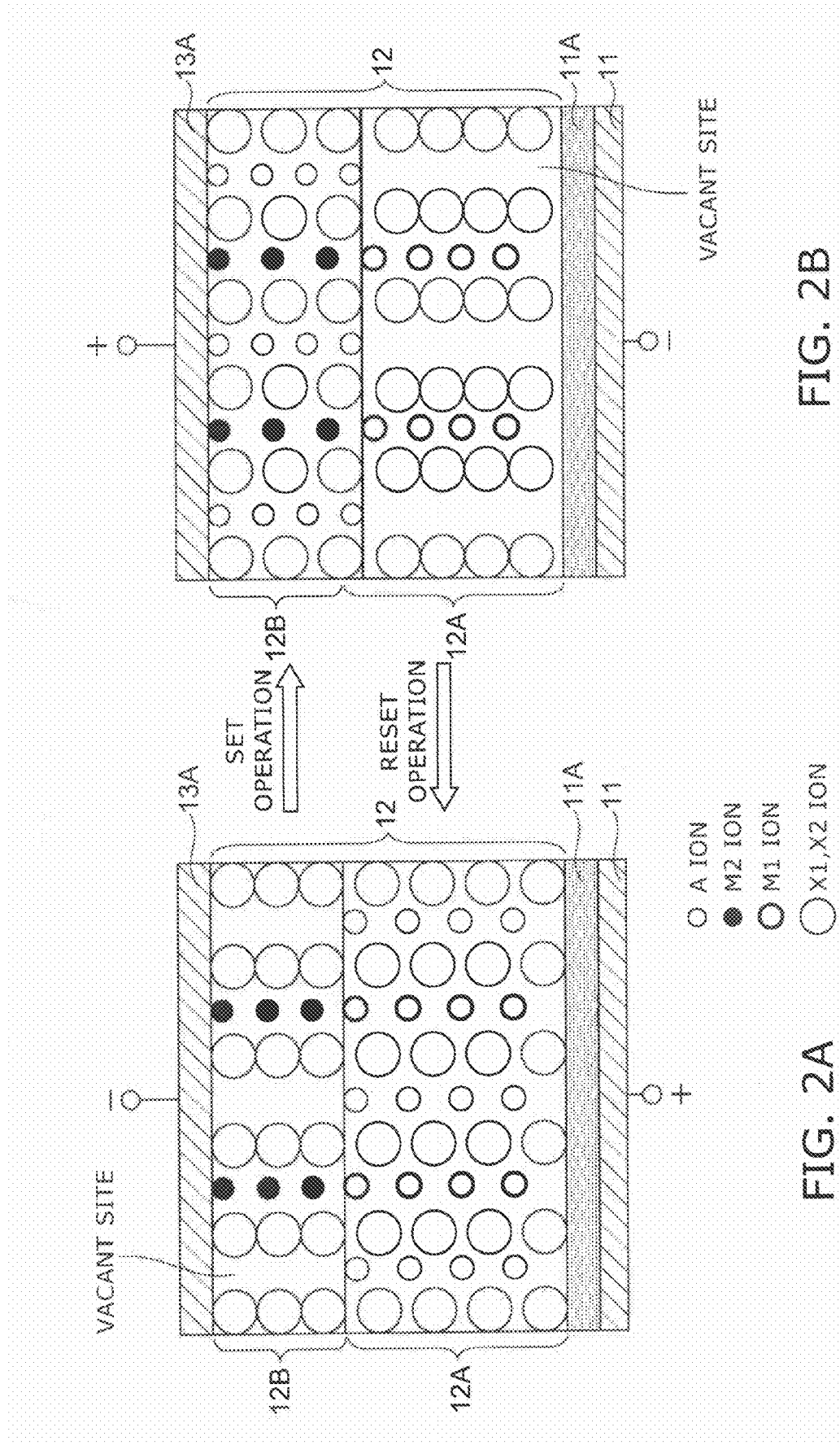
FIGS. 2A and 2B are conceptual views illustrating the structure of the recording unit of a second embodiment.

FIG. 2 is a conceptual view illustrating the structure of the recording unit of this embodiment.

The recording unit has a structure in which the electrode layers 11 and 13A are disposed on either side of the recording layer 12. Further, the orientation control layer 11A is provided between the recording layer 12 and the electrode layer 11.

The recording layer 12 includes a first compound 12A disposed on the electrode layer 11 side and represented by $A_xM1_yX1_z$ and a second compound 12B disposed on the electrode layer 13A side, including at least one type of transition element, and having vacant sites capable of containing the A ion element of the first compound 12A.

The second compound 12B may include substances such as those represented by, for example, the following chemical formulas, where the vacant sites containing the A ions are represented by □. A portion of the vacant sites may be occupied by other ions beforehand to easily form the film of the second compound 12B.

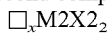$□_xM2X2_2$

M2 is at least one type of element selected from the group consisting of Ti, Ge, Sn, V, Cr, Mn, Fe, Co, Ni, Nb, Ta, Mo, W, Re, Ru, and Rh.

X2 is at least one type of element selected from the group consisting of O, S, Se, N, Cl, Br, and I. The molar ratio x satisfies $0.3 \leq x \leq 1$.

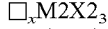$□_xM2X2_3$

M2 is at least one type of element selected from the group consisting of Ti, Ge, Sn, V, Cr, Mn, Fe, Co, Ni, Nb, Ta, Mo, W, Re, Ru, and Rh.

X2 is at least one type of element selected from the group consisting of O, S, Se, N, Cl, Br, and I. The molar ratio x satisfies $1 \leq x \leq 2$.

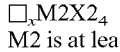$□_xM2X2_4$

M2 is at least one type of element selected from the group consisting of Ti, Ge, Sn, V, Cr, Mn, Fe, Co, Ni, Nb, Ta, Mo, W, Re, Ru, and Rh.

X2 is at least one type of element selected from the group consisting of O, S, Se, N, Cl, Br, and I. The molar ratio x satisfies $1 \leq x \leq 2$.

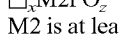$□_xM2PO_z$

M2 is at least one type of element selected from the group consisting of Ti, Ge, Sn, V, Cr, Mn, Fe, Co, Ni, Nb, Ta, Mo, W, Re, Ru, and Rh.

P is the element phosphorus, and O is the element oxygen. The molar ratio x satisfies $0.3 \leq x \leq 3$ and $4 \leq z \leq 6$.

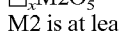$□_xM2O_5$

M2 is at least one type of element selected from the group consisting of V, Cr, Mn, Fe, Co, Ni, Nb, Ta, Mo, W, Re, Ru, and Rh.

O is the element oxygen. The molar ratio x satisfies $0.3 \leq x \leq 2$.

It is favorable that the second compound has a structure including at least one selected from the group consisting of hollandite structure, ramsdellite structure, anatase structure, brookite structure, pyrolusite structure, $ReO_3$ structure, $MoO_{1.5}PO_4$ structure, $TiO_{0.5}PO_4$ structure, $FePO_4$ structure, $\beta MnO_2$ structure, $\gamma MnO_2$ structure, $\lambda MnO_2$ structure, spinel structure, and ilmenite structure. In particular, it is most desirable to have the same ilmenite structure as that of the first compound.

The Fermi level of the electrons of the first layer 12A is made lower than the Fermi level of the electrons of the second layer 12B. This is one condition desirable to provide the recording layer 12 with reversible states. All of the Fermi levels herein are taken as values measured from the vacuum level.

By using combinations of such materials in the recording layer and enabling the easy transfer of ions between the first layer 12A and the second layer 12B, the power consumption necessary for the resistance change can be reduced and the thermal stability can be increased. Also, by using a combination of such materials in the recording layer, a recording density on the order of Pbpsi (peta bit per square inch) in principle can be realized, and further, a power consumption reduction can be achieved.

In the recording unit illustrated in FIG. 2, the small white circles with thick lines in the first compound 12A represent M1 ions (e.g., main body ions); the small white circles in the first compound 12A represent the A ions (e.g., diffusion ions); and the black circles in the second compound 12B represent M2 ions (e.g., transition element ions). The large white circles represent X1 ions (e.g., anions) in the first compound 12A and X2 ions (e.g., anions) in the second compound 12B.

Figure 3:
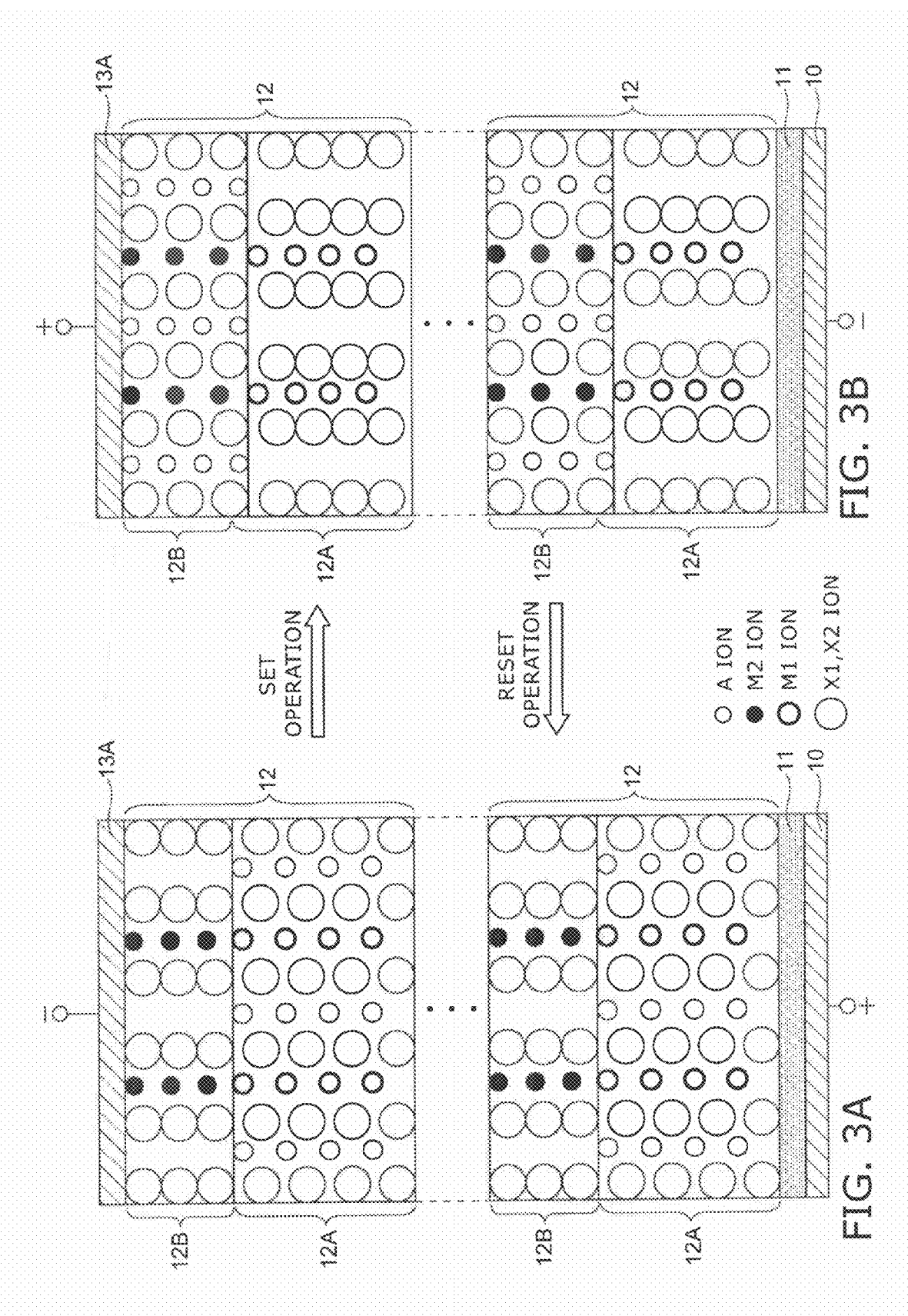
FIGS. 3A and 3B are schematic views illustrating specific examples of the first and second layers 12A and 12B forming the recording layer 12 alternately stacked in multiple layers.

As illustrated in FIG. 3, the first and second layers 12A and 12B forming the recording layer 12 may be alternately stacked in multiple layers of two or more layers, respectively.

In such a recording unit, in the case where a potential is applied to the electrode layers 11 and 13A such that the first layer 12A becomes the anode side and the second layer 12B becomes the cathode side and a potential gradient is produced in the recording layer 12, some of the A ions in the first layer 12A including the first compound move in the crystal and enter into the second layer 12B of the cathode side.

Because vacant sites of the A ions exist in the crystal of the second layer 12B, the A ions moving from the first layer 12A including the first compound are contained in the vacant sites.

Accordingly, in the second layer 12B, the valence of the A ions or some of the M2 ions decreases; and in the first layer 12A, the valence of the A ions or the M1 ions increases. Accordingly, it is necessary that at least one selected from the A ion and the M1 ion is a transition element having a d orbit incompletely filled by electrons such that the valence thereof can be easily changed.

That is, assuming that the first and second layers 12A and 12B are in a high resistance state (insulator) in the initial state (the reset state), some of the A ions in the first layer 12A moving into the second layer 12B produce conduction carriers in the crystals of the first and second layers 12A and 12B, and both become electrically conductive.

Thus, the electrical resistance value of the recording layer 12 is reduced by applying a current/voltage pulse to the recording layer 12, and therefore the set operation (the recording) is realized.

At this time, although electrons also move simultaneously from the first layer 12A toward the second layer 12B, the Fermi level of the electrons of the second layer 12B is higher than the Fermi level of the electrons of the first layer 12A; and therefore, the total energy of the recording layer 12 increases.

Because such a high energy state continues even after the set operation is completed, there is a possibility that the recording layer 12 may undesirably naturally return from the set state (the low resistance state) to the reset state (the high resistance state).

However, if the recording layer 12 according to the example of this embodiment is used, such a risk is avoided. In other words, the set state can be continuously maintained.

This is because a so-called ion movement resistance is acting. As described above, it is favorable for the information recording and reproducing apparatus that the coordination number of the A ions is low (ideally not more than two) or the valence thereof is bivalent.

However, because an oxidizing agent is created on the anode side after the set operation is completed, in such a case as well, it is desirable to use a material as the electrode layer 11 that does not easily oxidize and does not conduct ions (e.g., an electrically conductive oxide). Favorable examples thereof are described above.

To perform the reset operation (the erasing), it is sufficient to heat the recording layer 12 and facilitate the phenomenon of the A ions stored in the vacant sites of the first layer 12B described above going back into the first layer 12A.

Specifically, the recording layer 12 can be easily returned to the original high resistance state (insulator) by utilizing the Joule heat produced by applying a large current pulse to the recording layer 12 and the residual heat thereof.

Thus, the reset operation (the erasing) is realized because the electrical resistance value of the recording layer 12 is increased by applying the large current pulse to the recording layer 12. Alternatively, the reset operation is possible also by applying an electric field having an orientation reversed from that during the setting.

Here, to realize low power consumption, it is important to use a structure in which the ion radius of the A ions are optimized and movement paths exist such that the A ions move in the crystal without causing crystal destruction.

Using the materials and the crystalline structures such as those described above as the second compound 12B makes it possible to satisfy such conditions and is effective to realize low power consumption.

The A ions can easily move in a compound of any of the spinel structure represented by $A_xM_yX_4$ ($0.5 \leq x \leq 2.2$ and $1.5 \leq y \leq 2$), the delafossite structure represented by $A_xM_yX_2$ ($0.1 \leq x \leq 1.1$ and $0.9 \leq y \leq 1.1$), the wolframite structure represented by $A_xM_yX_4$ ($0.5 \leq x \leq 1.1$ and $0.7 \leq y \leq 1.1$), or the ilmenite structure represented by $A_xM_yX_3$ ($0.5 \leq x \leq 1.1$ and $0.9 \leq y \leq 1$) having a structure such as that of the recording unit illustrated in FIG. 1; and therefore, such a compound is favorable to use as the first compound.

In particular, the case where the first compound 12A is oriented such that the movement paths are disposed in the direction linking between the electrodes is favorable because the A ions easily move in the first compound 12A. Further, the case where the lattice constant of the first compound 12A matches the lattice constant of the second compound 12B is favorable because vacant sites exist and it is possible to easily control the orientation and perform film formation even in the case where a material which is difficult to form in a film is used.

Considering the movement of the A ions in the compound, the ease of film formation, etc., it is favorable to use a spinel structure, a hollandite structure, a ramsdellite structure, and the like having its composition ratio adjusted such that many vacant sites of the A ions are included as the second compound 12B. Regarding the movement paths in these structures, that of the spinel structure points in the [110] direction, that of the hollandite structure points in the c axis direction, and that of the ramsdellite structure points in the c axis direction. From the calculation results illustrated in FIG. 33, in the case where the spinel structure, the delafossite structure, the wolframite structure, or the ilmenite structure is used as the first compound 12A, the following compositions and orientations are examples of second compounds, which can be used favorably.

The Case where the First Compound 12A is Spinel

The spinel structure is favorable in the second compound 12B. However, in the case where the first compound 12A is (110) oriented $AMn_2O_4$, the hollandite structure is favorable.

The Case where the First Compound 12A is Delafossite

The ramsdellite structure or the spinel structure is favorable in the second compound 12B.

The Case where the First Compound 12A is Wolframite

The ramsdellite structure, the hollandite structure, or the spinel structure is favorable in the second compound 12B.

The Case where the First Compound 12A is Ilmenite

The spinel structure is favorable in the second compound 12B.

Next, the favorable range of the film thickness of the second compound will be described.

To obtain the effects of A ion storage of the vacant sites, it is favorable that the film thickness of the second compound is a film thickness not less than 1 nm.

On the other hand, because the resistance change effect of the second compound is reduced when the number of vacant sites of the second compound is greater than the number of A ions in the first compound, it is favorable that the number of vacant sites in the second compound is the same or smaller than the number of A ions in the first compound in the same cross-sectional area.

Because the density of the A ions in the first compound and the density of the vacant sites in the second compound are substantially the same, it is favorable that the film thickness of the second compound is about the same or smaller than the film thickness of the first compound.

On the cathode side, generally, a heater layer (a material having a resistivity of not less than about $10^{-5}$ $\Omega$cm) may be provided to further facilitate the reset operation.

In a probe memory, because a reducible material precipitates on the cathode side, it is favorable to provide a surface protective layer to prevent reactions with ambient air.

It is also possible to form the heater layer and the surface protective layer of one material having both functions. For example, amorphous carbon, diamond-like carbon, and semiconductors such as $SnO_2$ may simultaneously have a heater function and a surface protection function.

Reproduction can be easily performed by providing a current pulse to the recording layer 12 and detecting the resistance value of the recording layer 12.

However, it is necessary that the amplitude of the current pulse is a value small enough that a resistance change of the material forming the recording layer 12 does not occur.

For such a stacked recording layer as well, it is favorable to use an orientation control layer and orient the first compound in the desired direction such that the A ions move easily in the first compound. At this time, it is favorable that the film thickness of the first compound is, for example, not more than about 20 nm such that the effects of the orientation control layer act on the entire film thickness. It is more favorable to be 10 nm or less because the orientation control is easier. In the case where the orientation of the first compound is good, it is also possible to perform orientation control of the second compound.

Examples of information recording and reproducing apparatuses will now be described.

The three cases of the recording unit of the first and second embodiments being applied to a probe memory, a semiconductor memory, and a flash memory will now be described.

(Probe Memory)

Figure 4:
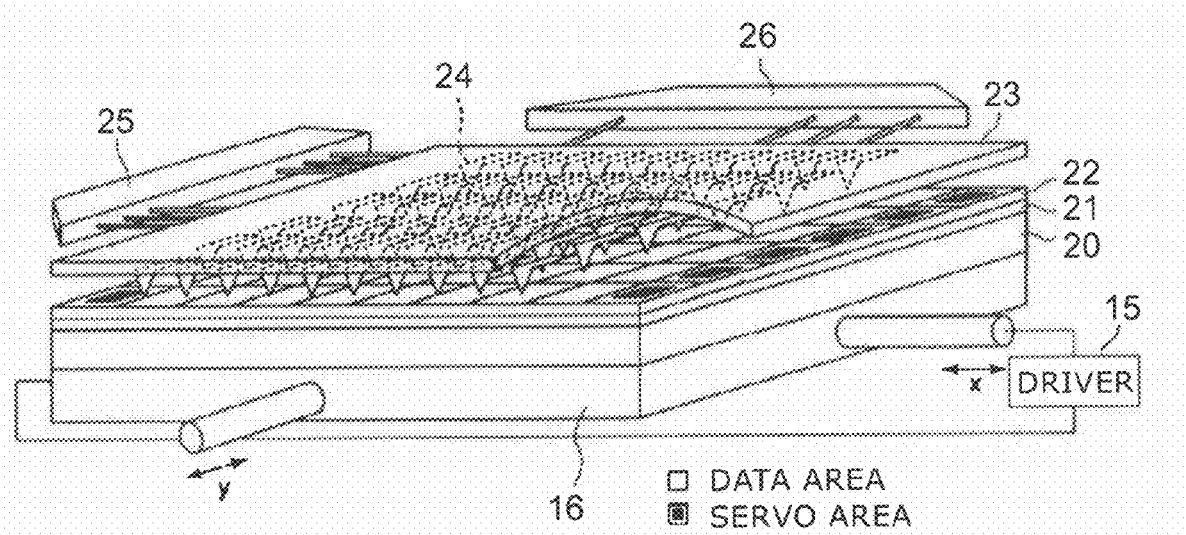
FIG. 4 is a schematic view illustrating a probe memory according to the embodiment of the invention.
Figure 5:
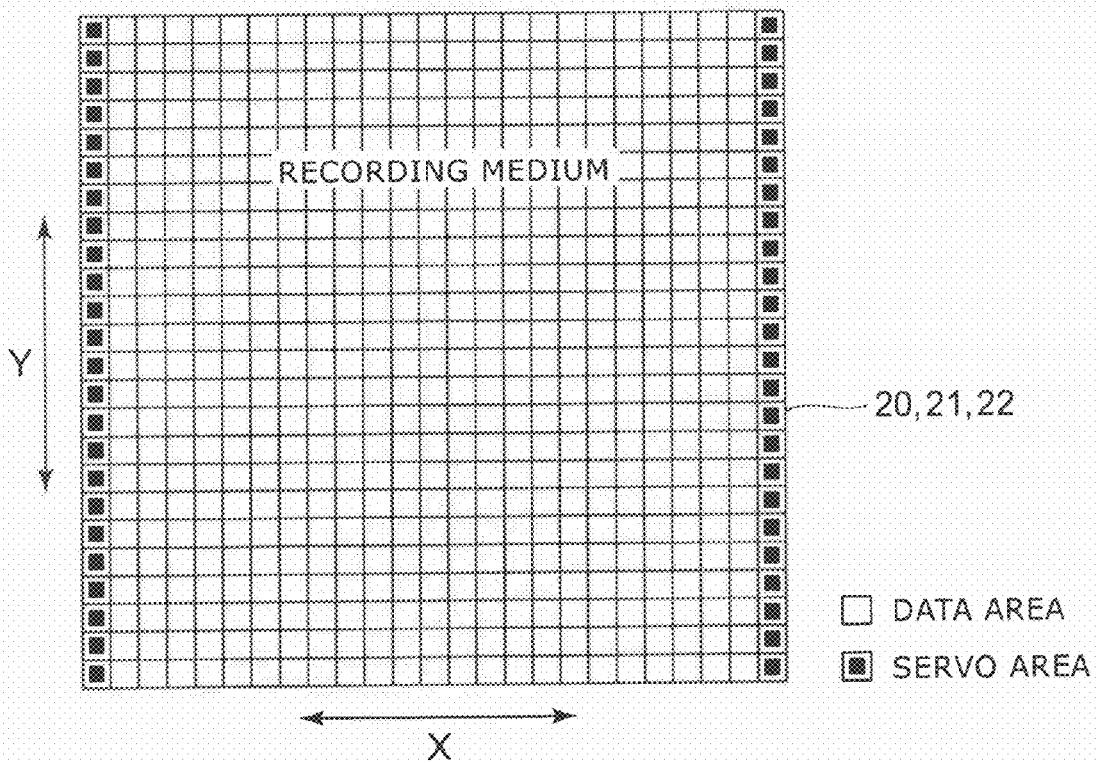
FIG. 5 is a schematic view illustrating a probe memory according to the embodiment of the invention.

FIG. 4 and FIG. 5 are schematic views illustrating a probe memory according to this embodiment.

A recording medium in which recording units of either the first or second embodiment are provided is disposed on an XY scanner 16. A probe array is disposed to oppose the recording medium.

The probe array includes a substrate 23 and multiple probes (heads) 24 disposed in an array configuration on one face side of the substrate 23. Each of the multiple probes 24, for example, is formed from a cantilever and driven by multiplex drivers 25 and 26.

Although it is possible to individually operate each of the multiple probes 24 using microactuators in the substrate 23, herein, an example is described where access of the data area of the recording medium is performed by collectively performing the same operation on all of the probes 24.

First, all of the probes 24 are operated back and forth in an X direction at a constant period using the multiplex drivers 25 and 26, and positional information of a Y direction is read from a servo area of the recording medium. The positional information of the Y direction is transferred to a driver 15.

The driver 15 drives the XY scanner 16 based on the positional information, moves the recording medium in the Y direction, and performs positional alignment between the recording medium and the probes.

When the positional alignment thereof is completed, data is read or written simultaneously and continuously for all of the probes 24 on the data area.

Data can be read and written continuously because the probes 24 operate back and forth in the X direction. The reading and writing of the data is implemented one row at a time for the data area by progressively changing the position of the recording medium in the Y direction.

The recording medium may be moved back and forth in the X direction at a constant period, positional information may be read from the recording medium, and the probes 24 may be moved in the Y direction.

The recording medium, for example, is formed from a substrate 20, an electrode layer 21 on the substrate 20, and a recording layer 22 on the electrode layer 21.

The recording layer 22 includes multiple data areas and servo areas disposed at both ends of the multiple data areas in the X direction. The multiple data areas make up the main components of the recording layer 22.

Servo burst signals are recorded in the servo areas. The servo burst signals indicate the positional information in the data areas in the Y direction.

Further, in addition to such information, an address area in which address data is recorded and a preamble area for synchronization are disposed in the recording layer 22.

The data and the servo burst signal are recorded in the recording layer 22 as recorded bits (electrical resistance fluctuation). "1" and "0" information of each recorded bit is read by detecting the electrical resistance of the recording layer 22.

In this example, one probe (head) is provided corresponding to one data area, and one probe is provided for one servo area.

The data area is formed from multiple tracks. The track of the data area is designated by an address signal read from the address area. The servo burst signal read from the servo area eliminates reading errors of the recorded bits by moving the probes 24 to the center of the track.

Here, it is possible to utilize head position control technology of HDDs by having the X direction correspond to the down-track direction and the Y direction correspond to the track direction.

Next, the recording/reproducing operation of a probe memory will be described.

Figure 6:
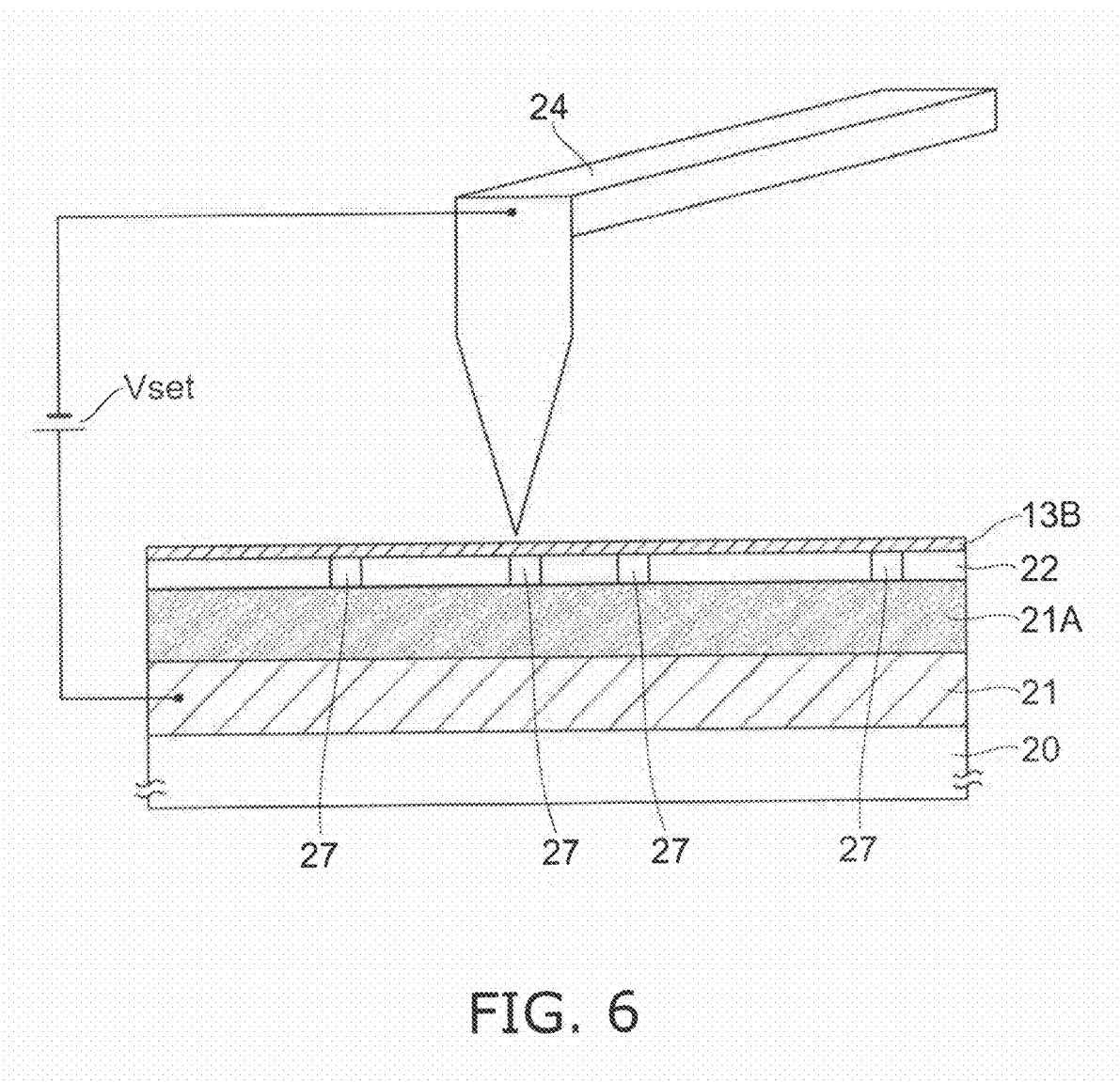
FIG. 6 is a conceptual view for describing the state during a recording (set operation).

FIG. 6 is a conceptual view for describing the state during a recording (set operation).

The recording medium is taken to be formed from the electrode layer 21 on the substrate (e.g., a semiconductor chip) 20, an orientation control layer 21A on the electrode layer 21, the recording layer 22 on the orientation control layer 21A, and a protective layer 13B on the recording layer 22. The protective layer 13B is formed, for example, from a thin insulator.

The recording operation is performed by applying a voltage to the surface of a recorded bit 27 of the recording layer 22 and producing a potential gradient in the interior of the recorded bit 27. Specifically, it is sufficient to provide a current/voltage pulse to the recorded bit 27.

The Case Where the Recording Unit of the First Embodiment is Used

The case where the recording unit of the first embodiment described above in regard to FIG. 1 is used will now be described.

Figure 7:
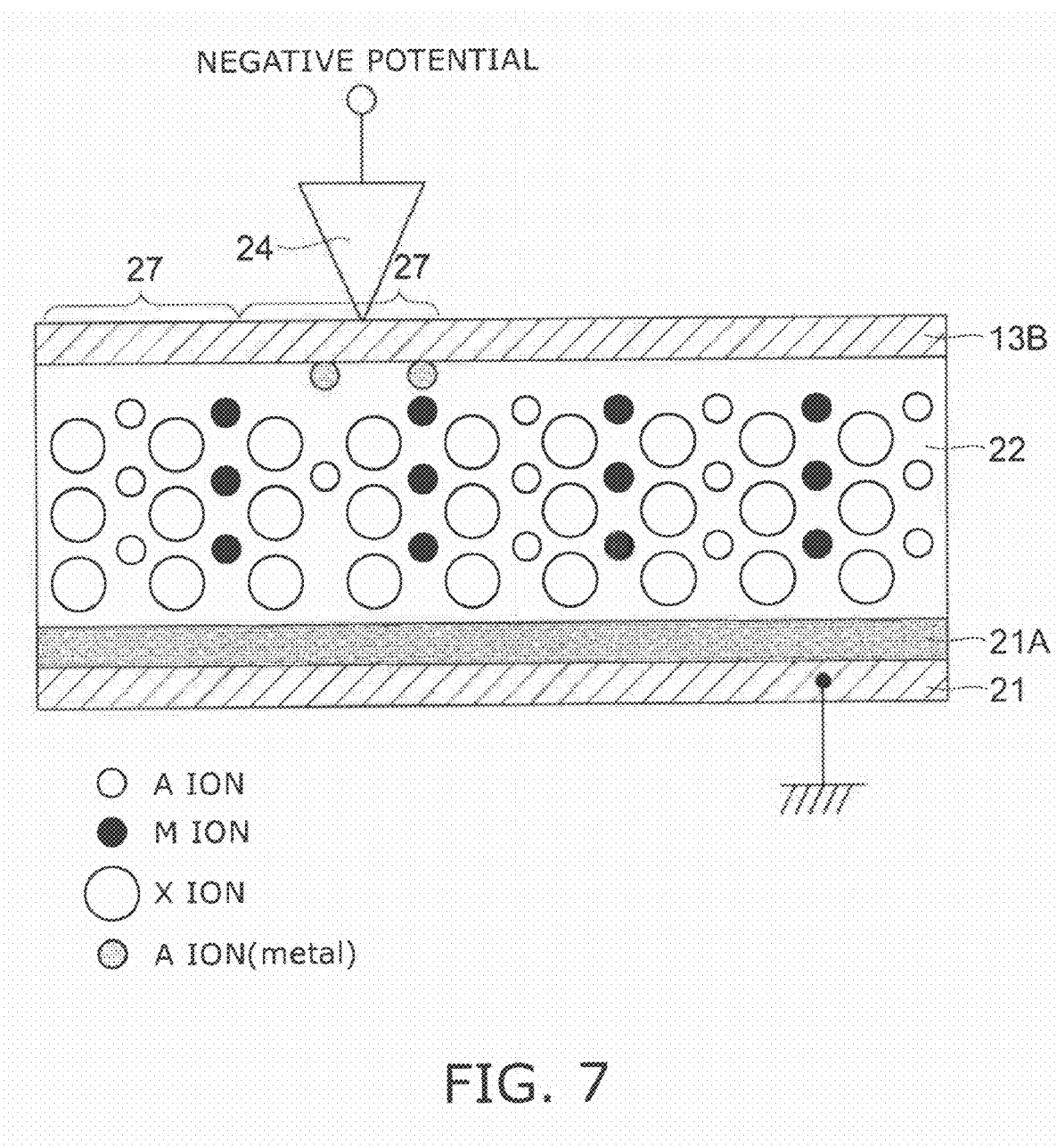
FIG. 7 is a schematic view illustrating a recording.

FIG. 7 is a schematic view illustrating a recording.

First, as illustrated in FIG. 7, a state is made in which the potential of the probes 24 is relatively lower than the potential of the electrode layer 21. In the case where a fixed potential (e.g., the grounding potential) is applied to the electrode layer 21, it is sufficient to apply a negative potential to the probe 24.

The current pulse is produced by, for example, using an electron source or a hot electron source and emitting electrons from the probe 24 toward the electrode layer 21. Alternatively, the voltage pulse may be applied by bringing the probe 24 into contact with the surface of the recorded bit 27.

At this time, for example, at the recorded bit 27 of the recording layer 22, some of the A ions move to the probe (the cathode) 24 side, and the A ions in the crystal decrease relatively with respect to the X ions. The A ions moving to the probe 24 side also receive electrons from the probe 24 and precipitate as a metal.

At the recorded bit 27, the X ions become excessive; and as a result, the valence of the A ions or the M ions in the recorded bit 27 increases. That is, because the recorded bit 27 conducts electrons due to the implantation of carriers by a phase change, the resistance in the film thickness direction decreases and the recording (the set operation) is completed.

The current pulse for recording also may be produced by making a state in which the potential of the probe 24 is relatively higher than the potential of the electrode layer 21.

Figure 8:
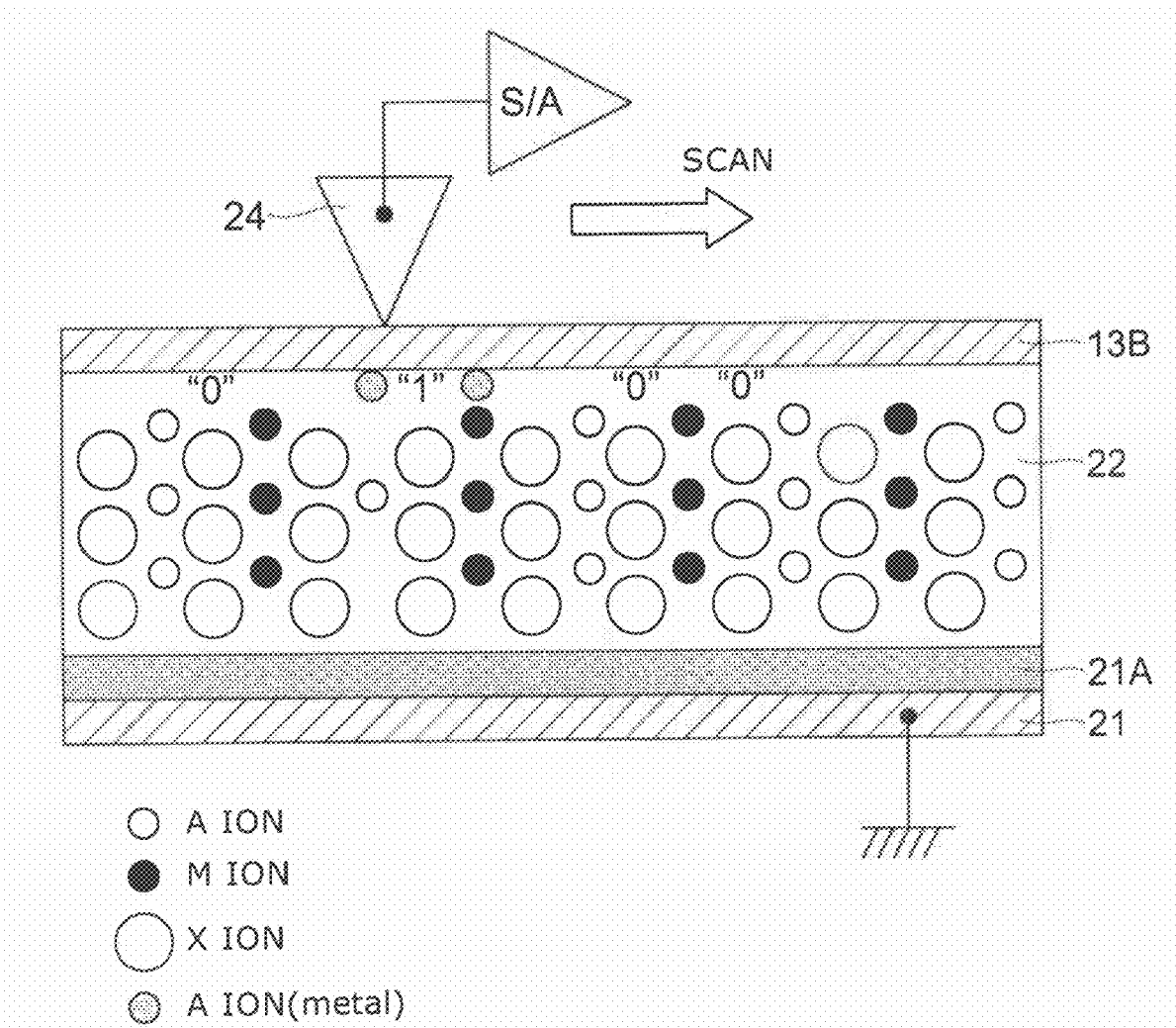
FIG. 8 is a schematic view illustrating reproduction.

FIG. 8 is a schematic view illustrating reproduction.

Reproduction is performed by providing a current pulse to the recorded bit 27 of the recording layer 22 and detecting the resistance value of the recorded bit 27. However, the current pulse is given a value small enough not to cause a resistance change in the material forming the recorded bit 27 of the recording layer 22.

For example, the reading current (the current pulse) produced by a sense amplifier S/A flows from the probe 24 to the recorded bit 27, and the resistance value of the recorded bit 27 is measured by the sense amplifier S/A.

By using the materials according to the first embodiment, a difference of the resistance values of the set/reset states of $10^3$ or more can be ensured.

The reproduction may be continuously performed by scanning with the probe 24 over the recording medium.

The erasing (the reset) operation may be performed by Joule heating the recorded bit 27 of the recording layer 22 by a large current pulse and facilitating the oxidation-reduction reaction of the recorded bit 27. Alternatively, a pulse providing a potential difference with an orientation reversed from that during the set operation may be applied.

The erasing operation can be performed for each of the recorded bits 27 or can be performed for multiple recorded bits 27 or by blocks.

The Case Where the Recording Unit of the Second Embodiment is Used

Next, the case where the recording unit of the second embodiment described above in regard to FIG. 2 is used will be described.

Figure 9:
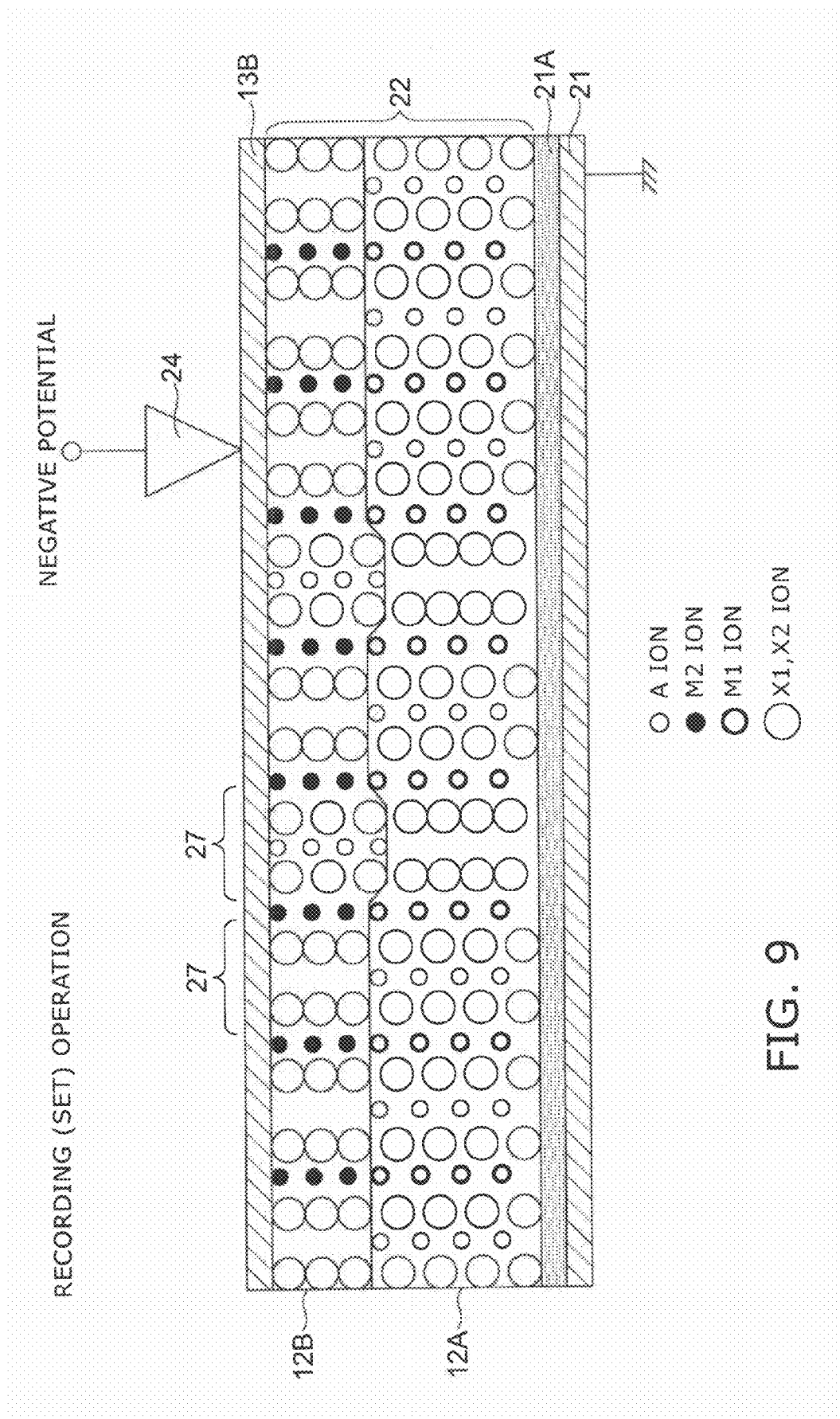
FIG. 9 is a schematic view illustrating a recording state.

FIG. 9 is a schematic view illustrating a recording state.

First, as illustrated in FIG. 9, the state is made in which the potential of the probe 24 is relatively lower than the potential of the electrode layer 21. In the case where a fixed potential (e.g., the grounding potential) is applied to the electrode layer 21, it is sufficient to apply a negative potential to the probe 24.

At this time, some of the A ions in the first layer (the anode side) 12A of the recording layer 22 move in the crystal and are contained in vacant sites of the second compound (the cathode side) 12B. It follows that the valence of the A ions or the M1 ions in the first layer 12A increases and the valence of the A ions or the M2 ions in the second compound 12B decreases. As a result, conduction carriers are produced in the crystals of the first and second layers 12A and 12B; and both become electrically conductive.

Thereby, the set operation (the recording) is completed.

Regarding the recording operation, by reversing the positional relationship of the first and second layers 12A and 12B, a state can be made in which the potential of the probe 24 is relatively lower than the potential of the electrode layer 21 to execute the set operation.

Figure 10:
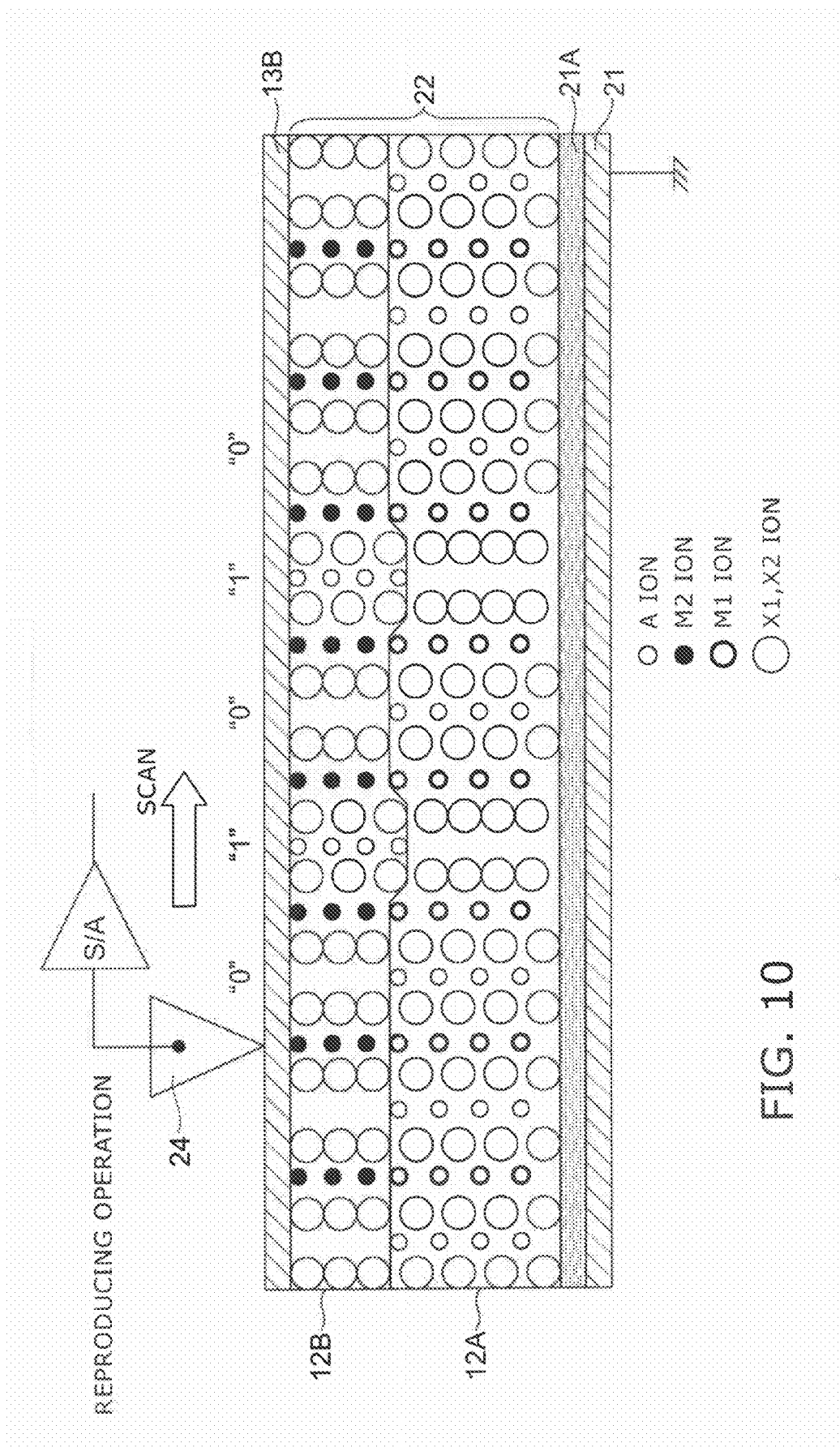
FIG. 10 is a schematic view illustrating the state during reproduction.

FIG. 10 is a schematic view illustrating the state during reproduction.

The reproducing operation is performed by providing a current pulse to the recorded bit 27 and detecting the resistance value of the recorded bit 27. However, the current pulse is given a value small enough not to cause a resistance change in the material forming the recorded bit 27.

For example, the read current (the current pulse) produced by the sense amplifier S/A flows from the probe 24 to the recording layer (the recorded bit) 22, and the resistance value of the recorded bit is measured by the sense amplifier S/A. By using the new materials described above, a difference of the resistance values of the set/reset states of $10^3$ or more can be ensured.

The reproducing operation can be performed continuously by scanning with the probe 24.

In the reset (the erasing) operation, it is sufficient to utilize the Joule heat produced by providing a large current pulse to the recording layer (the recorded bit) 22 and the residual heat thereof and facilitate the effect of the A ions tending to go back into the first layer 12A from the vacant sites in the second layer 12B. Alternatively, a pulse providing a potential difference having an orientation reversed from that during the set operation may be applied.

The erasing operation can be performed for each recorded bit 27 or can be performed for multiple recorded bits 27 or by blocks.

As described above, according to the probe memory of this embodiment, higher recording density and lower power consumption than conventional hard disk drives and flash memory can be realized.

(Semiconductor Memory)

Next, the information recording and reproducing apparatus in combination with a semiconductor device will be described.

Figure 11:
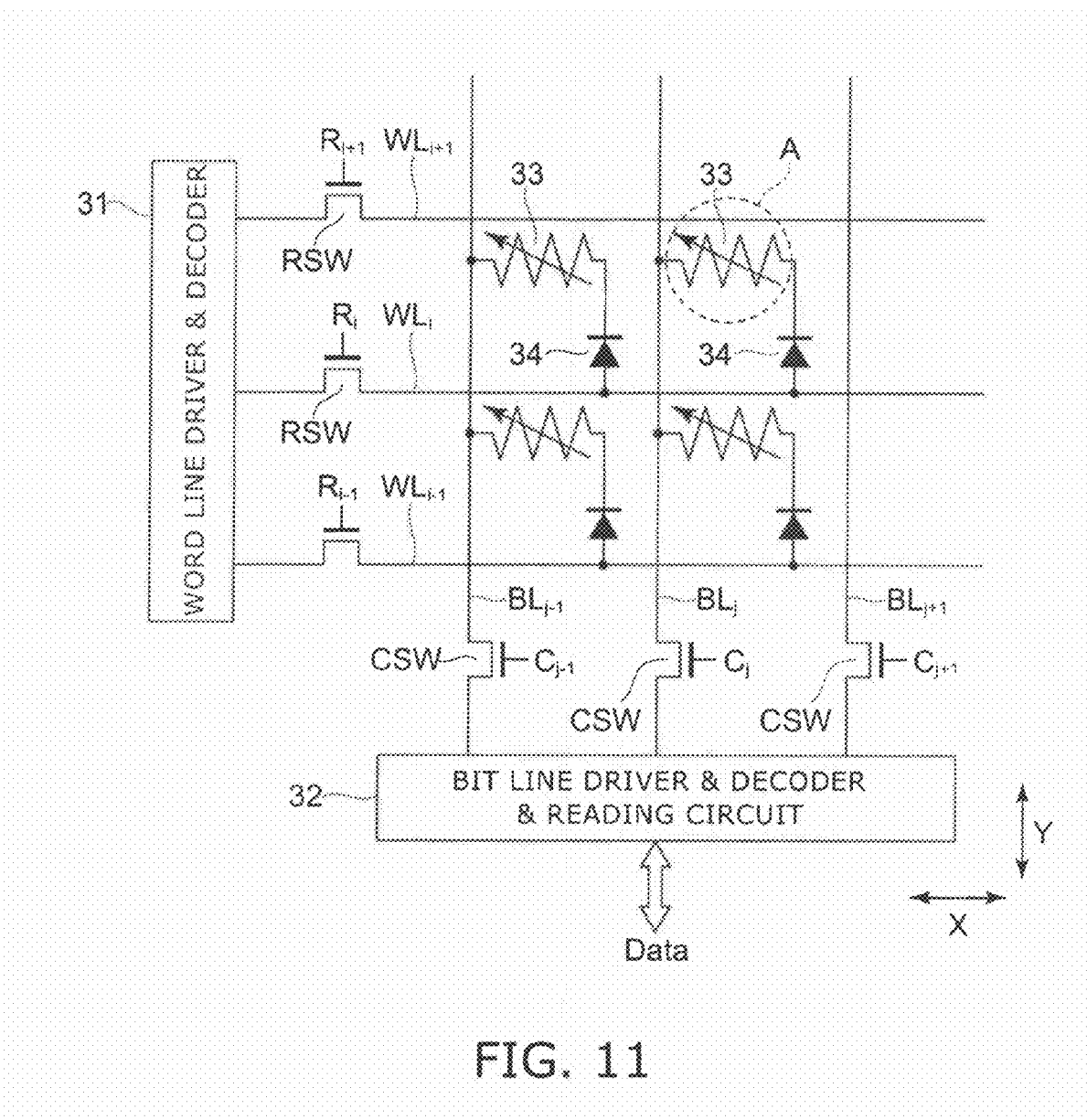
FIG. 11 is a schematic view illustrating a cross-point semiconductor memory including the recording layer from either the first or second embodiment.

FIG. 11 is a schematic view illustrating a cross-point semiconductor memory including the recording layer from either the first or second embodiment.

Word lines WLi−1, WLi, and WLi+1 align in the X direction; and bit lines BLj−1, BLj, and BLj+1 align in the Y direction.

One end of the word lines WLi−1, WLi, and WLi+1 is connected to a word line driver & decoder 31 through a MOS transistor RSW as a selection switch; and one end of the bit lines BLj−1, BLj, and BLj+1 is connected to a bit line driver & decoder & reading circuit 32 through a MOS transistor CSW as a selection switch.

Selection signals Ri−1, Ri, and Ri+1 are input to the gate of the MOS transistor RSW to select one word line (row); and selection signals Ci−1, Ci, and Ci+1 are input to the gate of the MOS transistor CSW to select one bit line (column).

Memory cells 33 are disposed at the intersections between the word lines WLi−1, WLi, and WLi+1 and the bit lines BLj−1, BLj, and BLj+1. The structure is a so-called cross-point cell array structure.

Diodes 34 are added to the memory cells 33 to prevent sneak current during the recording/reproducing. Also, an orientation control layer 34A is provided between the recording layer 22 and the diode 34.

Figure 12:
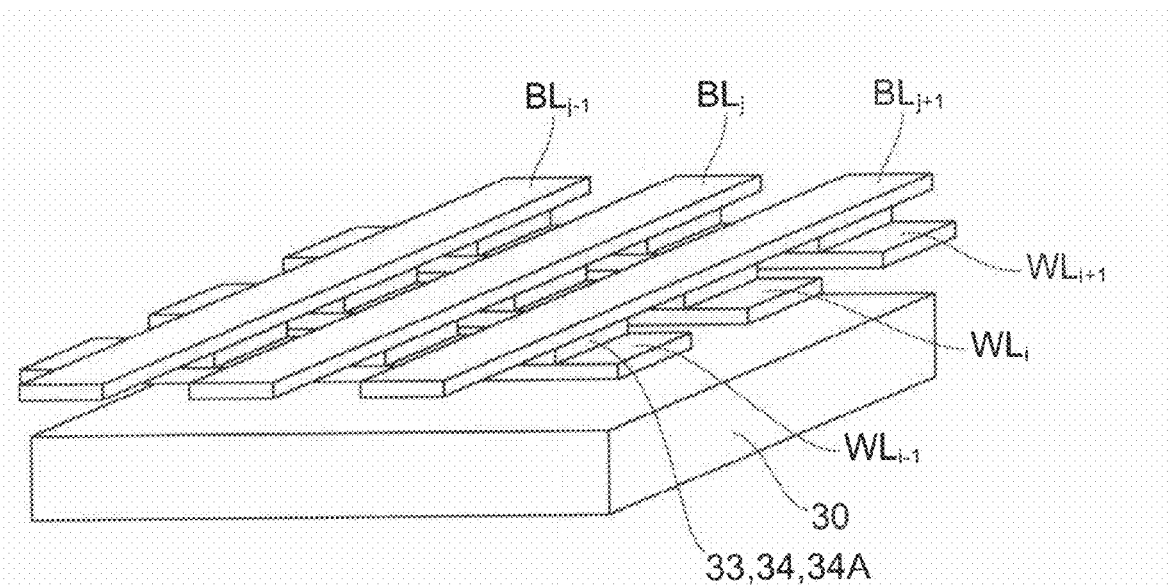
FIG. 12 is a schematic view illustrating the structure of the memory cell array unit of the semiconductor memory of FIG. 11.

FIG. 12 is a schematic view illustrating the structure of the memory cell array unit of the semiconductor memory of FIG. 11.

The word lines WLi−1, WLi, and WLi+1 and the bit lines BLj−1, BLj, and BLj+1 are disposed on a semiconductor chip 30; and the memory cells 33, the diodes 34, and the orientation control layers 34A are disposed at the intersections of these interconnects.

The merit of such a cross-point cell array structure is in the advantageous point of high integration because it is not necessary to connect MOS transistors individually to the memory cells 33. For example, as illustrated in FIG. 14 and FIG. 15, it is also possible to stack the memory cells 33 to form memory cell arrays in a three-dimensional structure.

Figure 13:
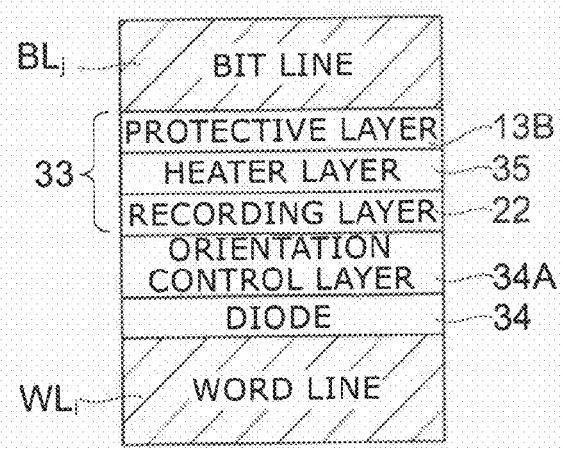
FIG. 13 is a schematic view illustrating the structure of the memory cell 33.

The memory cell 33 including the recording layer of either the first or second embodiment is formed from, for example, a stacked structure of the recording layer 22, the protective layer 13B, and a heater layer 35 as illustrated in FIG. 13. One memory cell 33 stores one bit of data. The diode 34 and the orientation control layer 34A are disposed between the word line WLi and the memory cell 33.

Figure 14:
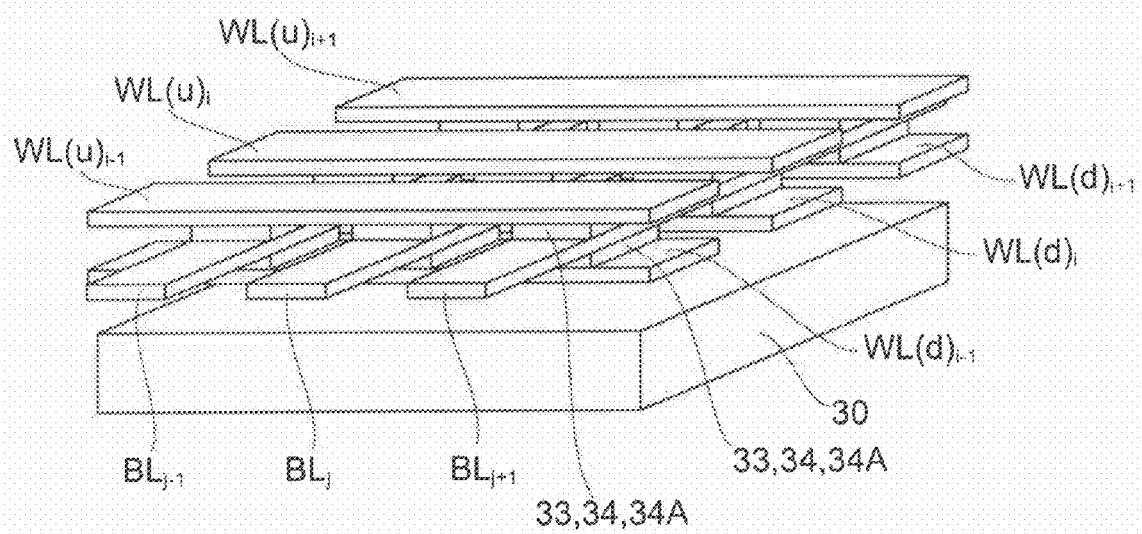
FIG. 14 is a schematic view illustrating another specific example of memory cell arrays.
Figure 15:
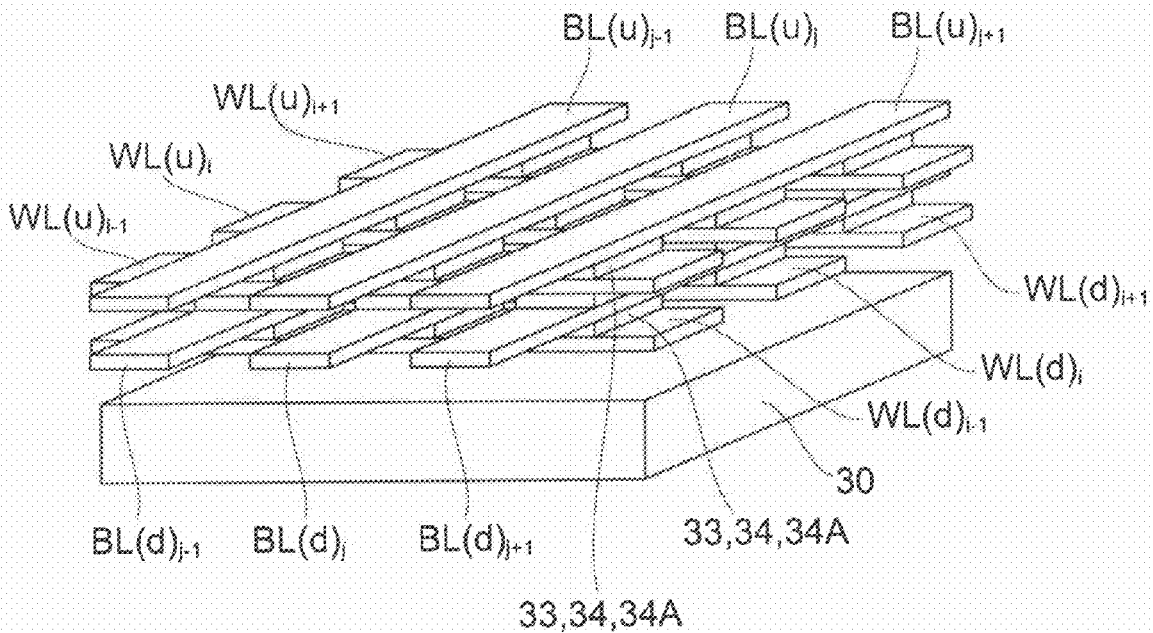
FIG. 15 is a schematic view illustrating another specific example of memory cell arrays.

FIG. 14 and FIG. 15 are schematic views illustrating other specific examples of memory cell arrays.

In the specific example illustrated in FIG. 14, the word lines WLi−1, WLi, and WLi+1 aligned in the X direction are provided above and below the bit lines BLj−1, BLj, and BLj+1 aligned in the Y direction, respectively. The memory cells 33 and 34 and the orientation control layers 34A are disposed at each of the cross points of the bit lines and the word lines. That is, the structure has bit lines shared by the memory cells thereabove and therebelow.

The specific example illustrated in FIG. 15 has a structure in which the bit lines BLj−1, BLj, and BLj+1 aligned in the Y direction and the word lines WLi−1, WLi, and WLi+1 aligned in the X direction are alternately stacked. The memory cells 33 and 34 and the orientation control layers 34A are disposed at each of the cross points of the bit lines and the word lines. That is, the structure has the bit lines and the word lines shared by the memory cells thereabove and therebelow.

By using stacked structures such as those illustrated in FIG. 14 and FIG. 15, it is possible to increase the recording density.

Next, the recording/reproducing operation of the semiconductor memory using the recording layers of the first and second embodiments will be described with reference to FIG. 11 to FIG. 13.

Here, the case will be described where the memory cell 33 enclosed by the dotted line A in FIG. 11 is selected and a recording/reproducing operation thereof is executed.

The Case Where the Recording Layer of the First Embodiment is Used

In the recording (the set operation), it is sufficient to apply a voltage to the selected memory cell 33, produce a potential gradient in the memory cell 33, and provide a current pulse; and therefore, a state is made, for example, in which the potential of the word line WLi is relatively lower than the potential of the bit line BLj. In the case where a fixed potential (e.g., the grounding potential) is applied to the bit line BLj, it is sufficient to apply a negative potential to the word line WLi.

At this time, in the selected memory cell 33 enclosed by the dotted line A, some of the A ions move to the word line (cathode) WLi side, and the A ions in the crystal decrease relatively with respect to the X ions. The A ions moving to the word line WLi side receive electrons from the word line WLi and precipitate as a metal.

In the selected memory cell 33 enclosed by the dotted line A, the X ions become excessive and as a result, the valence of the A ions or the M ions in the crystal increases. That is, the selected memory cell 33 enclosed by the dotted line A conducts electrons due to the implantation of carriers by the phase change; and therefore, the recording (the set operation) is completed.

During the recording, it is desirable to bias all of the unselected word lines WLi−1 and WLi+1 and the unselected bit lines BLj−1 and BLj+1 with the same potential.

During a standby prior to recording, it is desirable to precharge all of the word lines WLi−1, WLi, and WLi+1 and all of the bit lines BLj−1, BLj, and BLj+1.

The current pulse for the recording may be produced by making a state in which the potential of the word line WLi is relatively higher than the potential of the bit line BLj.

The reproduction is performed by providing the current pulse to the selected memory cell 33 enclosed by the dotted line A and detecting the resistance value of the memory cell 33. However, it is necessary that the current pulse is given a value small enough not to cause a resistance change of the material forming the memory cells 33.

For example, the reading current (the current pulse) produced by the reading circuit flows from the bit line BLj to the memory cell 33 enclosed by the dotted line A, and the resistance value of the memory cell 33 is measured by the reading circuit. By using the new materials described above, a difference of the resistance values of the set/reset states of $10^3$ or more can be ensured.

The erasing (the reset) operation is performed by Joule heating of the selected memory cell 33 enclosed by the dotted line A by a large current pulse and facilitating the oxidation-reduction reaction in the memory cell 33.

The Case Where the Recording Layer of the Second Embodiment is Used

In the recording operation (the set operation), it is sufficient to apply a voltage to the selected memory cell 33, produce a potential gradient in the memory cell 33, and provide a current pulse; and therefore, the potential of the word line WLi, for example, is made relatively lower than the potential of the bit line BLj. In the case where a fixed potential (e.g., the grounding potential) is applied to the bit line BLj, it is sufficient to apply a negative potential to the word line WLi.

At this time, in the selected memory cell 33 enclosed by the dotted line A, some of the A ions in the first compound move into the vacant sites of the second compound. Therefore, the valence of the A ions or the M2 ions in the second compound decreases, and the valence of the A ions or the M1 ions in the first compound increases. As a result, conduction carriers are produced in the crystals of the first and second compounds; and both become electrically conductive.

Thereby, the set operation (the recording) is completed.

During the recording, it is desirable to bias all of the unselected word lines WLi−1 and WLi+1 and the unselected bit lines BLj−1 and BLj+1 to the same potential.

During the standby prior to the recording, it is desirable to pre-charge all of the word lines WLi−1, WLi, and WLi+1 and all of the bit lines BLj−1, BLj, and BLj+1.

The current pulse may be produced by making a state in which the potential of the word line WLi is relatively higher than the potential of the bit line BLj.

The reproducing operation is performed by providing a current pulse to the selected memory cell 33 enclosed by the dotted line A and detecting the resistance value of the memory cell 33. However, it is necessary that the current pulse has a value small enough not to cause a resistance change of the material forming the memory cell 33.

For example, the reading current (the current pulse) produced by the reading circuit flows from the bit line BLj to the memory cell 33 enclosed by the dotted line A, and the resistance value of the memory cell 33 is measured by the reading circuit. By using the new materials described above, a difference of the resistance values of the set/reset states of $10^3$ or more can be ensured.

In the reset (the erasing) operation, it is sufficient to utilize the Joule heat produced by providing the large current pulse to the selected memory cell 33 enclosed by the dotted line A and the residual heat thereof and facilitate the effect of the A ion element tending to go back into the first compound from the vacant sites in the second compound.

As described above, according to the semiconductor memory of this embodiment, a higher recording density and lower power consumption than conventional hard disk drives and flash memory can be realized.

(Flash Memory)

It is possible to apply this embodiment also to flash memory.

FIG. 16 is a schematic cross-sectional view illustrating a memory cell of flash memory.

The memory cell of the flash memory is formed from a MIS (metal-insulator-semiconductor) transistor.

Diffusion layers 42 are formed in a surface region of a semiconductor substrate 41. A gate insulation layer 43 is formed on the channel region between the diffusion layers 42. An orientation control layer 43A and a recording layer (RRAM: Resistive RAM) 44 including the recording layer of either the first or second embodiment are formed on the gate insulation layer 43. A control gate electrode 45 is formed on the recording layer 44.

The semiconductor substrate 41 may be a well region, and the semiconductor substrate 41 and the diffusion layer 42 may have mutually opposite conductivity types. The control gate electrode 45 forms a word line and may be formed from, for example, conductive polysilicon.

The recording layer 44 may be formed of the material forming the recording layer 12 described above in regard to the first and second embodiments.

The basic operation thereof will now be described with reference to FIG. 16.

The set (the writing) operation is executed by applying a potential V1 to the control gate electrode 45 and applying a potential V2 to the semiconductor substrate 41.

Although it is necessary that the difference between the potentials V1 and V2 is sufficiently great enough that the recording layer 44 undergoes a phase change or a resistance change, there are no particular limitations on the orientation thereof.

In other words, it is sufficient that either V1>V2 or V1<V2.

For example, assuming that the recording layer 44 is an insulator (large resistance) in the initial state (the reset state), the gate insulation layer 43 substantially has a greater thickness, and therefore the threshold of the memory cell (the MIS transistor) increases.

From such a state, by applying the potentials V1 and V2 and changing the recording layer 44 to a conductor (small resistance), the gate insulation layer 43 substantially has a smaller thickness, and therefore the threshold of the memory cell (the MIS transistor) decreases.

Although the potential V2 is applied to the semiconductor substrate 41, the potential V2 may be transferred from the diffusion layers 42 to the channel region of the memory cell instead.

The reset (the erasing) operation is executed by applying a potential V1' to the control gate electrode 45, applying a potential V3 to one of the diffusion layers 42, and applying the potential V4 (<V3) to the other diffusion layer 42.

The potential V1' is given a value greater than the threshold of the memory cell in the set state.

At this time, the memory cell is switched ON, electrons flow from the other diffusion layer 42 toward the one diffusion layer 42, and hot electrons are produced. Because the hot electrons are implanted into the recording layer 44 via the gate insulation layer 43, the temperature of the recording layer 44 increases.

Thereby, the recording layer 44 changes from a conductor (small resistance) to an insulator (large resistance); and therefore, the gate insulation layer 43 substantially has a greater thickness, and the threshold of the memory cell (the MIS transistor) increases.

Thus, because the threshold of the memory cell can be changed by a principle similar to flash memory, flash memory technology is utilized and the information recording and reproducing apparatus according to the example of this embodiment can be practically used.

(NAND Flash Memory)

Figure 17:
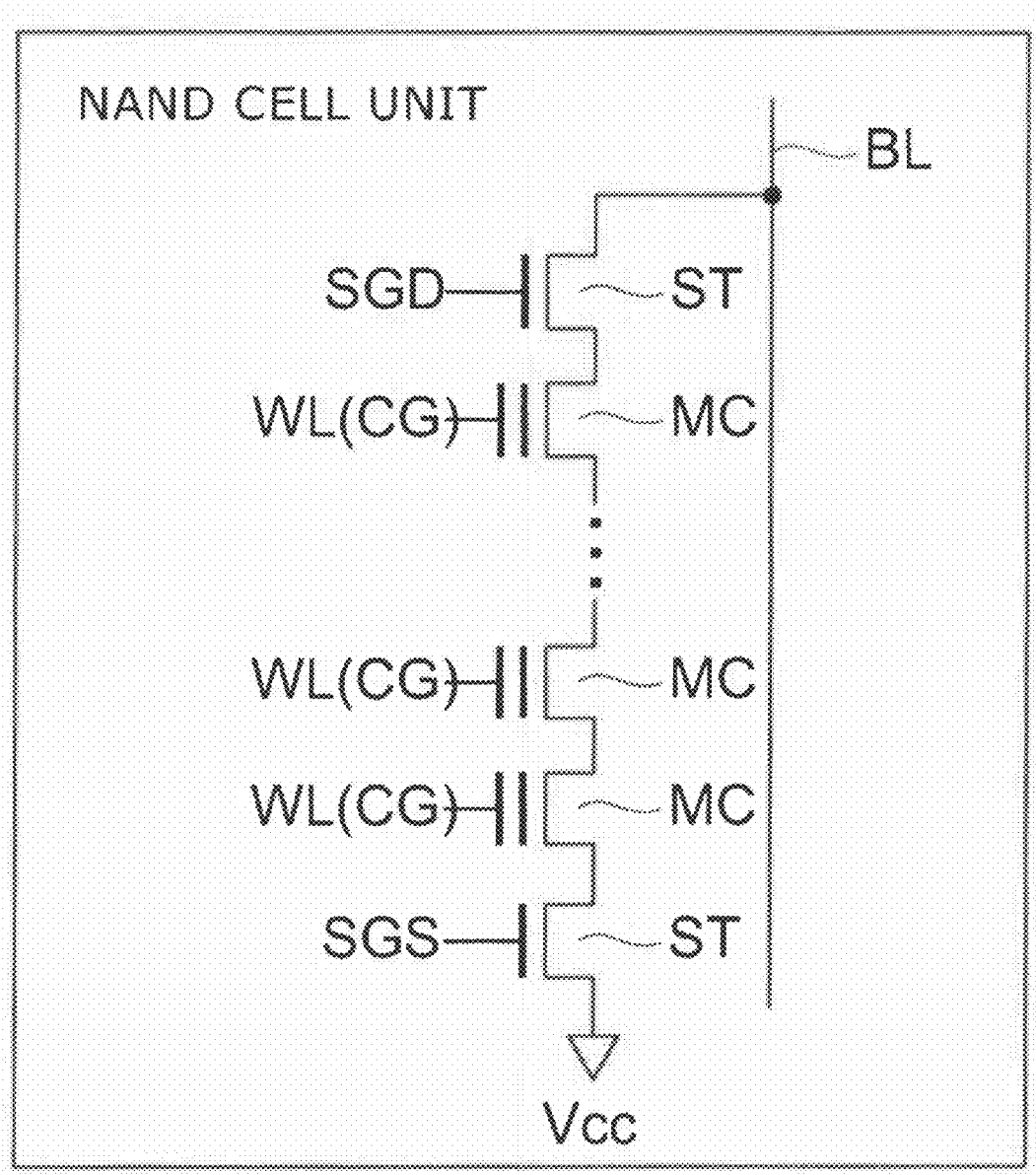
FIG. 17 is a circuit diagram of a NAND cell unit.

FIG. 17 is a circuit diagram of a NAND cell unit.

Figure 18:
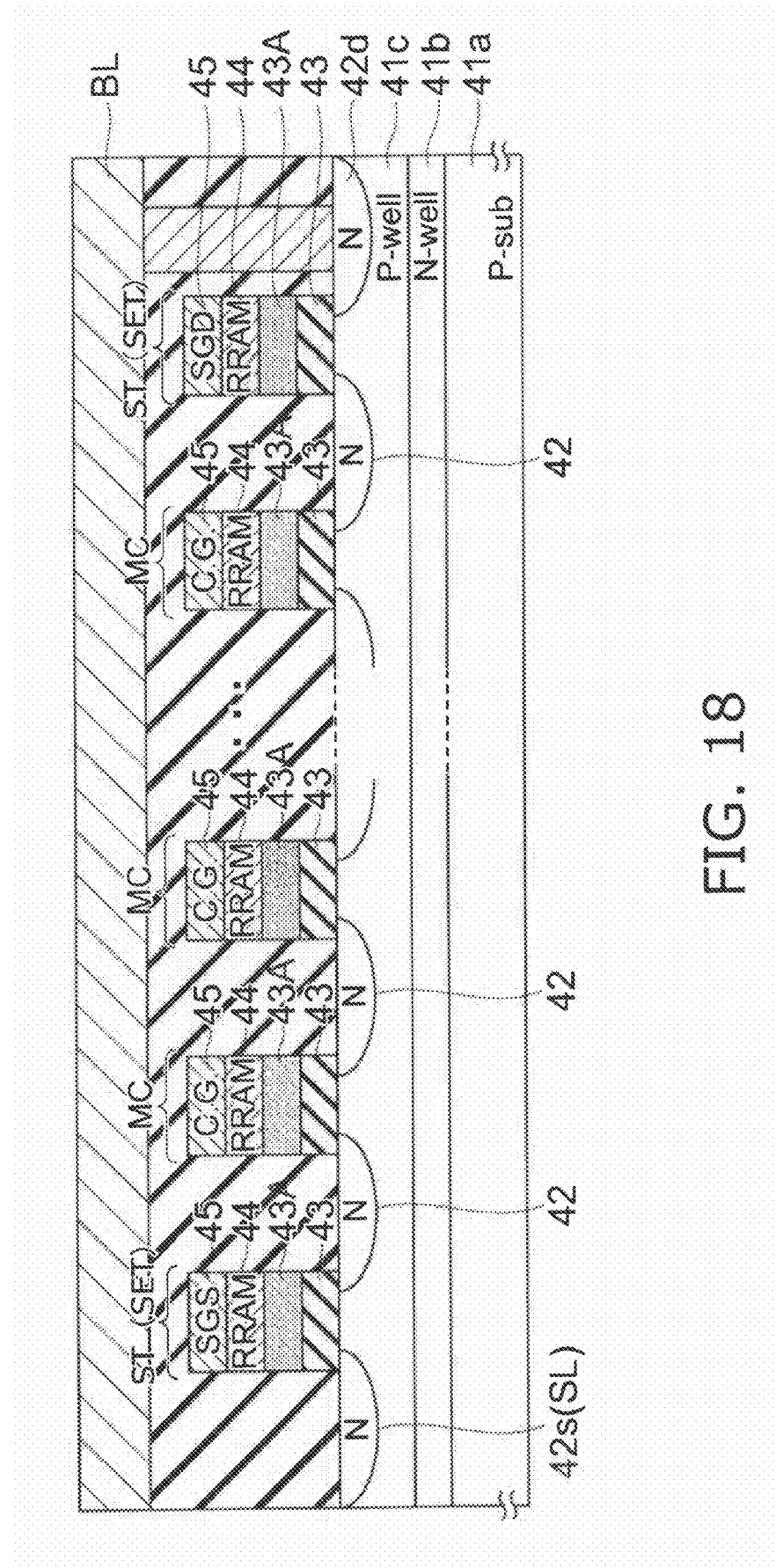
FIG. 18 is a schematic view illustrating the structure of the NAND cell unit according to the embodiment of the invention.

FIG. 18 is a schematic view illustrating the structure of the NAND cell unit according to this embodiment.

An N-type well region 41b and a P-type well region 41c are formed in a P-type semiconductor substrate 41a. The NAND cell unit according to the example of this embodiment is formed in the P-type well region 41c.

The NAND cell unit is formed from a NAND string made of multiple memory cells MC connected in series and a total of two select gate transistors ST with one connected to each end thereof.

The memory cells MC and the select gate transistors ST have the same structure. Specifically, the structure is formed from N-type diffusion layers 42, the gate insulation layer 43 on the channel region between the N-type diffusion layers 42, the orientation control layer 43A on the gate insulation layer 43, the recording layer (RRAM) 44 on the orientation control layer 43A, and the control gate electrode 45 on the recording layer 44.

It is possible to change the state (insulator/conductor) of the recording layer 44 of the memory cell MC by the basic operations described above. On the other hand, the recording layer 44 of the select gate transistor ST is fixed in the set state, that is, as a conductor (small resistance).

One of the select gate transistors ST is connected to a source line SL, and the other one is connected to a bit line BL.

It is taken that all of the memory cells in the NAND cell unit are in the reset state (large resistance) prior to the set (the writing) operation.

The set (the writing) operation is performed from the memory cell MC on the source line SL side one at a time in turn toward the memory cell on the bit line BL side.

V1 (a positive potential) is applied to the selected word line (the control gate electrode) WL as a writing potential; and Vpass is applied to the unselected word lines WL as a transfer potential (a potential to switch the memory cell MC ON).

The select gate transistor ST on the source line SL side is switched OFF, the select gate transistor ST on the bit line BL side is switched ON, and program data is transferred from the bit line BL to the selected memory cell MC channel region.

For example, when the program data is a "1," a write-protect potential (e.g., a potential about the same as V1) is transferred to the channel region of the selected memory cell MC, and the resistance value of the recording layer 44 of the selected memory cell MC is prevented from changing from the high state to the low state.

When the program data is a "0," V2 (<V1) is transferred to the channel region of the selected memory cell MC, and the resistance value of the recording layer 44 of the selected memory cell MC is changed from the high state to the low state.

In the reset (the erasing) operation, for example, V1' is applied to all of the word lines (the control gate electrodes) WL, and all of the memory cells MC in the NAND cell unit are switched ON. Then, the two select gate transistors ST are switched ON, V3 is applied to the bit line BL, and V4 (<V3) is applied to the source line SL.

At this time, because hot electrons are implanted into the recording layers 44 of all of the memory cells MC in the NAND cell unit, the reset operation is collectively executed for all of the memory cells MC in the NAND cell unit.

In the reading operation, the reading potential (the positive potential) is applied to the selected word line (control gate electrode) WL; and a potential is applied to the unselected word lines (control gate electrodes) WL such that the memory cells MC are switched ON regardless of whether the data is a "0" or a "1."

Then, the two select gate transistors ST are switched ON and the reading current is supplied to the NAND string.

Because the selected memory cell MC is switched ON or OFF according to the value of the data stored therein when the reading potential is applied, the data can be read by, for example, detecting the change of the reading current.

Figure 19:
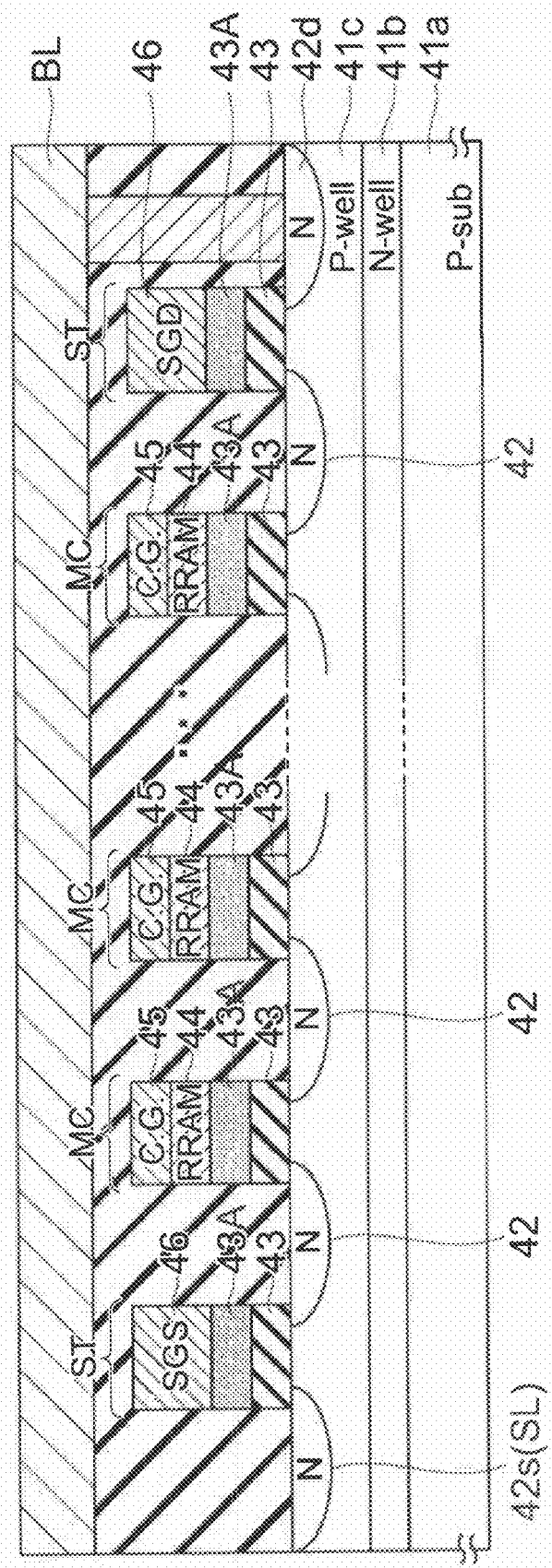
FIG. 19 is a schematic view illustrating a specific example based on normal MIS transistors.

Although the select gate transistors ST have the same structures as the memory cells MC in the structure illustrated in FIG. 18, the select gate transistors ST may also be, for example, normal MIS transistors without forming the recording layers as illustrated in FIG. 19.

Figure 20:
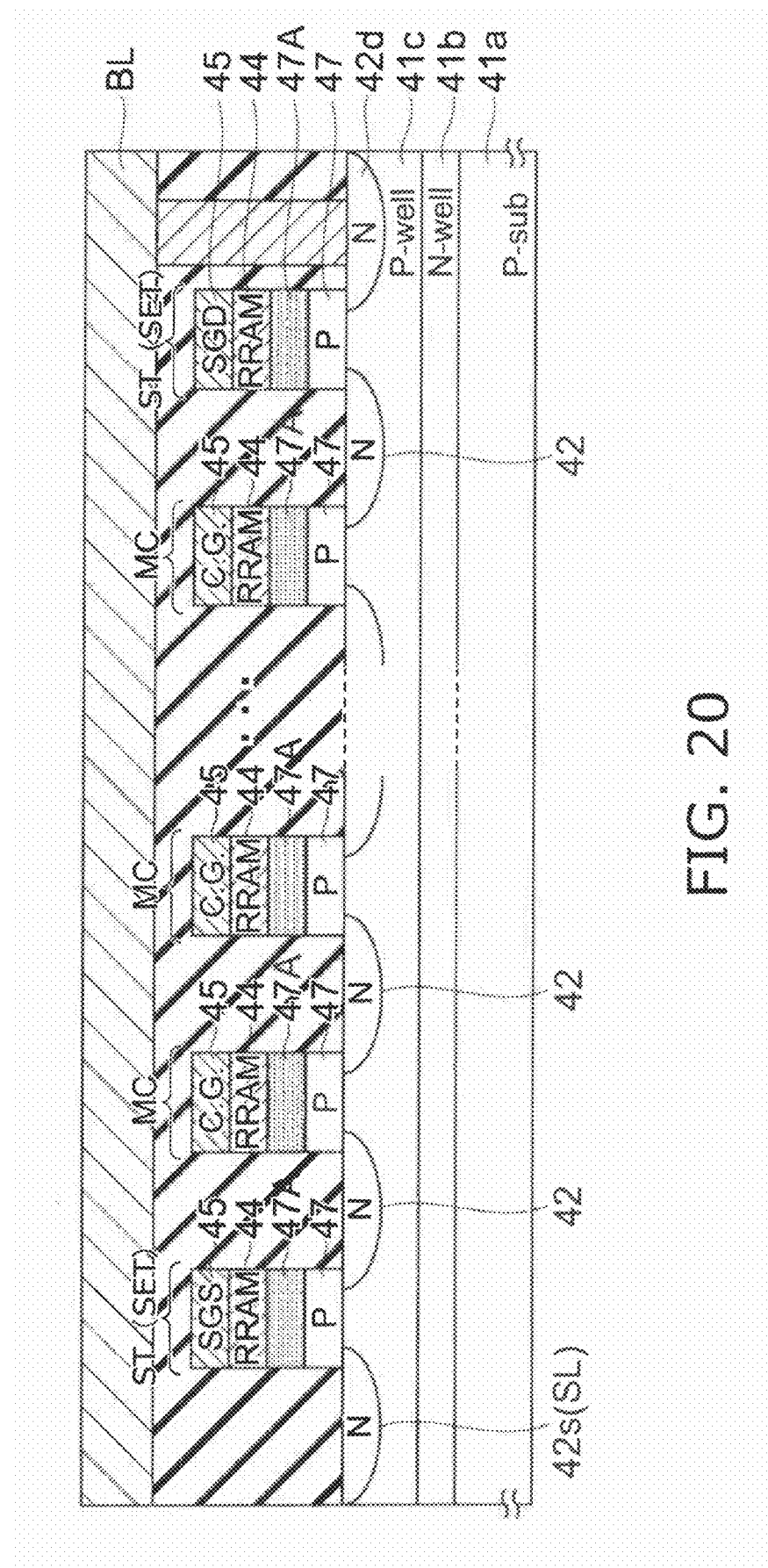
FIG. 20 is a schematic view illustrating a variation of the NAND flash memory.

FIG. 20 is a schematic view illustrating a variation of the NAND flash memory.

This variation has a structure in which the gate insulation layers of the multiple memory cells MC forming the NAND string are replaced by P-type semiconductor layers 47.

As high integration advances and the memory cells MC are downscaled, the P-type semiconductor layers 47 are filled by depletion layers in the state where a voltage is not applied.

During the setting (the writing), a positive writing potential (e.g., 3.5 V) is applied to the control gate electrode 45 of the selected memory cell MC, and a positive transfer potential (e.g., 1 V) is applied to the control gate electrodes 45 of the unselected memory cells MC.

At this time, the surfaces of the P-type well region 41c of the multiple memory cells MC in the NAND string are inverted from the P-type to the N-type, and channels are formed.

Then, as described above, the set operation can be performed by switching the select gate transistor ST on the bit line BL side ON and transferring the program data "0" from the bit line BL to the channel region of the selected memory cell MC.

The resetting (the erasing) can be collectively performed for all of the memory cells MC forming the NAND string by, for example, applying a negative erasing potential (e.g., −3.5 V) to all of the control gate electrodes 45 and applying the grounding potential (0 V) to the P-type well region 41c and the P-type semiconductor layers 47.

During the reading, a positive reading potential (e.g., 0.5 V) is applied to the control gate electrode 45 of the selected memory cell MC, and a transfer potential (e.g., 1 V) is applied to the control gate electrodes 45 of the unselected memory cells MC to switch the memory cells MC ON regardless of whether the data is a "0" or a "1."

However, a threshold voltage Vth "1" of the memory cells MC in the "1" state is taken to be in the range of 0 V <Vth "1"<0.5 V; and a threshold voltage Vth "0" of the memory cells MC in the "0" state is taken to be in the range of 0.5 V<Vth "0"<1 V.

Then, the two select gate transistors ST are switched ON, and the reading current is supplied to the NAND string.

In such a state, the amount of current flowing in the NAND string changes according to the value of the data stored in the selected memory cell MC, and therefore the data can be read by detecting the change.

In this variation, it is desirable that the hole doping amount of the P-type semiconductor layer 47 is greater than that of the P-type well region 41c, and that the Fermi level of the P-type semiconductor layer 47 is about 0.5 V deeper than that of the P-type well region 41c.

This is because, when a positive potential is applied to the control gate electrode 45, the P-type starts inverting to the N-type from the surface portion of the P-type well region 41c between the N-type diffusion layers 42, and a channel is formed.

Thus, for example, during the writing, the channels of the unselected memory cells MC are formed only at the interface between the P-type well region 41c and the P-type semiconductor layers 47; and during the reading, the channels of the multiple memory cells MC in the NAND string are formed only at the interfaces between the P-type well region 41c and the P-type semiconductor layers 47.

That is, even in the case where the recording layer 44 of the memory cell MC is a conductor (the set state), the diffusion layers 42 and the control gate electrode 45 are not shorted.

(NOR Flash Memory)

Figure 21:
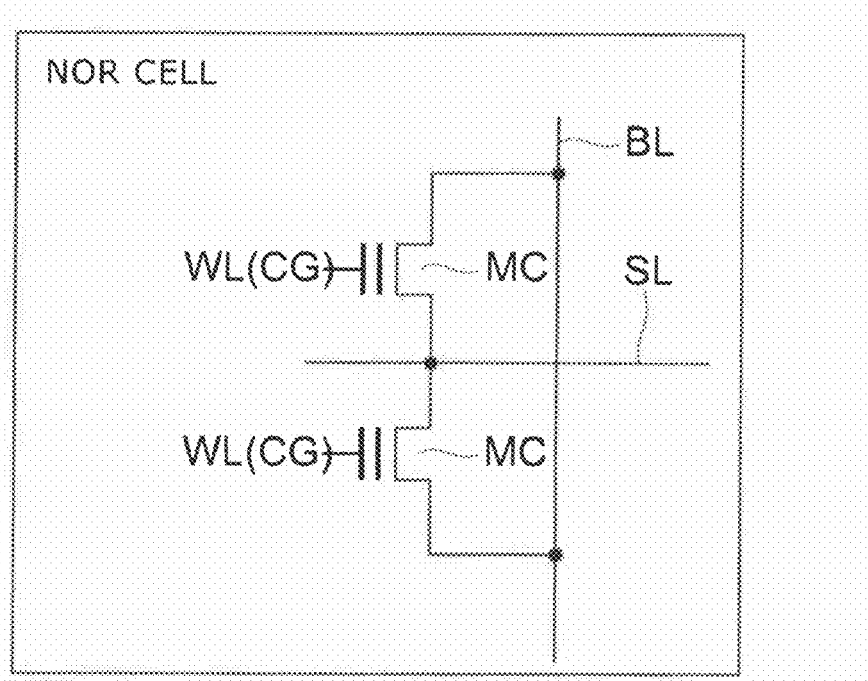
FIG. 21 is a circuit diagram of a NOR cell unit.

FIG. 21 is a circuit diagram of a NOR cell unit.

Figure 22:
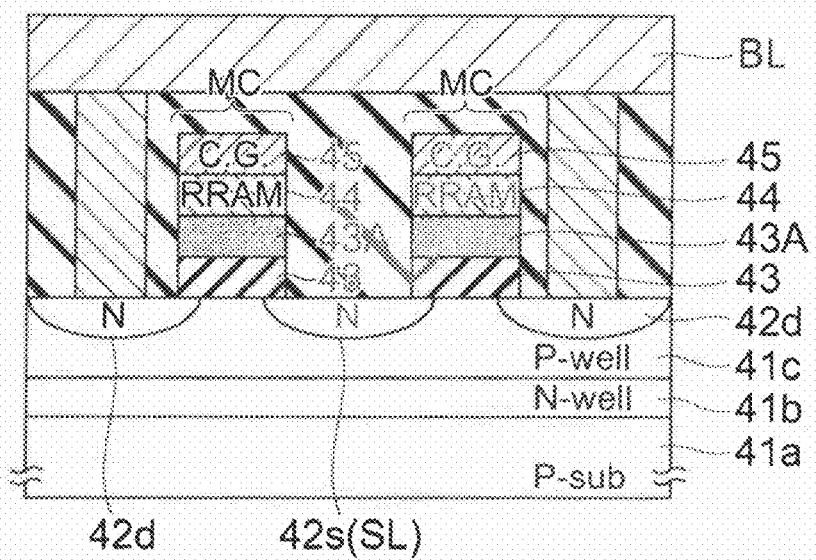
FIG. 22 is a schematic view illustrating the structure of the NOR cell unit according to the embodiment of the invention.

FIG. 22 is a schematic view illustrating the structure of the NOR cell unit according to an example of this embodiment.

The N-type well region 41b and the P-type well region 41c are formed in the P-type semiconductor substrate 41a. NOR cells according to the example of this embodiment are formed in the P-type well region 41c.

The NOR cell is formed from one memory cell (MIS transistor) MC connected between the bit line BL and the source line SL.

The memory cell MC is formed from the N-type diffusion layers 42, the gate insulation layer 43 on the channel region between the N-type diffusion layers 42, the orientation control layer 43A on the gate insulation layer 43, the recording layer (RRAM) 44 on the orientation control layer 43A, and the control gate electrode 45 on the recording layer 44. It is possible to change the states (insulator/conductor) of the recording layer 44 of the memory cell MC by the basic operations described above.

(Two-transistor Flash Memory)

Figure 23:
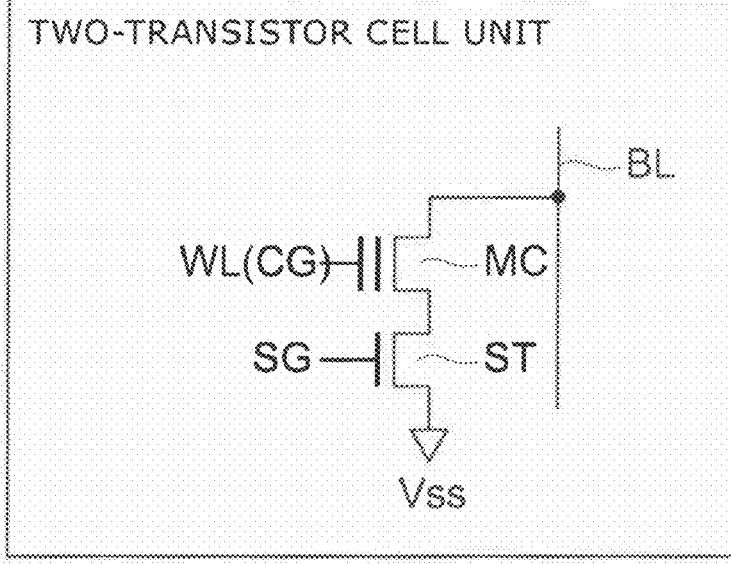
FIG. 23 is a circuit diagram of a two-transistor cell unit.

FIG. 23 is a circuit diagram of a two-transistor cell unit.

Figure 24:
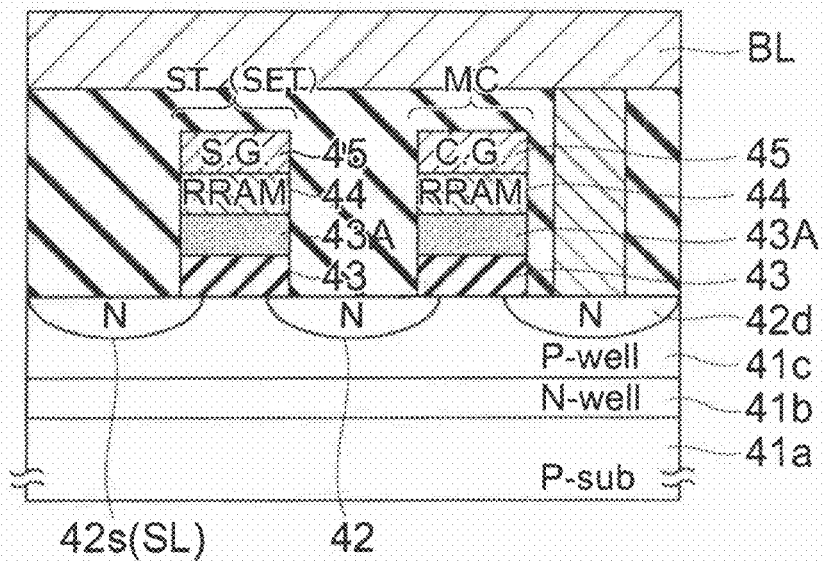
FIG. 24 is a schematic view illustrating the structure of the two-transistor cell unit according to the embodiment of the invention.

FIG. 24 is a schematic view illustrating the structure of the two-transistor cell unit according to the example of this embodiment.

The two-transistor cell unit is a recently developed new cell structure combining the characteristics of the NAND cell unit and the characteristics of the NOR cell.

The N-type well region 41b and the P-type well region 41c are formed in the P-type semiconductor substrate 41a. The two-transistor cell unit according to the example of this embodiment is formed in the P-type well region 41c.

The two-transistor cell unit is formed from one memory cell MC and one select gate transistor ST connected in series.

The memory cell MC and the select gate transistor ST have the same structure. Specifically, the structure is formed from the N-type diffusion layers 42, the gate insulation layer 43 on the channel region between the N-type diffusion layers 42, the orientation control layer 43A on the gate insulation layer 43, the recording layer (RRAM) 44 on the orientation control layer 43A, and the control gate electrode 45 on the recording layer 44.

It is possible to change the states (insulator/conductor) of the recording layer 44 of the memory cell MC by the basic operations described above. On the other hand, the recording layer 44 of the select gate transistors ST is fixed in the set state, that is, as a conductor (small resistance).

The select gate transistor ST is connected to the source line SL; and the memory cell MC is connected to the bit line BL.

It is possible to change the states (insulator/conductor) of the recording layer 44 of the memory cell MC by the basic operations described above.

Figure 25:
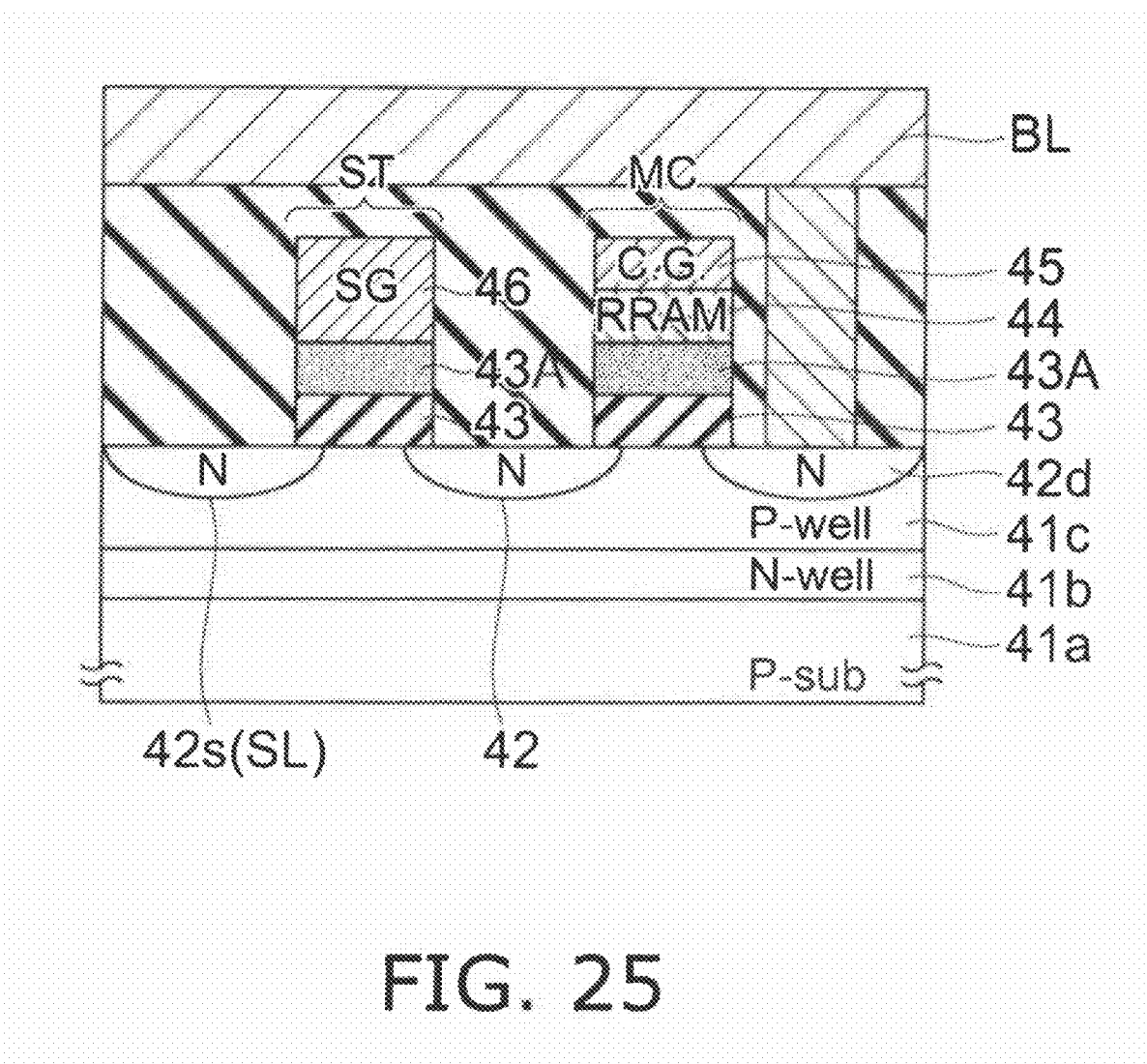
FIG. 25 is a schematic view illustrating a specific example based on normal MIS transistors.

Although the select gate transistor ST of the structure illustrated in FIG. 24 has the same structure as that of the memory cell MC, the select gate transistor ST may be, for example, a normal MIS transistor without forming the recording layer as illustrated in FIG. 25.

Next, a method for manufacturing the recording medium according to an example of the invention will be described.

Here, the structure of the recording medium illustrated in FIG. 6 will be described as an example.

The substrate 20 is a disk formed from glass having a diameter of about 60 mm and a thickness of about 1 mm. Pt (platinum) is vapor-deposited with a thickness of about 500 nm on such a substrate 20 to form the electrode layer 21.

First, a film is formed on the electrode layer 21 using an RF power source having power adjusted to obtain a (110) orientation and by using a target having a composition adjusted to deposit TiN. Continuing, RF magnetron sputtering is performed in an atmosphere of 95% Ar (argon) and 5% $O_2$ (oxygen) at a temperature of 300 to 600° C. using a target having a composition adjusted to deposit $ZnMn_2O_4$; and $ZnMn_2O_4$ is formed with a thickness of about 10 nm to form a portion of the recording layer 22.

Continuing, $TiO_2$ is formed on the $ZnMn_2O_4$ with a thickness of about 3 nm by RF magnetron sputtering. As a result, the recording layer 22 has a stacked structure of $ZnMn_2O_4$ and $TiO_2$.

Finally, by forming the protective layer 13B on the recording layer 22, a recording medium such as that illustrated in FIG. 6 is completed.

Next, experimental examples in which several samples are created and the resistance differences between the reset (the erased) state and the set (the written) state are evaluated will be described.

Recording mediums having the structure illustrated in FIG. 6 are used as the samples. The evaluations use a pair of sharp probes having tip diameters of not more than 10 nm.

First Experimental Example

A first experimental example is an example using (100) oriented VN as the orientation control layer and using $ZnCr_2O_4$ as the first compound.

VN was formed in a film on a B-doped Si (100) substrate using a target (with a diameter of 100 mm) having a composition ratio adjusted to deposit VN. The native oxide film of the Si substrate surface is removed beforehand. Although the orientation differs by the power and the pressure during film formation in the case where VN is formed in a film, in the case of this experimental example, RF magnetron sputtering was performed at room temperature in 0.5 Pa argon gas with an RF power of 100 W; and as a result, (100) oriented VN was obtained. The VN film thickness was 50 nm.

Continuing, $ZnCr_2O_4$ was formed in a film as the first compound without removing the substrate from the vacuum chamber. RF magnetron sputtering was performed in an atmosphere of 95% Ar (argon) and 5% $O_2$ (oxygen) using a target having a mixing ratio adjusted such that the target had the definite-proportion composition during film formation. The first compound $ZnCr_2O_4$ was given a film thickness of 10 nm with an RF power of 100 W, a total gas pressure of 1.0 Pa, and a substrate temperature of 600° C. At this time, the orientation of the $ZnCr_2O_4$ was mainly a (100) orientation.

Finally, 2 nm of $SnO_2$ was formed in a film as the protective film 13B, and the recording medium having the structure illustrated in FIG. 6 was obtained.

[Evaluation Method 1]

Evaluation method 1 will now be described.

First, one of the probes (referred to as "probe 1" for convenience) was brought into contact with the protective layer 13B and grounded; and the other probe (referred to as "probe 2" for convenience) was brought into contact with the VN film and a voltage was applied.

The writing is performed by applying, for example, a 0.8 V voltage pulse having a width of 10 nsec to probe 2.

The erasing is performed by applying, for example, a 0.2 V voltage pulse with a width of 100 nsec to probe 2. Thus, in this experimental example, the VN may function as a lower electrode because the conductivity of VN is high.

Reading was executed between the writing/erasing. The reading is performed by applying a 0.1 V voltage pulse with a width of 10 nsec to probe 2 and measuring the resistance value of the recording layer (the recorded bit) 22.

[Evaluation Method 2]

Evaluation method 2 will now be described.

The evaluation of evaluation method 2 is performed by pulse erasing.

The writing is performed by applying, for example, a 1.5 V voltage pulse with a width of 10 nsec to probe 2.

The erasing is performed by applying, for example, a −1.5 V voltage pulse with a width of 10 nsec to probe 2.

A reading was executed between the writing/erasing. The reading was performed by applying a 0.1 V voltage pulse with a width of 10 nsec to probe 2 and measuring the resistance value of the recording layer (the recorded bit) 22.

The results of the evaluation of evaluation method 1 showed that the resistance in the high resistance state was about $10^7 \Omega$ and the resistance in the low resistance state was about $10^4 \Omega$.

The results of the evaluation of evaluation method 2 showed that the resistance in the high resistance state was about $10^7 \Omega$ and the resistance in the low resistance state was about $10^4 \Omega$.

Second Experimental Example

A second experimental example is an example using (111) oriented TiN as the orientation control layer and using $ZnMn_2O_4$ as the first compound.

The film formation of the TiN was performed on a Si (100) substrate using a Ti target (with a diameter of 100 mm). In this experimental example, the native oxide film is not removed. Although the orientation differs by power and pressure during film formation in the case where TiN is formed in a film, in the case of this experimental example, RF magnetron sputtering was performed at room temperature at a total gas pressure of 3 Pa in 92.5% argon gas and 7.5% $N_2$ gas with an RF power of 300 W; and as a result, (111) oriented TiN was obtained. The TiN film thickness was 50 nm.

Continuing, $ZnMn_2O_4$ was formed in a film as the first compound without removing the substrate from the vacuum chamber. RF magnetron sputtering was performed in an atmosphere of 95% Ar (argon) and 5% $O_2$ (oxygen) using a target having a mixing ratio adjusted such that the target had the definite-proportion composition during film formation. The first compound $ZnMn_2O_4$ was given a film thickness of 10 nm with an RF power of 100 W, a total gas pressure of 1.0 Pa, and a substrate temperature of 600° C. At this time, the orientation of $ZnMn_2O_4$ was mainly a (110) orientation.

Finally, 2 nm of $SnO_2$ was formed in a film as the protective film 13B, and the recording medium having the structure illustrated in FIG. 6 was obtained.

In the results of the evaluation by a method similar to evaluation method 1 of the first experimental example, the resistance in the high resistance state was about $10^7 \Omega$ and the resistance in the low resistance state was about $10^3 \Omega$.

In the results of the evaluation by a method similar to evaluation method 2 of the first experimental example, the resistance in the high resistance state was about $10^7 \Omega$ and the resistance in the low resistance state was about $10^3 \Omega$.

Third Experimental Example

A third experimental example is an example using (100) oriented $RuO_2$ as the orientation control layer and using $CuFeO_2$ as the first compound.

First, a Ti film was formed in a film on a Si (100) substrate as a bonding layer; and continuing, a Pt film was formed in a film using RF magnetron sputtering at room temperature in 100% argon gas with a total gas pressure of 1 Pa. In this experimental example, the native oxide film is not removed. The results of the evaluation of the orientation of the Pt film showed a (111) orientation. The Pt film functions as a lower electrode.

Continuing, film formation of $RuO_2$ was performed by RF magnetron sputtering using a Ru target (with a diameter of 100 mm). The RF power was 50 W and the substrate temperature was 550° C. in 100% oxygen gas with a total gas pressure of 1 Pa. As a result, a (100) oriented $RuO_2$ film was obtained. The $RuO_2$ was given a film thickness of 10 nm.

Continuing, $CuFeO_2$ was formed in a film as the first compound. RF magnetron sputtering was performed in an atmosphere of 95% Ar (argon) and 5% $O_2$ (oxygen) using a target having a mixing ratio adjusted such that the target has the definite-proportion composition during film formation. The first compound $CuFeO_2$ was given a film thickness of 10 nm with an RF power of 70 W, a total gas pressure of 0.5 Pa, and a substrate temperature of 450° C. At this time, the orientation of the $CuFeO_2$ mainly was an ac-plane orientation in which the a axis and the c axis were parallel to the first layer.

Finally, 2 nm of $SnO_2$ was formed in a film as the protective film 13B, and the recording medium having the structure illustrated in FIG. 6 was obtained.

In the results of the evaluation by a method similar to evaluation method 1 of the first experimental example, the resistance in the high resistance state was about $10^6 \Omega$ and the resistance in the low resistance state was about $10^4 \Omega$.

In the results of the evaluation by a method similar to evaluation method 2 of the first experimental example, the resistance in the high resistance state was about $10^6 \Omega$ and the resistance in the low resistance state was about $10^4 \Omega$.

Fourth Experimental Example

A fourth experimental example is an example using (100) oriented ZrN as the orientation control layer and using $NiWO_4$ as the first compound.

The film formation of the ZrN was performed on an n-type (001) Si substrate using a Zr target (with a diameter of 100 mm). Prior to the film formation, the native oxide film was removed beforehand. By performing RF magnetron sputtering with a substrate temperature of 500° C. in 97% argon gas and 3% $N_2$ gas with a total gas pressure of 0.3 Pa and an RF power of 60 W, (100) oriented ZrN was obtained. The ZrN film thickness was 50 nm.

$NiWO_4$ was formed in a film as the first compound. RF magnetron sputtering was performed in an atmosphere of 95% Ar (argon) and 5% $O_2$ (oxygen) using a target having a mixing ratio adjusted such that the target had the definite-proportion composition during film formation. The first compound $NiWO_4$ was given a film thickness of 10 nm with an RF power of 100 W, a total gas pressure of 1.0 Pa, and a substrate temperature of 600° C. At this time, the orientation of the $NiWO_4$ mainly was an ac-plane orientation in which the a axis and the c axis were parallel to the first layer.

Finally, 2 nm of $SnO_2$ was formed in a film as the protective film 13B, and the recording medium having the structure illustrated in FIG. 6 was obtained.

In the results of the evaluation by a method similar to evaluation method 1 of the first experimental example, the resistance in the high resistance state was about $10^6 \Omega$ and the resistance in the low resistance state was about $10^4 \Omega$.

In the results of the evaluation by a method similar to evaluation method 2 of the first experimental example, the resistance in the high resistance state was about $10^6 \Omega$ and the resistance in the low resistance state was about $10^4 \Omega$.

Fifth Experimental Example

A fifth experimental example is an example using (001) oriented $IrO_2$ as the orientation control layer and using $NiTiO_3$ as the first compound.

The film formation of the IrO$_2$ was performed on a sapphire substrate (100) using an Ir target (with a diameter of 100 mm). By performing RF magnetron sputtering with a substrate temperature of 300° C. in 67% argon gas and 33% oxygen gas with a total gas pressure of 6 Pa and an RF power of 300 W, (001) oriented IrO$_2$ was obtained. The IrO$_2$ film thickness was 50 nm.

NiTiO$_3$ was formed in a film as the first compound. RF magnetron sputtering was performed in an atmosphere of 95% Ar (argon) and 5% O$_2$ (oxygen) using a target having a mixing ratio adjusted such that the target has the definite-proportion composition during film formation. The first compound NiTiO$_3$ was given a film thickness of 10 nm with a substrate temperature of 700° C., a total gas pressure of 1.0 Pa, and an RF power of 100 W. At this time, the orientation of the NiTiO$_3$ mainly was a (110) orientation.

Finally, 2 nm of SnO$_2$ was formed in a film as the protective film 13B, and the recording medium having the structure illustrated in FIG. 6 was obtained.

In the results of the evaluation by a method similar to evaluation method 1 of the first experimental example, the resistance in the high resistance state was about 10$^8$Ω and the resistance in the low resistance state was about 10$^4$Ω.

In the results of the evaluation by a method similar to evaluation method 2 of the first experimental example, the resistance in the high resistance state was about 10$^8$Ω and the resistance in the low resistance state was about 10$^4$Ω.

Sixth Experimental Example

A sixth experimental example is an example using (111) oriented TiN as the orientation control layer, ZnMn$_2$O$_4$ as the first compound, and TiO$_2$ as the second compound.

By a method similar to that of the second experimental example, (110) oriented ZnMn$_2$O$_4$ was formed in a film with a thickness of 10 nm on a Si (100) substrate with (111) oriented TiN as the orientation control layer.

Further, RF magnetron sputtering was performed in an atmosphere of 95% Ar (argon) and 5% O$_2$ (oxygen) using a Ti target (with a diameter of 100 mm), and a TiO$_2$ film was obtained. The second compound TiO$_2$ was given a film thickness of 3 nm with an RF power of 100 W, a total gas pressure of 1.0 Pa, and a substrate temperature of 600° C. The results of analyzing the TiO$_2$ showed a structure similar to the hollandite structure nearly in a c-axis orientation.

Further, 2 nm of SnO$_2$ was formed in a film as the protective film 13B, and the recording medium having the structure illustrated in FIG. 6 was obtained.

In the results of the evaluation by a method similar to evaluation method 1 of the first experimental example, the resistance of the high resistance state was about 10$^{10}$Ω and the resistance of the low resistance state was about 10$^3$Ω.

In the results of the evaluation by a method similar to evaluation method 2 of the first experimental example, the resistance of the high resistance state was about 10$^{10}$Ω and the resistance of the low resistance state was about 10$^3$Ω.

Comparative Example

In a comparative example, the same sample as that of the first experimental example is used except for the point that the first compound of the recording layer was NiO. NiO was formed in a film on the (100) oriented VN film by performing RF magnetron sputtering in an atmosphere of 95% Ar (argon) and 5% O$_2$ (oxygen) using a NiO target (with a diameter of 100 mm). The first compound NiO was given a film thickness of 10 nm with an RF power of 100 W, a total gas pressure of 1.0 Pa, and a substrate temperature of 400° C. At this time, the orientation of the NiO mainly was a (100) orientation.

In this comparative example, the writing/erasing could not be performed in the case where a 1.5 V pulse with a 10 nsec width was applied similarly to the first experimental example; and therefore, the writing/erasing was performed with the following conditions.

[Evaluation Method 1']

Evaluation method 1' will now be described.

The writing was performed by applying, for example, an 8 V voltage pulse with a 10 nsec width to probe 2.

The erasing was performed by applying, for example, a 2 V voltage pulse with a 1 μsec width to probe 2.

A reading was executed between the writing/erasing. The reading was performed by applying a 0.1 V voltage pulse with a width of 10 nsec to probe 2 and measuring the resistance value of the recording layer (the recorded bit) 22.

[Evaluation Method 2']

Evaluation method 2' will now be described.

The evaluation of evaluation method 2' is performed by pulse erasing.

The writing was performed by applying, for example, a 5 V voltage pulse with a 10 nsec width to probe 2.

The erasing was performed by applying, for example, a −5 V voltage pulse with a 10 nsec width to probe 2.

A reading was executed between the writing/erasing. The reading was performed by applying a 0.1 V voltage pulse with a width of 10 nsec to probe 2 and measuring the resistance value of the recording layer (the recorded bit) 22.

The results of the evaluation of evaluation method 1' showed that the resistance in the high resistance state was about 10$^7$Ω and the resistance in the low resistance state was about 10$^4$Ω.

The results of the evaluation of evaluation method 2' showed that the resistance in the high resistance state was about 10$^7$Ω and the resistance in the low resistance state was about 10$^4$Ω.

Thus, the writing/erasing required a large voltage in the case where NiO having a NaCl structure was used as the recording layer because the diffusion of the cations did not occur easily.

As described hereinabove with reference to FIG. 1 to FIG. 33, according to these embodiments, information recording (writing) can be performed only at the portion where the electric field is applied (the unit of recording), and therefore the recording of information is possible to an exceedingly minute region with exceedingly little power consumption.

Also, although the erasing is performed by applying heat, almost no structural change of the oxide occurs if the materials proposed in the examples of these embodiments are used; and therefore, the erasing is possible with little power consumption. Alternatively, the erasing also can be performed by applying an electric field having an orientation reversed from that during the recording. In such a case, erasing is possible with less power consumption because energy losses of diffused heat are low.

Further, according to this embodiment, the conductor portions are formed in insulators after the writing; and therefore, the current concentrates and flows in the conductor portions during the reading, and a recording principle having an exceedingly high sensing efficiency can be realized.

Moreover, according to this embodiment, by combining cations that move easily and transition element ions, which stably retain the main structure, repeated and stable recording and erasing is possible.

Thus, according to the examples of these embodiments, information recording at a recording density not attainable by conventional art is possible despite having an exceedingly simple configuration. Accordingly, the examples of these embodiments have considerable industrial merits as a next-generation technology to break through the wall of the recording density of conventional nonvolatile memory.

The examples of these embodiments are not limited to the embodiments described above and can be realized by modifying the components in a scope that does not depart from the purport thereof. Also, although set and reset are defined in the examples of these embodiments where the state directly after forming the films is the initial state, the definitions of set and reset are arbitrary and not limited to the examples of these embodiments. Further, various inventions can be formed by appropriate combinations of the multiple components disclosed in the embodiments described above. For example, some of the components may be deleted from all of the components disclosed in the embodiments described above, and components of different embodiments may be appropriately combined.

Industrial Applicability

According to the invention, a non-volatile information recording and reproducing apparatus having high recording density and low power consumption can be provided.

The invention claimed is:

1. An information recording and reproducing apparatus, comprising:
a recording layer including a first layer including a first compound, the first compound being a conjugated compound including at least two types of cation elements, at least one selected from the cation elements being a transition element having a d orbit incompletely filled by electrons, a shortest distance between adjacent cation elements being not more than 0.32 nm;
a voltage application unit that applies a voltage to the recording layer, produces a phase change in the recording layer, and records information;
an electrode layer that applies a voltage to the recording layer; and
an orientation control layer provided between the recording layer and the electrode layer to control an orientation of the recording layer.

2. The information recording and reproducing apparatus according to claim 1, wherein the orientation control layer includes a compound of nitrogen and at least one element selected from the group consisting of Si, Ti, Zr, Hf, V, Nb, Ta, and W.

3. The information recording and reproducing apparatus according to claim 1, wherein the orientation control layer includes a compound of oxygen and at least one element selected from the group consisting of Ru, Ir, Ta, Mg, Ce, and W.

4. The information recording and reproducing apparatus according to claim 1, wherein
the first compound has a spinel structure represented by $A_xM_yX_4$ ($0.5 \leq x \leq 2.2$ and $1.5 \leq y \leq 2$), the A and the M being mutually different elements, the X being an element including at least one selected from the group consisting of O (oxygen) and N (nitrogen), and
an a axis or a c axis of the first compound is oriented in a horizontal direction with respect to a film surface or within 45 degrees from the horizontal direction.

5. The information recording and reproducing apparatus according to claim 4, wherein the orientation control layer includes:
a (100), (001), or (110) oriented Ir oxide or Ru oxide; or
a (100), (110), or (111) oriented Ti nitride, V nitride, or W nitride; or
a (100) or (110) oriented Zr oxide or Hf nitride; or
a (100), (001), or (110) oriented Si nitride.

6. The information recording and reproducing apparatus according to claim 4, wherein the first compound has a (110) orientation.

7. The information recording and reproducing apparatus according to claim 6, wherein the orientation control layer includes:
a (100) or (110) oriented Ir oxide or Ru oxide; or
a (100), (110), or (111) oriented Ti nitride, V nitride, or W nitride; or
a (110) oriented Zr nitride or Hf nitride; or
a (100) or (110) oriented Si nitride.

8. The information recording and reproducing apparatus according to claim 1, wherein
the first compound has a delafossite structure represented by $A_xM_yX_2$ ($0.1 \leq x \leq 1.1$ and $0.9 \leq y \leq 1.1$), the A and the M being mutually different elements, the X being an element including at least one selected from the group consisting of O (oxygen) and N (nitrogen), and
a c axis of the first compound is oriented in a horizontal direction with respect to a film surface or within 45 degrees from the horizontal direction.

9. The information recording and reproducing apparatus according to claim 8, wherein the orientation control layer includes:
a (100), (001), or (110) oriented Ir oxide or Ru oxide; or
a (110) or (111) oriented Ti nitride, V nitride, or W nitride; or
a (100), (110) or (111) oriented Zr nitride or Hf nitride; or
a (100), (001), or (110) oriented Si nitride.

10. The information recording and reproducing apparatus according to claim 8, wherein
the first compound has a (110) orientation or an ac-plane orientation.

11. The information recording and reproducing apparatus according to claim 1, wherein
the first compound has a wolframite structure represented by $A_xM_yX_4$ ($0.5 \leq x \leq 1.1$ and $0.7 \leq y \leq 1.1$), the A and the M being mutually different elements, the X being an element including at least one selected from the group consisting of O (oxygen) and N (nitrogen), and
an a axis of the first compound is oriented in a horizontal direction with respect to a film surface or within 45 degrees from the horizontal direction.

12. The information recording and reproducing apparatus according to claim 11, wherein the orientation control layer includes:
a (100) or (001) oriented Ir oxide or Ru oxide; or
a (100) or (110) oriented Ti nitride, Zr nitride, Hf nitride, V nitride, or W nitride.

13. The information recording and reproducing apparatus according to claim 11, wherein
the first compound has a (01-1).

14. The information recording and reproducing apparatus according to claim 13, wherein the orientation control layer includes: a (100) oriented Ti nitride, V nitride, or W nitride.

15. The information recording and reproducing apparatus according to claim 1, wherein
the first compound has an ilmenite structure represented by $A_xM_yX_3$ ($0.5 \leq x \leq 1.1$ and $0.9 \leq y \leq 1$), the A and the M being mutually different elements, the X being an element including at least one selected from the group consisting of O (oxygen) and N (nitrogen), and
a c axis of the first compound is oriented in a horizontal direction with respect to a film surface or within 45 degrees from the horizontal direction.

16. The information recording and reproducing apparatus according to claim 15, wherein the orientation control layer includes:
a (100), (001), (110), or (111) oriented Ir oxide or Ru oxide; or
a (100), (110) or (111) oriented Ti nitride, Zr nitride, Hf nitride, V nitride, or W nitride; or
a (100) or (110) oriented Si nitride.

17. The information recording and reproducing apparatus according to claim 15, wherein
the first compound has a (110) orientation or an ac-plane orientation.

18. The information recording and reproducing apparatus according to claim 1, wherein
the recording layer further includes a second layer provided in contact with the first layer, and
the second layer includes a vacant site capable of containing the cation.

19. The information recording and reproducing apparatus according to claim 1, wherein the voltage application unit includes a probe configured to locally apply the voltage to a unit of recording of the recording layer.

20. The information recording and reproducing apparatus according to claim 1, wherein the voltage application unit includes a word line and a bit line disposed on either side of the recording layer.

21. The information recording and reproducing apparatus according to claim 1, wherein
the voltage application unit includes an MIS transistor including a gate electrode and a gate insulating film, and
the recording layer is provided between the gate electrode and the gate insulation layer of the MIS transistor.

22. The information recording and reproducing apparatus according to claim 1, wherein the voltage application unit includes:
two second conductivity type diffusion layers provided in a first conductivity type semiconductor substrate and a first conductivity type semiconductor layer on the first conductivity type semiconductor substrate between the two second conductivity type diffusion layers; and
a gate electrode controlling conduction/nonconduction between the two second conductivity type diffusion layers,
the recording layer being disposed between the gate electrode and the first conductivity type semiconductor layer.

* * * * *